(12) United States Patent
Ezaki et al.

(10) Patent No.: US 7,746,198 B2
(45) Date of Patent: Jun. 29, 2010

(54) ELECTRIC CIRCUIT DEVICE

(75) Inventors: Kenichi Ezaki, Daito-shi (JP); Fumio Kameoka, Osaka-shi (JP)

(73) Assignee: Sanyo Electric Co., Ltd., Moriguchi-shi, Osaka (JP)

( * ) Notice: Subject to any disclaimer, the term of this patent is extended or adjusted under 35 U.S.C. 154(b) by 0 days.

(21) Appl. No.: 12/379,731

(22) Filed: Feb. 27, 2009

(65) Prior Publication Data

US 2009/0284329 A1 Nov. 19, 2009

Related U.S. Application Data

(63) Continuation of application No. 11/642,932, filed on Dec. 21, 2006, now Pat. No. 7,515,020.

(30) Foreign Application Priority Data

| Dec. 27, 2005 | (JP) | ............................ 2005-374259 |
| Aug. 14, 2006 | (JP) | ............................ 2006-220850 |

(51) Int. Cl.
*H03H 7/00* (2006.01)
*H01G 4/228* (2006.01)

(52) U.S. Cl. ...................................... 333/185; 333/246
(58) Field of Classification Search ................. 333/185, 333/246; 361/301.1, 301.4, 306.1, 306.3, 361/307, 303
See application file for complete search history.

(56) References Cited

U.S. PATENT DOCUMENTS 6,331,930 B1 12/2001 Kuroda et al.

| 6,331,932 | B1 | 12/2001 | Kobayashi et al. |
| 6,699,809 | B2 | 3/2004 | Fujikawa et al. |
| 6,768,630 | B2 | 7/2004 | Togashi |
| 7,019,957 | B2 | 3/2006 | Togashi et al. |
| 7,050,289 | B2 | 5/2006 | Togashi |
| 7,515,020 | B2 * | 4/2009 | Ezaki et al. .................. 333/185 |
| 2007/0067066 | A1 | 3/2007 | Niki |

(Continued)

FOREIGN PATENT DOCUMENTS

CN 1469402 A 1/2004

(Continued)

OTHER PUBLICATIONS

International Search Report of PCT/JP2006/323451; date of mailing Feb. 27, 2007 (issued in the corresponding PCT application for co-pending U.S. Appl. No. 12/159,104, filed with USPTO on Jun. 25, 2008).

(Continued)

*Primary Examiner*—Dean O Takaoka
(74) *Attorney, Agent, or Firm*—Westerman, Hattori, Daniels & Adrian, LLP

(57) ABSTRACT

Electric circuit device comprises electric element and two conductive plates. The electric element includes two anode electrodes and two cathode electrodes and has relatively low impedance in a frequency range between $1 \times 10^{-5}$ to 10 GHz. The one conductive plate has lower impedance than that of the conductive plate comprising the electric element and is connected between two anode electrodes. The other conductive plate has lower impedance than that of the conductive plate comprising the electric element and is connected between two cathode electrodes. As a result, the electric circuit device which has relatively low impedance and is capable of preventing the temperature rise is provided.

20 Claims, 33 Drawing Sheets

U.S. PATENT DOCUMENTS

2007/0159272 A1  7/2007  Niki

FOREIGN PATENT DOCUMENTS

| CN | 1661741 A | 8/2005 |
|---|---|---|
| JP | O4-056207 A | 2/1992 |
| JP | 2004-80773 A | 3/2004 |
| JP | 2005-032900 A | 2/2005 |
| JP | 2005-191504 A | 7/2005 |

OTHER PUBLICATIONS

Co-pending U.S. Appl. No. 12/159,104, filed Jun. 25, 2008.
Chinese Office Action issued Jan. 9, 2009 in related application 2006101717093.
Chinese Office Action issued Feb. 6, 2009 in related application 2006101725193.

* cited by examiner (a)

(b)

(a)

(b)

(c)

(d)

(e)

(a)

(b)

(c)

(d)

(e)

ELECTRIC CIRCUIT DEVICE

CROSS REFERENCE TO RELATED APPLICATIONS

This application is a continuation application of U.S. application Ser. No. 11/642,932 filed on Dec. 21, 2006 which claimed the priority of Japanese Patent Application Numbers JP2005-374259, filed on Dec. 27, 2005, and JP2006-220850, filed on Aug. 14, 2006 the entire contents of which are incorporated herein by reference.

BACKGROUND OF THE INVENTION

1. Field of the Invention

This invention relates to electric circuit device, and more particularly to an electric circuit device functioning as a noise filter with a wide frequency coverage and excellent high-frequency characteristics.

2. Description of Related Art

Recently, digital circuit technology such as LSI (Large Scale Integrated) circuit technology is adopted in not only computers and communication-related equipment but also consumer electronics and in-vehicle equipment.

The high-frequency current produced in the LSI circuit or the like does not stay in the vicinity of the LSI circuit but flows to the wide area of a component-mounted circuit board such as a printed-circuit board. The high-frequency current then inductively couples to signal wires and grounding wires and leaks as an electromagnetic wave from signal cables or the like.

In mixed-signal circuits in which analog circuitry and digital circuitry are combined, for example, a circuit in which a part of a conventional analog circuit is replaced with a digital circuit, and a digital circuit having analog input/output, one of the serious problems is electromagnetic interference from the digital circuit to the analog circuit.

The effective solution of this problem is to separate the LSI circuit, which is a source of the high-frequency current, from a power supplying system with respect to the high frequency, that is to say a "power decoupling" technique. Known as a noise filter employing the power decoupling technique is a transmission-line type noise filter (e.g. Japanese unexamined patent publication No. 2004-80773).

This transmission-line type noise filter comprises a first electrical conductor, a second electrical conductor, a dielectric layer, a first anode and a second anode. Each first and second electrical conductor is in the form of a plate. The dielectric layer is disposed between the first and second electrical conductors.

The first anode is connected to one end of the first electrical conductor in a longitudinal direction, while the second anode is connected to the other end of the first electrical conductor in the longitudinal direction. The second electrical conductor functions as a cathode to connect to reference potential. The first electrical conductor, dielectric layer, and second electrical conductor constitute a capacitor. The thickness of the first electrical conductor is so set as to substantially prevent the temperature rise caused by a DC (direct current) component of the current flowing through the first electrical conductor.

The transmission-line type noise filter is connected between a DC power source and an LSI circuit so as to feed a DC current from the DC power source through a path made up of the first anode, the first electrical conductor and the second anode to the LSI circuit, while attenuating an AC (alternating current) current produced in the LSI circuit.

As discussed above, the transmission-line type noise filter has a structure of a capacitor, and uses the first and second electrical conductors, which are two electrodes of the capacitor, as transmission lines.

BRIEF SUMMARY OF THE INVENTION

However, when a large amount of DC current flows through the first and the second electrical conductors, the conventional transmission-line type noise filter produces a heat, which causes a problem of destruction of the transmission-line type noise filter and the peripheral parts. Recently, flowing a large amount of DC current to the noise filter is required, because the problem becomes a bigger and bigger.

The present invention is made to solve the problems and has an object to provide an electric circuit device which has relatively low impedance and is capable of preventing the temperature rise.

According to the present invention, the electric circuit device comprises an electric element and a first conductive plate. The first conductive plate is arranged on surfaces of the electric element. The electric element includes a second conductive plate and a third conductive plate. The second conductive plate flows a first current from a power source side to an electrical load circuit side. The third conductive plate flows a second current, which is a return current of the first current, from the electrical load circuit side to the power source side. The second conductive plate has a smaller inductance than its self-inductance when the first and second currents flow through the second and third conductive plates, respectively. The first conductive plate is electrically connected to at least one of the second and third conductive plates in parallel and has lower resistance than resistance of at least one of the second and third conductive plates.

According to the present invention, the electric circuit device comprises the electric element and the first conductive plate. The electric element is in the form of an approximately rectangular parallelepiped. The first conductive plate is arranged on surfaces of the electric element. The electric element includes the second conductive plate, the third conductive plate, dielectrics, and first to fourth electrodes. The second conductive plate is placed approximately parallel to the bottom face of the rectangular parallelepiped. The third conductive plate is placed approximately parallel to the bottom face of the rectangular parallelepiped. The dielectrics are disposed between the second conductive plate and the third conductive plate. The first electrode is connected to one end of the second conductive plate, while the second electrode is connected to the other end of the second conductive plate. The third electrode is connected to the third conductive plate in the proximity of one end of the third conductive plate, while the fourth electrode is connected to the third conductive plate in the proximity of the other end of the third conductive plate.

Preferably, the first conductive plate is electrically connected to the second conductive plate in parallel.

Preferably, the second conductive plate comprises n-number (n is a positive integer) of a first flat plate member, each flowing the first current from the power source side to the electrical load circuit side. The third conductive plate comprises m-number (m is a positive integer) of a second flat plate member, alternately stacked to n-number of the first flat plate member and each flowing the second current from the electrical load circuit side to the power source side. The electric element further includes first and second external electrodes. The first external electrode is connected to one end of the n-number of the first flat plate member in the direction in which the first current flows or one end of m-number of the second flat plate member in the direction in which the second current flows. The second external electrode is connected to the other end of the n-number of the first flat plate member in the direction in which the first current flows or the other end of the m-number of the second flat plate member in the direction in which the second current flows. The first conductive plate is placed approximately parallel in the n-number of the first flat plate member, and includes a flat plate part connected to the first and second external electrodes.

Preferably, the second conductive plate comprises n-number (n is a positive integer) of a first flat plate member, each flowing the first current from the power source side to the electrical load circuit side. The third conductive plate comprises m-number (m is a positive integer) of a second flat plate member alternately stacked to n-number of the first flat plate member and each flowing the second current from the electrical load circuit side to the power source side. The electric element further includes first and second external electrodes. The first external electrode is connected to one end of the n-number of the first flat plate member in the direction in which the first current flows. The second external electrode is connected to the other end of the n-number of the first flat plate member in the direction in which the first current flows. The first conductive plate is placed approximately parallel in the n-number of the first flat plate member, and includes a flat plate part connected to the first and second external electrodes.

Preferably, the electric circuit device further comprises a heat radiation member. The heat radiation member is disposed between the flat plate part and the electric element so as to abut on the flat plate part and the electric element.

Preferably, the first conductive plate is placed on a principal surface side of the electric element and is electrically connected to the third conductive plate in parallel.

Preferably, the second conductive plate comprises n-number (n is a positive integer) of the first flat plate member, each flowing the first current from the power source side to the electrical load circuit side. The third conductive plate comprises m-number (m is a positive integer) of the second flat plate member, alternately stacked to the n-number of the first flat plate member and each flowing the second current from the electrical load circuit side to the power source side. The electric element further includes the first and second external electrodes. The first external electrode is connected to one end of the m-number of the second flat plate member in the direction in which the second current flows. The second external electrode is connected to the other end of the m-number of the second flat plate member in the direction in which the second current flows. The first conductive plate is placed approximately parallel in the m-number of the second flat plate member and includes a flat plate member connected to the first and second external electrodes.

Preferably, the electric circuit device further includes a heat radiation member. The heat radiation member is disposed between the flat plate part and the electric element so as to abut on the flat plate part and the electric element.

Preferably, the n-number of the first flat plate member and the m-number of the second flat plate member are set to relatively large in number.

Preferably, the first conductive plate includes the first and the second flat plate member. The first flat plate member is disposed on a first principal surface side of the electric element, is electrically connected to the second conductive plate in parallel, and has lower resistance than that of the second conductive plate. The second flat plate member is disposed on a second principal surface side opposite to the first principal surface of the electric element, is electrically connected to the third conductive plate in parallel, and has lower resistance than that of the third conductive plate.

Preferably, the second conductive plate comprises n-number (n is a positive integer) of a third flat plate member, each flowing the first current from the power source side to the electrical load circuit side. The third conductive plate comprises m-number (m is a positive integer) of a fourth flat plate member, alternately stacked to the n-number of the first flat plate member, each flowing the second current from the electrical load circuit side to the power source side. The electric element further includes first to fourth external electrodes. The first external electrode is connected to one end of the n-number of the third flat plate member in the direction in which the first current flows. The second external electrode is connected to the other end of the n-number of the third flat plate member in the direction in which the first current flows. The third external electrode is connected to one end of the m-number of the fourth flat plate member in the direction in which the second current flows. The fourth external electrode is connected to the other end of the m-number of the fourth flat plate member in the direction in which the second current flows. The first flat plate member is disposed approximately parallel in the n-number of the third flat plate member and includes a first flat plate part connected to the first and second external electrodes. The second flat plate member is disposed approximately parallel in the m-number of the fourth flat plate member and includes a second plate part connected to the third and fourth external electrodes.

Preferably, the electric circuit device further comprises a first and a second heat radiation member. The first heat radiation member is disposed between the first flat plate part and the electric element so as to abut on the first flat plate part and the electric element. The second heat radiation member is disposed between the second flat plate part and the electric element so as to abut on the second flat plate part and the electric element.

Preferably, the n-number of the third flat plate member and the m-number of the fourth flat plate member are set to relatively large number.

Preferably, where the length of an overlap part between the second and third conductive plates in the direction perpendicular to the direction in which the first and second currents flow is W, and the overlap part along the direction in which the first and second currents flow is L, W and L have a relationship of $L \geqq W$.

Preferably, the second conductive plate comprises the n-number (n is a positive integer) of the first flat plate member, each flowing the first current from the power source side to the electrical load circuit side. The third conductive plate comprises the m-number (m is a positive integer) of the second flat plate member, alternately stacked to the n-number of the first flat plate member, each flowing the second current from the electrical load circuit side to the power source side. The electric element further includes the first to fourth external electrodes. The first external electrode is connected to one end of the n-number of the first flat plate member in the direction in which the first current flows. The second external electrode is connected to the other end of the n-number of the first flat plate member in the direction in which the first current flows. The third external electrode is connected to one end of the m-number of the second flat plate member in the direction in which the second current flows. The fourth external electrode is connected to the other end of the m-number of the second flat plate member in the direction in which the second current flows. The third external electrode and the forth external electrode are partially disposed on a principal surface of the electric element which is approximately parallel to the n-number of the first flat plate member. The first conductive plate comprises a third flat plate member having a cut-away section so that the third and the fourth external electrodes are partially disposed on the principal surface. The third flat plate member is disposed on the principal surface so as to be connected to the first and the second external electrodes.

Preferably, the electric element further includes the dielectric layer disposed at the closest position to the principal surface of the m-number of the second flat plate member. The third flat plate member is disposed on the first external electrode, the dielectric layer, and the second external electrode so as to abut on the first external electrode, the dielectric layer, and the second external electrode.

Preferably, the third flat plate member includes a first part disposed on the first external electrode, a second part disposed on the second external electrode, a third part disposed so as to abut on the dielectric layer and including a bump between the first and second parts and the third part.

Preferably, the third flat pate member has a thickness which is thicker than 0.2 mm.

Preferably, the third flat plate member is planately in the inplane direction of the n-number of the first flat plate member.

Preferably, the third flat pate member has a thickness which is between 0.1 mm to 0.2 mm.

Preferably, the electric circuit device further comprises a first and a second solder member. The first solder member connects the third flat plate member to the first external electrode. The second solder member connects the third flat plate member to the second external electrode. The length of the third flat plate member in which the first current flows is longer than the length of the electric element along the direction in which the first current flows. The first solder member is disposed so as to abut on a first stick-out part of the third flat plate member sticking out from the electric element along the direction in which the first current flows and a part disposed in the direction approximately perpendicular to the n-number of the first flat plate member of the first external electrode. The second solder member is disposed so as to abut on a second stick-out part of the third flat plate member sticking out from the electric element along the direction in which the first current flows and a part disposed in the direction approximately perpendicular to the n-number of the first flat plate member of the second external electrode.

Preferably, the electric element further includes the dielectric layer disposed at the closest position to the principal surface of the m-number of the second flat plate member. The third flat plate member is disposed between the first external electrode and the second external electrode in which the first current flows so as to abut on the dielectric layer.

Preferably, the electric circuit device further includes a first and a second solder member. The first solder member connects the third flat plate member to the first external electrode. The second solder member connects the third flat plate member to the second external electrode. The third flat plate member has a thickness which is thicker than the thickness of the first and the second external electrodes. The first solder member is disposed so as to abut on the end face of the third flat plate member and the first external electrode. The second solder member is disposed so as to abut on the end face of the third flat plate member and the second external electrode.

Preferably, when the third flat plate member is planately disposed, the length of the third flat plate member along the direction in which the first current flows is determined by the thickness of the third flat plate member.

Preferably, when the thickness of the third flat plate member is in a range between 0.1 mm to 0.2 mm, the length of the third flat plate member is longer than the electric element along the direction in which the first current flows.

Preferably, when the thickness of the third flat plate member is thicker than 0.2 mm, the length of the third flat plate member is shorter than the electric element along the direction in which the first current flows.

Preferably, the cut-away section of the third flat plate member includes a first and a second cut-away sections. The first cut-away section is arranged so that the third external electrode is partially disposed on a principal surface. The second cut-away section is arranged so that the fourth external electrode is partially disposed on a principal surface.

Preferably, the electric circuit device further includes an adhesive member. The adhesive member connects the third flat plate member to the electric element.

Preferably, the electric circuit device includes first and second adhesive members. The first adhesive member is disposed between the third flat plate member and the third external electrode. The second adhesive member is disposed between the third flat plate member and the fourth external electrode.

In the electric circuit device of the present invention, the first conductive plate is arranged on surfaces of the electric element. The first conductive plate has lower resistance than that of the second and third conductive plates comprising the electric element. As a result, the DC current more mainly flows through the first conductive plate arranged outside of the electric element than the second and the third conductive plate arranged inside of the electric element, thereby preventing the temperature rise of the electric circuit device by the DC current.

DETAILED DESCRIPTION OF THE PREFERRED EMBODIMENTS

Figure 1:
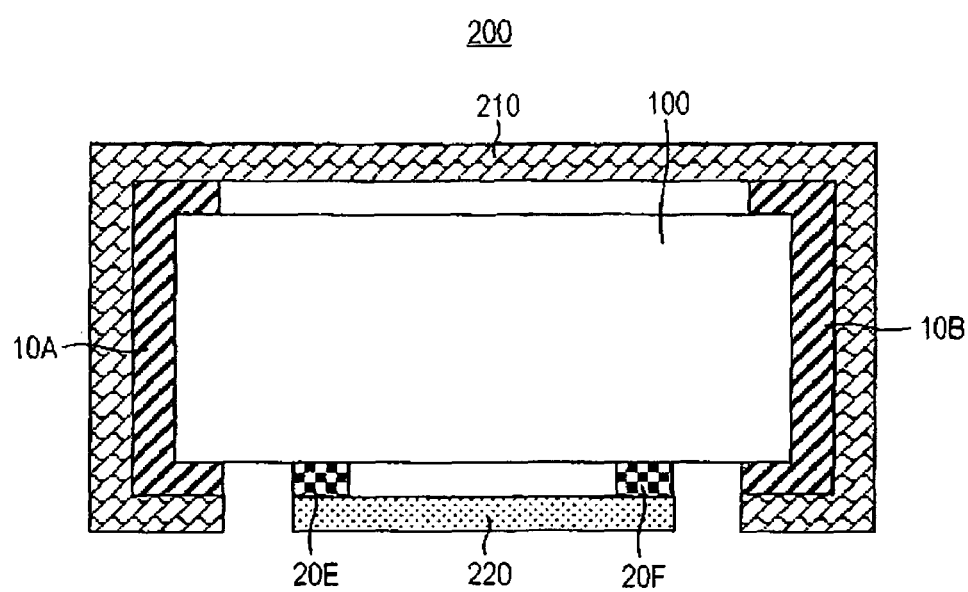
FIG. 1 is a schematic and cross-sectional view illustrating the structure of an electric circuit device according to the first embodiment of the present invention.

Referring to the drawings, a detailed description will be made on embodiments of the present invention. Components identical or equivalent to each other in the drawings are denoted by the same reference number, and will not be further explained to avoid repetition.

The First Embodiment

FIG. 1 is a schematic and cross-sectional view illustrating the structure of an electric circuit device according to the first embodiment of the present invention. Referring to FIG. 1, an electric circuit device 200 according to the first embodiment of the present invention comprises an electric element 100 and conductive plates 210, 220.

The electric element 100 is in the form of an approximately rectangular parallelepiped and has anode electrodes 10A, 10B and cathode electrodes 20E, 20F. The anode electrode 10A is shaped like a rectangle without one side in cross section and is arranged in the proximity of one end of the electric element 100. The anode electrode 10B is shaped like a rectangle without one side in cross section and is arranged in the proximity of the other end of the electric element 100 (opposite side to the anode electrode 10A).

The conductive plates 210, 220 are composed of, for example, copper (Cu) and have a thickness of 0.2 mm. The conductive plate 210 is connected to the anode electrodes 10A, 10B and is arranged so as to almost wrap around the electric element 100. The conductive plate 220 has one end connected with the cathode electrode 20E and the other end connected with the cathode electrode 20F.

Figure 2:
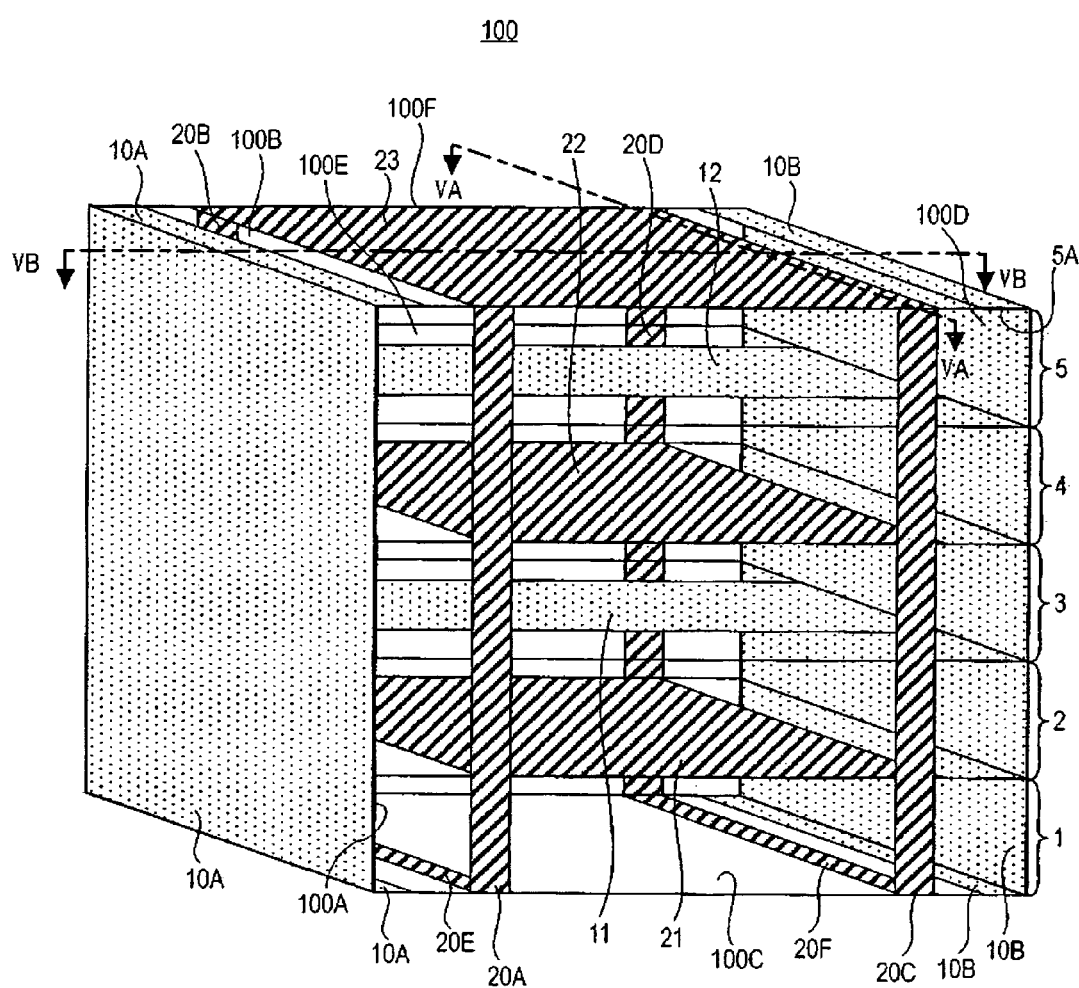
FIG. 2 is a perspective view for fully describing an electric element shown in FIG. 1.

FIG. 2 is a perspective view for fully describing the electric element 100 shown in FIG. 1. Referring to FIG. 2, the electric element 100 comprises dielectric layers 1 to 5, conductive plates 11, 12, 21 to 23, anode electrodes 10A, 10B, side cathode electrodes 20A, 20B, 20C, 20D, and cathode electrodes 20E, 20F.

The dielectric layers 1 to 5 are stacked in sequence. The conductive plates 11, 12, 21 to 23 are in the form of a flat plate each. The conductive plate 21 is placed between the dielectric layers 1 and 2, while the conductive plate 11 is placed between the dielectric layers 2 and 3. The conductive plate 22 is placed between the dielectric layers 3 and 4, while the conductive plate 12 is placed between the dielectric layers 4 and 5. The conductive plate 23 is placed on a principal surface 5A of the dielectric layer 5. Therefore, the dielectric layers 1 to 5 support the conductive plates 21, 11, 22, 12, and 23, respectively.

The anode electrode 10A is connected to one end of the conductive plates 11, 12 and is formed on a side face 100A of the electric element 100 (which is made up of the side faces of the dielectric layers 1 to 5) and on a part of a top face 100B and on a part of a bottom face 100C.

The anode electrode 10B is connected to the other end of the conductive plates 11, 12 and is formed on a side face 100D opposite to the side face 100A of the electric element 100 (which is made up of the side faces of the dielectric layers 1 to 5), on a part of the top face 100B, and on a part of the bottom face 100C. Therefore, the anode electrode 10B is opposed to the anode electrode 10A.

The side cathode electrode 20A is connected to the conductive plates 21 to 23 in the proximity of one end of the conductive plates 21 to 23 and is disposed on a front face 100E of the electric element 100. The side cathode electrode 20B is connected to the conductive plates 21 to 23 in the proximity of one end of the conductive plates 21 to 23 and is disposed on a rear face 100F opposite to the front face 100E of the electric element 100. The side cathode electrode 20B is opposed to the side cathode electrode 20A.

The side cathode electrode 20C is connected to the conductive plates 21 to 23 in the proximity of the other end of the conductive plates 21 to 23 and is disposed on the front face 100E of the electric element 100. The side cathode electrode 20D is connected to the conductive plates 21 to 23 in the proximity of the other end of the conductive plates 21 to 23 and disposed on the rear face 100F opposite to the front face 100E of the electric element 100. The side cathode electrode 20D is opposed to the side cathode electrode 20C.

The cathode electrode 20E is connected to the side cathode electrodes 20A, 20B and is arranged on the bottom face 100C of the electric element 100. The cathode electrode 20F is connected to the side cathode electrodes 20C, 20D and is arranged on the bottom face 100C of the electric element 100.

As described above, the electric element 100 has the conductive plates 11, 12, 21 to 23 alternately placed with the dielectric layers 1 to 5 interposed therebetween, and includes the two anode electrodes 10A, 10B and two cathode electrodes 20E, 20F.

The dielectric layers 1 to 5 are composed of, for example, barium titanate ($BaTiO_3$). The anode electrodes 10A, 10B, conductive plates 11, 12, 21 to 23, side cathode electrodes 20A, 20B, 20C, 20D and cathode electrodes 20E, 20F are composed of, for example, nickel (Ni).

Figure 3:
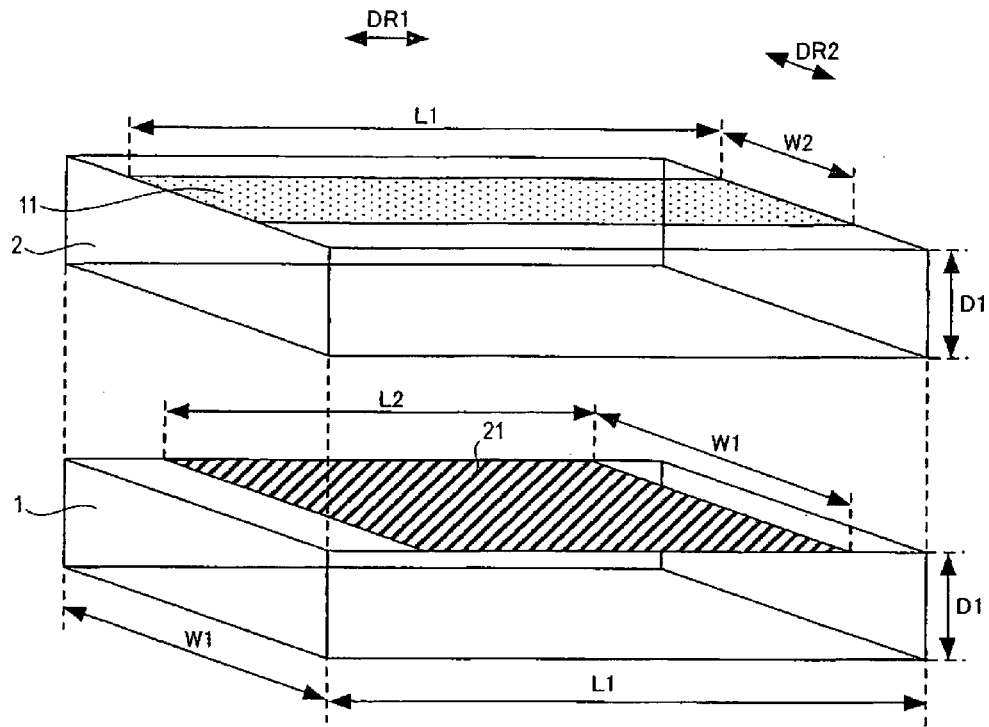
FIG. 3 is a diagram for describing dimensions of dielectric layers and conductive plates shown in FIG. 2.

FIG. 3 is a diagram for describing the dimensions of the dielectric layers 1, 2 and conductive plates 11, 21 shown in FIG. 2. Referring to FIG. 3, each of the dielectric layers 1, 2 has length L1 along the direction DR1, which is the direction of a current flowing in the conductive plates 11, 21, width W1 along the direction DR2 perpendicular to the direction DR1, and thickness D1. Length L1, width W1, and thickness D1 are set, for example, at 15 mm, 13 mm, and 25 μm, respectively.

The conductive plate 11 has length L1 and width W2. Width W2 is set, for example, at 11 mm. The conductive plate 21 has length L2 and width W1. Length L2 is set, for example, at 13 mm. Each of the conductive plates 11, 21 has a thickness, for example, in a range between 10 μm to 20 μm.

Each of the dielectric layers 3 to 5 has the same length L1, width W1, and thickness D1 as those of the dielectric layers 1, 2 shown in FIG. 3. The conductive plate 12 has the same length L1, width W2 and thickness as those of the conductive plate 11 shown in FIG. 3. Each of the conductive plates 22, 23 has the same length L2, width W1, and thickness as those of the conductive plate 21 shown in FIG. 3.

As discussed above, the conductive plates 11, 12 are different in length and width from the conductive plates 21 to 23. These differences are made to prevent shorting between the anode electrodes 10A and 10B connected to the conductive plates 11, 12 and the side cathode electrodes 20A, 20B, 20C, 20D connected to the conductive plates 21 to 23.

Figure 4:
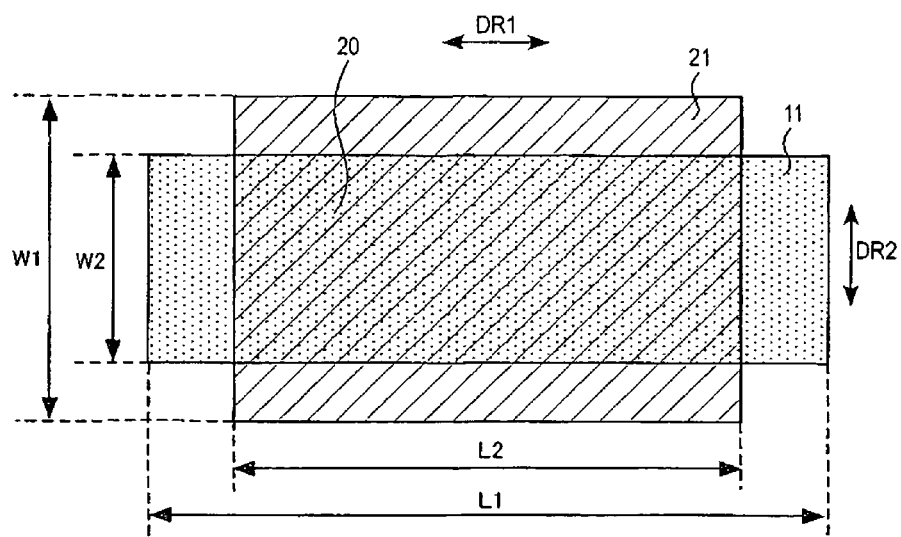
FIG. 4 is a plan view illustrating two adjacent conductive plates.

FIG. 4 is a plan view illustrating two adjacent conductive plates. Suppose the conductive plate 11 and conductive plate 21 are in one plane, with reference to FIG. 4, the conductive plates 11 and 21 have an overlap part 20. The overlap part 20 between the conductive plate 11 and conductive plate 21 has length L2 and width W2. Overlap parts between the conductive plate 11 and the conductive plate 22, between the conductive plate 12 and the conductive plate 22, and between the conductive plate 12 and the conductive plate 23 have the same length L2 and width W2 as those of the overlap part 20. In the present invention, length L2 and width W2 are set so as to hold $L2 \geq W2$.

Figure 5A:
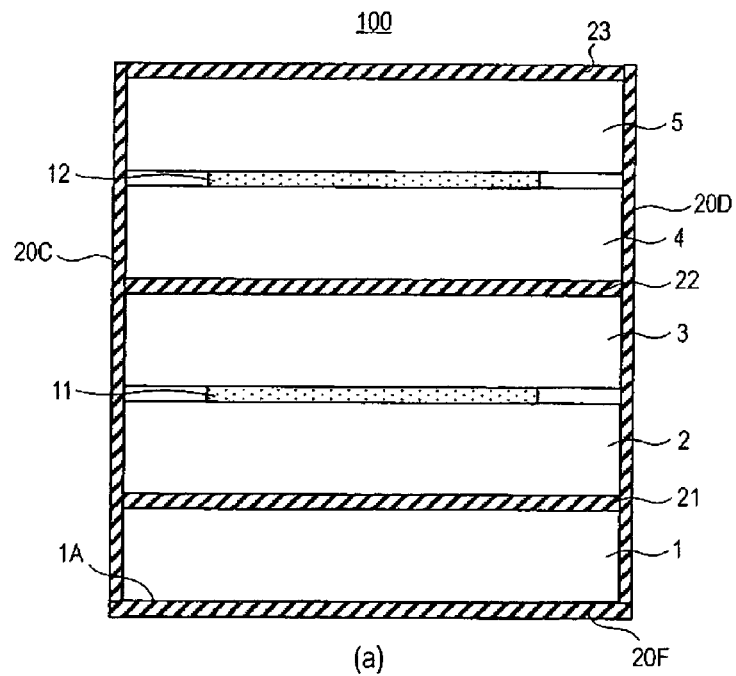
FIGS. 5A and 5B are cross-sectional views of the electric element shown in FIG. 2.
Figure 5B:
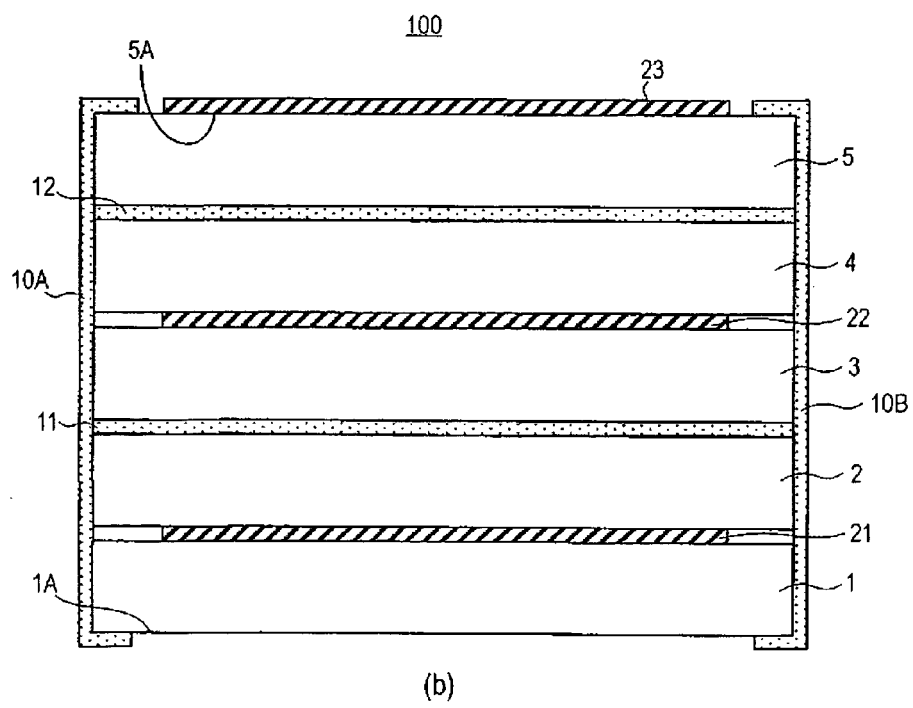

FIGS. 5A and 5B are cross-sectional views of the electric element 100 shown in FIG. 2. FIG. 5A is a cross-sectional view of the electric element 100 as taken along line VA-VA of FIG. 2, while FIG. 5B is a cross-sectional view of the electric element 100 as taken along line VB-VB of FIG. 2.

Referring to FIGS. 5A and 5B, the conductive plate 21 is in contact with both dielectric layers 1, 2, while the conductive plate 11 is in contact with both dielectric layers 2 and 3. The conductive plate 22 is in contact with both dielectric layers 3 and 4, while the conductive plate 12 is in contact with both dielectric layers 4 and 5. In addition, the conductive plate 23 is in contact with the dielectric layer 5.

The side cathode electrodes 20C, 20D are not connected to the conductive plates 11, 12, but to the conductive plates 21 to 23. The cathode electrode 20F is disposed under an underside 1A of the dielectric layer 1 and is connected to the side cathode electrodes 20C, 20D. (see FIG. 5A)

The anode electrodes 10A, 10B are disposed on the side face of dielectric layers 1 to 5, under the underside 1A of the dielectric layer 1, and the principal surface 5A of the dielectric layer 5. Therefore, the anode electrodes 10A, 10B are not connected to the conductive plates 21 to 23, but to the conductive plates 11, 12. (see FIG. 5B)

Therefore, a group of conductive plate 21, dielectric layer 2 and conductive plate 11, a group of the conductive plate 11, dielectric layer 3 and conductive plate 22, a group of the conductive plate 22, dielectric layer 4 and conductive plate 12, and a group of the conductive plate 12, dielectric layer 5 and conductive plate 23 constitute four capacitors connected in parallel between the anode electrodes 10A and 10B and the cathode electrodes 20E and 20F.

Each capacitor has an electrode area equal to the overlap part 20 (see FIG. 4) of the two adjacent conductive plates.

Figure 6A:
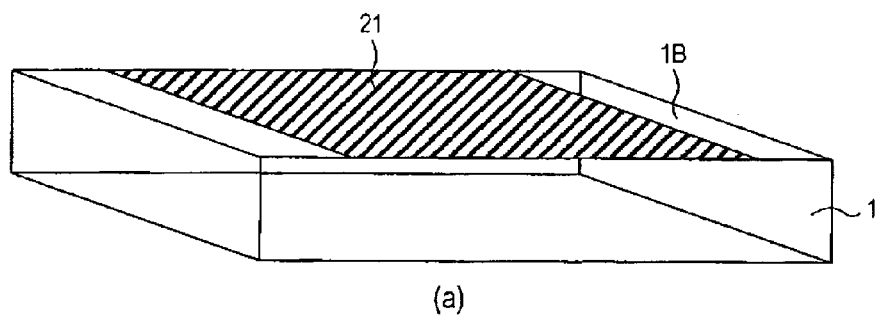
FIGS. 6A to 6C are the first process drawings for describing a fabricating method of the electric element shown in FIG. 2.
Figure 6B:
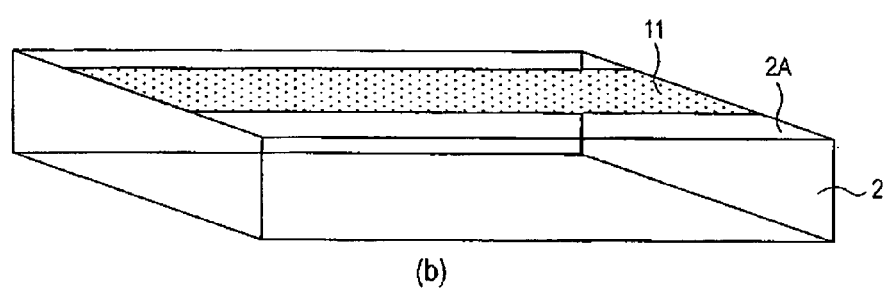
Figure 6C:
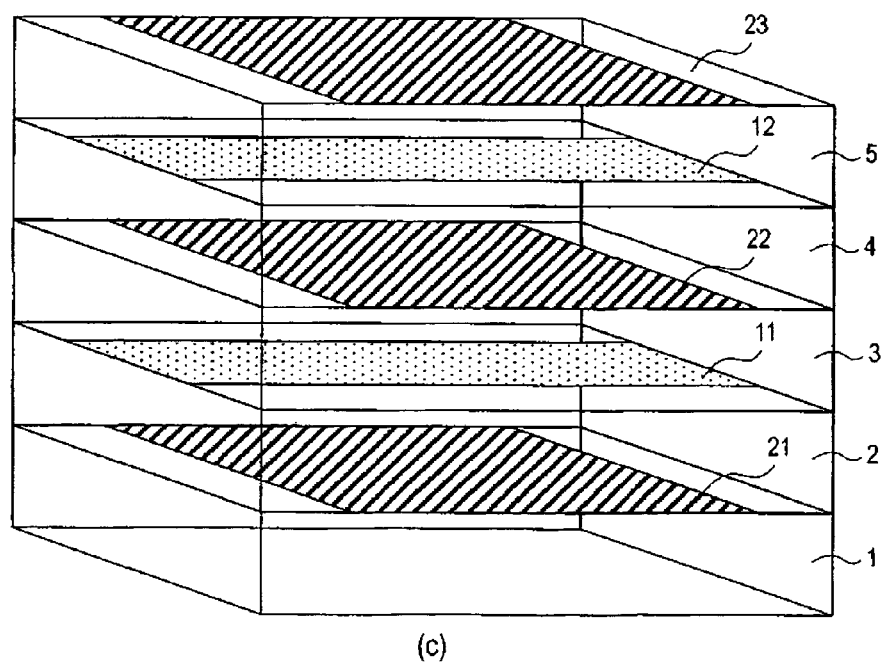

FIGS. 6A to 6C and FIGS. 7A and 7B are the first and second process drawings, respectively, for describing a fabricating method of the electric element 100 shown in FIG. 2. Referring to FIGS. 6A to 6C, a green sheet, which will be the dielectric layer 1 ($BaTiO_3$), having length L1, width W1 and thickness D1 is prepared. In an area having length L2 and width W1 on the front face 1B of the green sheet, Ni paste is applied by screen printing to form a Ni conductive plate 21 on the front face 1B of the dielectric layer 1.

Similarly, after the dielectric layers 3, 5 composed of $BaTiO_3$ are prepared, the conductive plates 22, 23 composed of Ni are formed on the prepared dielectric layers 3, 5, respectively (see FIG. 6A).

Subsequently, a green sheet, which will be the dielectric layer 2 ($BaTiO_3$), having length L1, width W1 and thickness D1 are prepared. In an area having length L1 and width W2 on the front face 2A of the green sheet, Ni paste is applied by screen printing to form a Ni conductive plate 11 on the front face 2A of the dielectric layer 2.

Similarly, after the dielectric layer 4 composed of $BaTiO_3$ is prepared, the conductive plate 12 composed of Ni is formed on the prepared dielectric layer 4 (see FIG. 6B).

The green sheets of the dielectric layers 1 to 5 on which conductive plates 21, 11, 22, 12, 23 are respectively formed, are successively laminated (see FIG. 6C). This successive lamination results in alternate lamination of the conductive plates 11, 12 to be connected to the anode electrodes 10A, 10B and the conductive plates 21 to 23 to be connected to the cathode electrodes 20E, 20F.

Figure 7A:
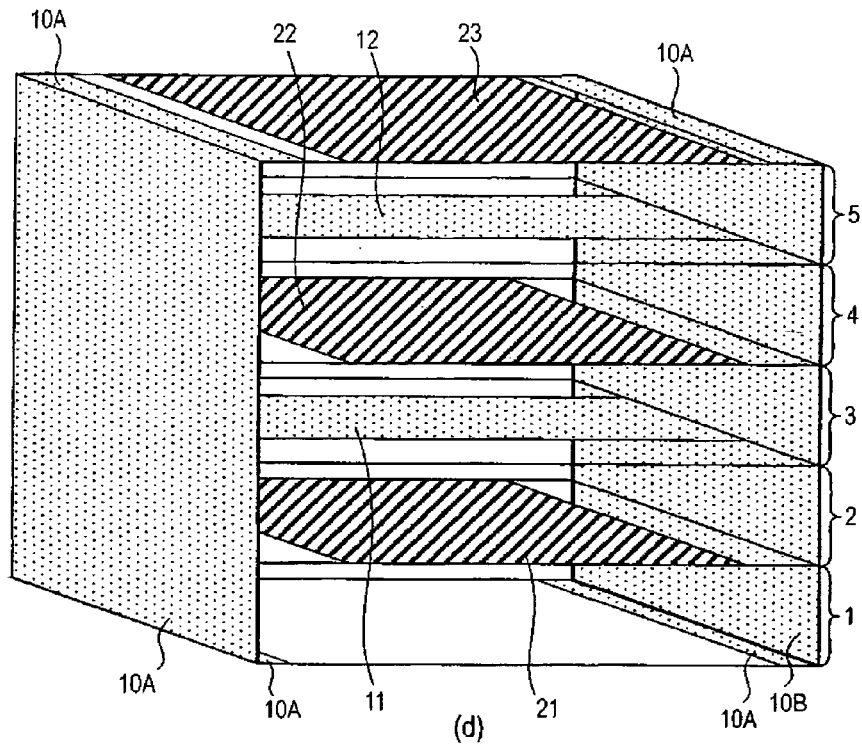
FIGS. 7A and 7B are the second process drawings for describing a fabricating method of the electric element shown in FIG. 2.
Figure 7B:
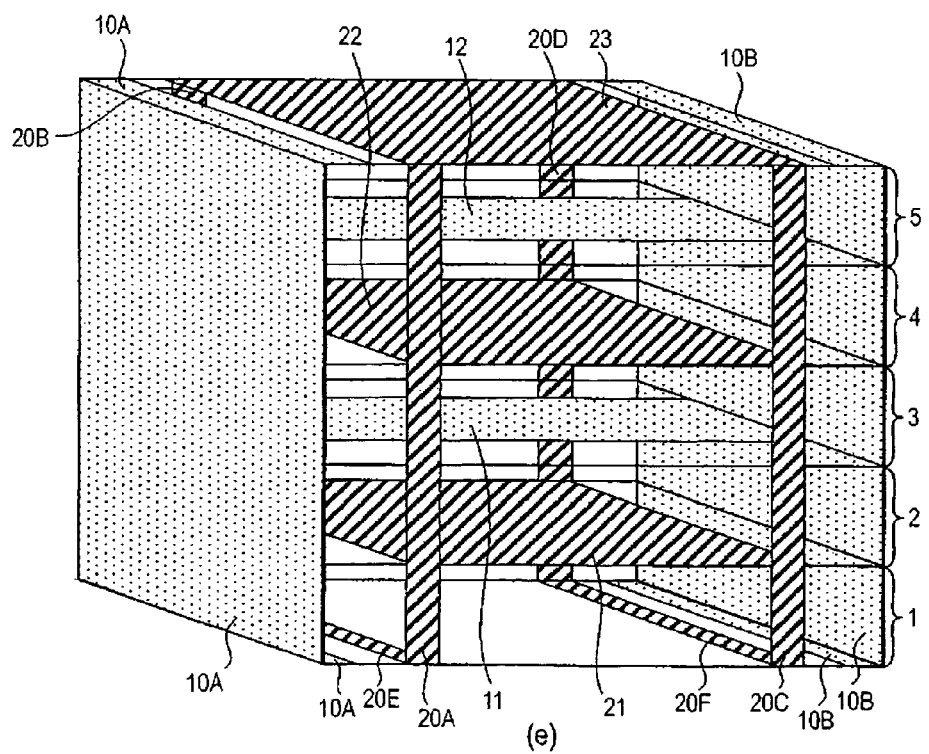

Then, the Ni paste is applied by the screen printing to form the anode electrodes 10A, 10B, side cathode electrodes 20A, 20B, 20C, 20D and cathode electrodes 20E, 20F (see FIGS. 7A and 7B). The element fabricated as shown in FIG. 7B is fired at a temperature of 1350 degrees C. to complete the electric element 100. Alternatively, the side electrodes (external electrodes) can be made of materials having a lower melting point and higher conductivity than that of the internal electrodes (conductive plates 11, 12, 21 to 23) by use of post-fire. Further, the fired side electrodes (external electrodes) may require plating with Ni, Au, Su or other materials, if necessary, under consideration of solder wettability.

There is another method of fabricating the electric element 100 without the green sheets. In the method, a process of printing and drying dielectric paste and a process of printing a conductor on the dried dielectric paste are repeatedly performed to stack the dielectric layers and conductive plates.

Figure 8:
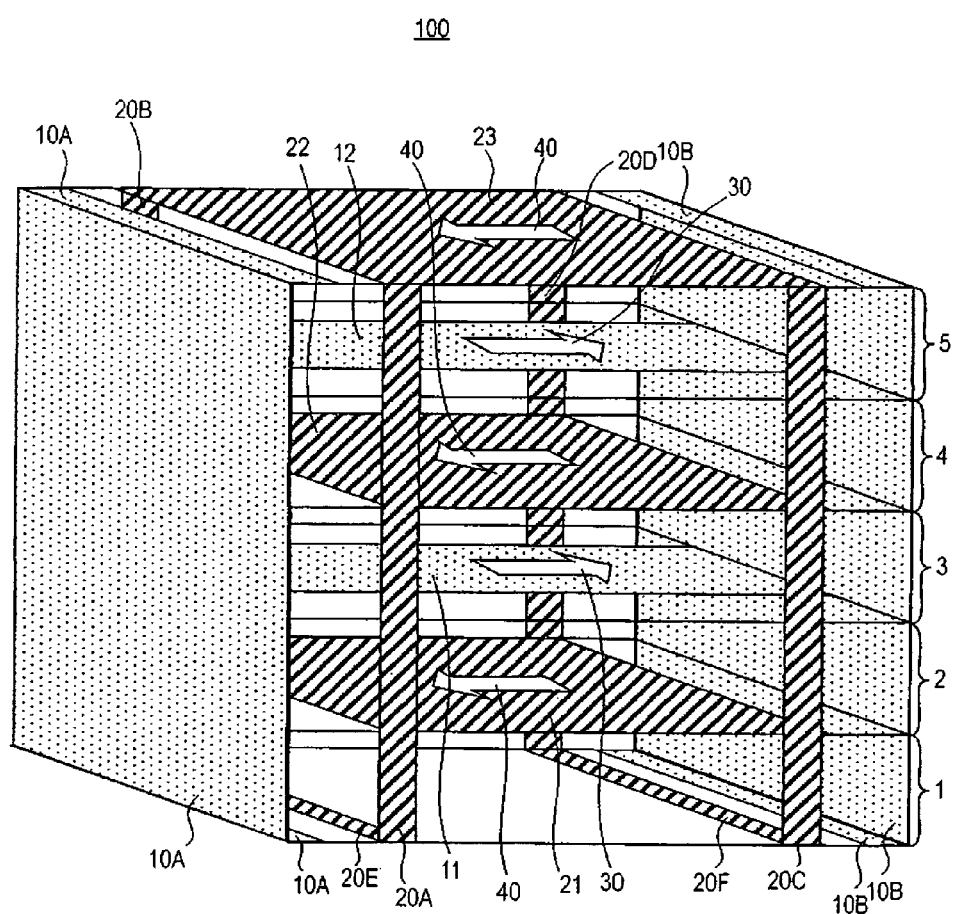
FIG. 8 is a perspective view for describing the functions of the electric element shown in FIG. 2.

FIG. 8 is a perspective view for describing the functions of the electric element 100 shown in FIG. 2. Referring to FIG. 8, with the cathode electrodes 20E, 20F connected to ground potential, the electric element 100 passes the DC current so that the DC current flows in the conductive plates 11, 12 in the opposite direction to the DC current flowing in the conductive plates 21 to 23.

If a DC current is fed to the electric element 100 so as to flow from the anode electrode 10A to the anode electrode 10B, for example, the DC current flows from the anode electrode 10A to the conductive plates 11, 12, passes through the conductive plates 11, 12 in the direction of arrow 30, and further passes to the anode electrode 10B.

A return current of the current having flowed in the conductive plates 11, 12 passes from the cathode electrode 20F through the side cathode electrodes 20C, 20D to the conductive plates 21 to 23. The return current then passes through the conductive plates 21 to 23 in the direction of arrow 40, which is opposite to the arrow 30, and further flows in the side cathode electrodes 20A, 20B to the cathode electrode 20E.

In this configuration, a DC current I1 flowing through the conductive plates 11, 12 and a DC current I2 flowing through the conductive plates 21 to 23 are equal in magnitude and opposite in direction.

Figure 9:
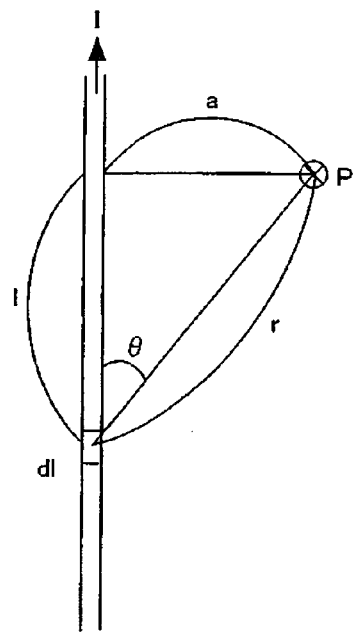
FIG. 9 is a view for describing magnetic flux density produced by an electric current passing through a conductive wire.
Figure 10:
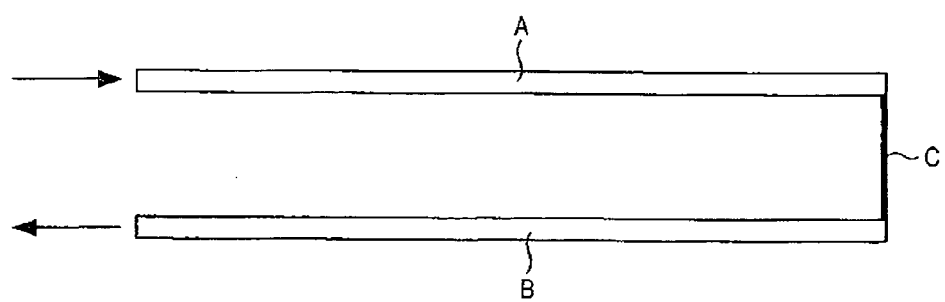
FIG. 10 is a view for describing effective inductance upon the occurrence of magnetic interference between two conductive wires.

FIG. 9 is a view for describing magnetic flux density produced by an electric current passing through a conductive wire. FIG. 10 is a view for describing effective inductance upon the occurrence of magnetic interference between two conductive wires.

Referring to FIG. 9, when an electric current I is flowing in an infinitely long straight wire, a magnetic flux density B at a point P at distance a from the wire is expressed by:

$$B = \frac{\mu_0 I}{2\pi r} \quad (1)$$

In this expression, $\mu_0$ indicates magnetic permeability in a vacuum.

Alternatively, when the conductive wire shown in FIG. 9 is replaced with two conductive wires that mutually cause magnetic interference, mutual inductance $L_{12}$ is expressed as below, where self-inductances of the two conductive wires are $L_{11}$ and $L_{22}$, respectively, and coupling coefficient is k(0<k<1), and the mutual inductance of the two conductive wires is $L_{12}$.

$$L_{12} = k \cdot \sqrt{L_{11} \cdot L_{22}} \quad (2)$$

If $L_{11} = L_{22}$, the mutual inductance $L_{12}$ is expressed by:

$$L_{12} = k \cdot L_{11} \quad (3)$$

Referring to FIG. 10, given that a conductive wire A and conductive wire B are connected by a lead wire C and both have an electric current flowing therethrough that are equal in magnitude but opposite in direction, effective inductance $L_{11effective}$ of the conductive wire A is expressed by:

$$L_{11effective} = L_{11} - L_{12} \quad (4)$$

As discussed above, the magnetic interference occurred between the conductive wire A and the conductive wire B creates the mutual inductance $L_{12}$, which causes the effective inductance $L_{11effective}$ of the conductive wire A to be smaller than the self-inductance $L_{11}$ of the conductive wire A. This is because the direction of magnetic flux$ø_A$ produced by the electric current I flowing in the conductive wire A is opposite to the direction of magnetic flux$ø_B$ produced by the electric current –I flowing in the conductive wire B, therefore effective magnetic flux density produced by the electric current I in the conductive wire A is reduced.

Figure 11A:
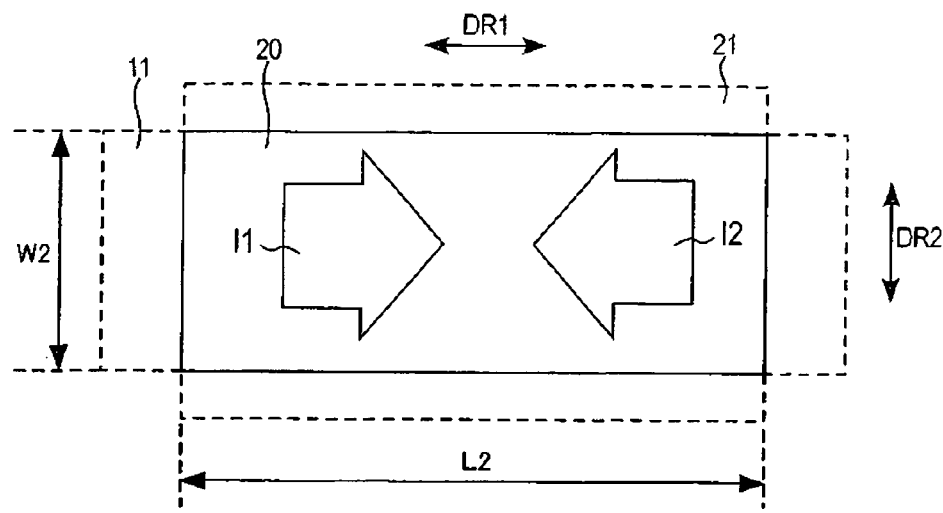
FIGS. 11A and 11B are a conceptual illustration for describing a mechanism that can reduce the inductance of the electric element shown in FIG. 2.
Figure 11B:
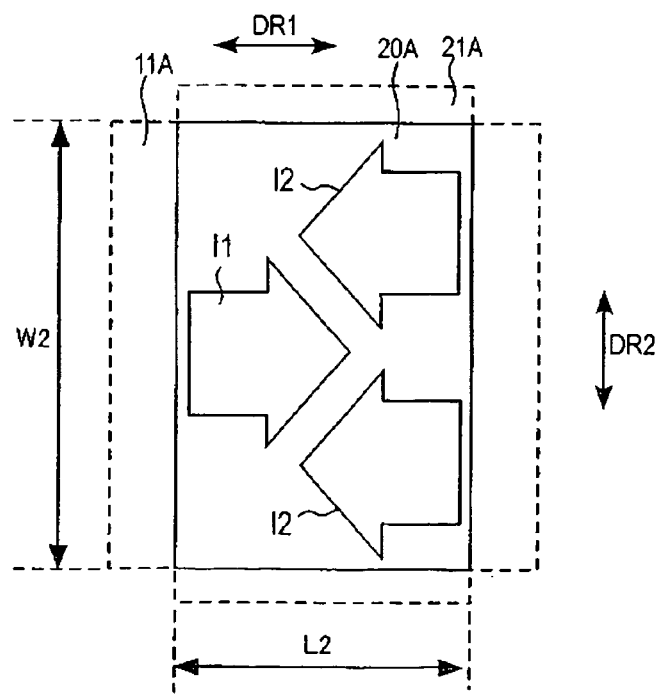

FIGS. 11A and 11B are a conceptual illustration for describing a mechanism that can reduce the inductance of the electric element 100 shown in FIG. 2.

In the above-discussed electric element 100, the conductive plate 11 is located 25 µm away from the conductive plates 21, 22 and the conductive plate 12 is located 25 µm away from the conductive plates 22, 23. Because of this, magnetic interference occurs between the conductive plate 11 and each conductive plates 21, 22 and between the conductive plate 12 and each conductive plates 22, 23. Since the DC current I1 flowing in the conductive plates 11, 12 and the DC current I2 flowing in the conductive plates 21 to 23 are equal in magnitude but opposite in direction, the effective inductance of the conductive plates 11, 12 becomes smaller than the self-inductance of the conductive plates 11, 12 due to the mutual inductance between the conductive plates 11, 12 and the conductive plates 21 to 23.

The self-inductance of the conductive plates 11, 12 with length L2 not less than width W2 of the overlap part 20 between the conductive plate 11, 12 and the conductive plates 21 to 23 is significantly lower than that with length L2 shorter than width W2 of the overlap part 20. The reason will be described by referring to FIGS. 11A and 11B.

FIG. 11A illustrates that length L2 is not less than width W2 in the overlap part 20. FIG. 11B illustrates that length L2 is shorter than width W2 in the overlap part 20. In FIGS. 11A and 11B, an arrow shows the electric current flowing to the wide of the direction DR2. In FIGS. 11A and 11B, each of the overlap part 20 has equal area.

Referring to FIG. 11A, the DC current I1 flows in the conductive plate 11, while the DC current I2 flows in the conductive plate 21. When length L2 is not less than width W2 in the overlap part 20, the DC currents I1, I2 flow almost entirely in width W2 of the overlap part 20 and flow in the conductive plates 11, 12, respectively. As a result, a magnetic flux$ø_B$ produced by the DC current I2 flowing in the conductive plate 21 significantly and relatively deny a magnetic flux$ø_A$ produced by the DC current I1 flowing through the conductive plate 11. Therefore, a mutual inductance between the conductive plate 11 and the conductive plate 21 significantly and relatively lower an effective inductance of the conductive plate 11 than a self-inductance of the conductive plate 11 as well as than an effective inductance of the conductive plate 12 than a self-inductance of the conductive plate 12.

Referring to FIG. 11B, when length L2 is shorter than width W2 in the overlap part 20, the DC current I1 flows in the central area of the conductive plate 11 along the direction DR2, while the DC current I2 flows in the edge area of the conductive plate 21 along the direction DR 2.

This is because where length L2 is shorter than width W2, a resistance when the DC current I1 flows to a longitudinal direction DR1 is not less than a resistance when the DC current I1 introduced in the conductive plate 11 from the anode electrode 10A flows to the wide of width direction DR2 in the conductive plate 11.

This is because where length L2 is shorter than width W2, a resistance when the DC current I2 flows to a longitudinal direction DR1 of the conductive plate 21 is not less than a resistance when the DC current I2 introduced in the conductive plate 21 from the side cathode electrodes 20C, 20D flows to the wide of a width direction DR2 in the conductive plate 21.

Referring to FIG. 11B, when length L2 is shorter than width W2 in the overlap part 20, the DC current I1 flows in the central area of the overlap part 20 along the width direction DR2, while the DC current I2 flows in the edge area of the overlap part 20 along the width direction DR 2.

As a result, a magnetic flux$\phi_B$ produced by the DC current I2 flowing in the conductive plate 21 slightly and relatively deny a magnetic flux$\phi_A$ produced by the DC current I1 flowing through the conductive plate 11. Therefore, a mutual inductance between the conductive plate 11 and the conductive plate 21 slightly and relatively lower an effective inductance of the conductive plate 11 than a self-inductance of the conductive plate 11 as well as an effective inductance of the conductive plate 12 than a self-inductance of the conductive plate 12.

As discussed above, when length L2 is not less than width W2 in the overlap part 20, an effective inductance of the conductive plates 11, 12 is significantly and relatively lower than its self-inductance of the conductive plates 11, 12.

As a result, the total effective inductance L of the electric element 100 is significantly and relatively reduced.

The above-discussed electric element 100 with four capacitors connected in parallel results in having more effective capacitance C as compared with an electric element with one capacitor.

In conclusion, the electric element 100 can reduce its impedance Zs with an increase in the effective capacitance C in a low-frequency range dominated by capacitance, while the electric element 100 can reduce its impedance Zs with a decrease in the effective inductance L in a high-frequency range dominated by inductance.

As a result, the electric element 100 has relatively low impedance for broadband frequencies.

Figure 12:
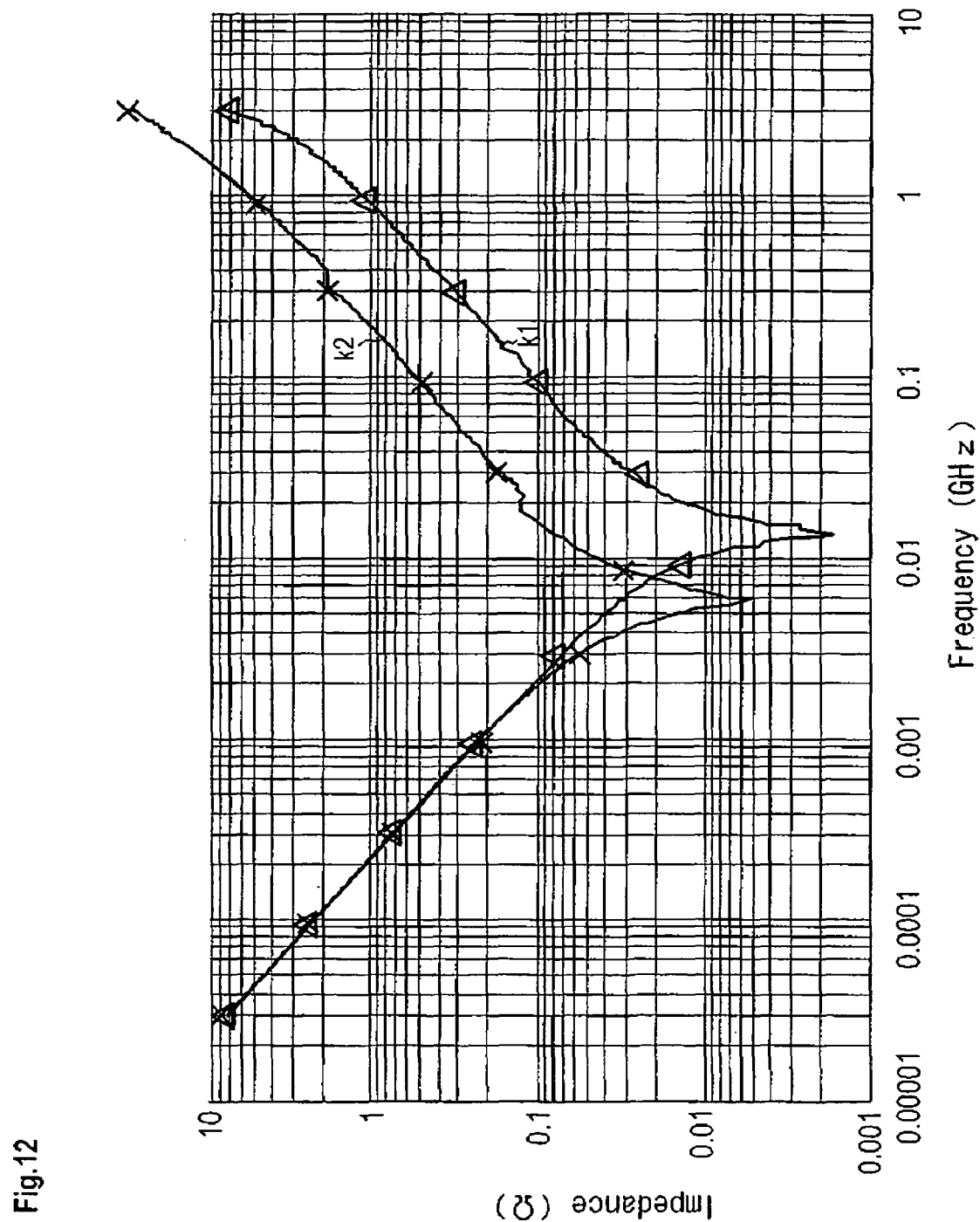
FIG. 12 is a view illustrating the frequency dependence of impedance in the electric element shown in FIG. 2.

FIG. 12 is a view illustrating the frequency dependence of impedance in the electric element 100 shown in FIG. 2.

In FIG. 12, the horizontal axis indicates frequency, while the vertical axis indicates impedance. Curve k1 shows the frequency dependence of impedance when length L2 is not less than width W2 in the overlap part 20. Curve k2 shows the frequency dependence of impedance where the length L2 is shorter than the width W2 in the overlap part 20.

Referring to FIG. 12, a low-frequency range with not more than 0.006 GHz is frequency range dominated by capacitance, while a high-frequency range with not less than 0.01 GHz is frequency range dominated by inductance. As discussed above, the area of the overlap part when length L2 is not less than width W2 in the overlap part 20 is same as that when length L2 is shorter than width W2 in the overlap part 20. Therefore, in a low-frequency range with not more than 0.006 GHz dominated by capacitance, the impedance of the electric element 100 when length L2 is not less than width W2 in the overlap part 20 (curve k1) is almost same as that when length L2 is shorter than width W2 in the overlap part 20 (curve k2)

While, an inductance of the electric element 100 when length L2 is not less than width W2 in the overlap part 20 is significantly and relatively reduced as compared with that when length L2 is shorter than width W2 in the overlap part 20. Therefore, in a high-frequency range with not less than 0.01 GHz dominated by inductance, the impedance of the electric element 100 when length L2 is not less than width W2 in the overlap part 20 (curve k1) is less than that when length L2 is shorter than width W2 in the overlap part 20 (curve k2).

Therefore, the overlap part 20 between the conductive plates 11, 12 and the conductive plates 21 to 23, which is so set that length L2 is not less than width W2, can reduce the impedance of the electric element 100 in frequency range dominated by inductance.

Figure 13:
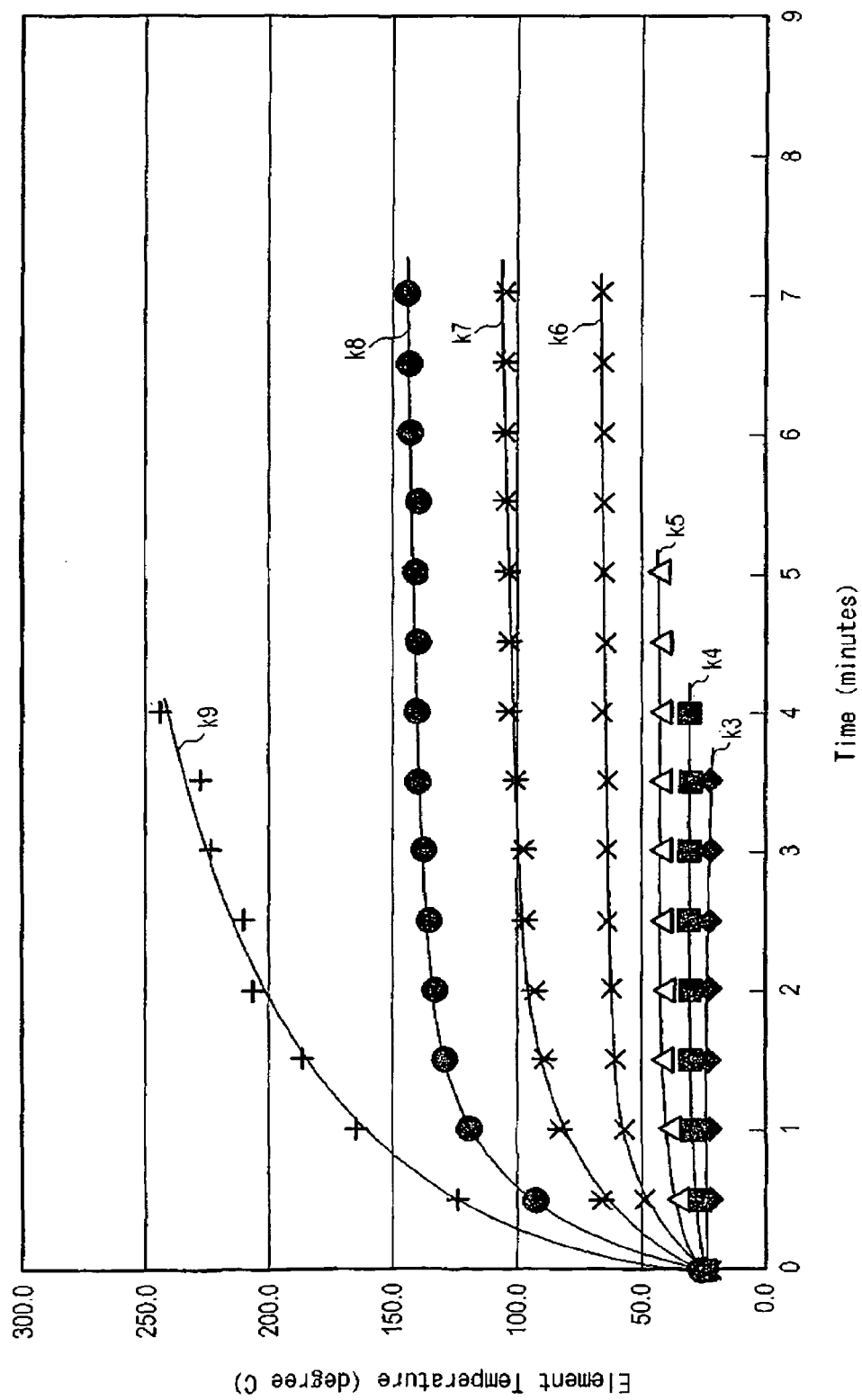
FIG. 13 is a view illustrating the relation of element temperature and time.

FIG. 13 is a view illustrating the relation of element temperature and time. FIG. 13 shows the relation of element temperature and time in the electric element 100 when the conductive plates 210, 220 are not placed on the electric element 100. In FIG. 13, the vertical axis indicates element temperature in the electric element 100, while the horizontal axis indicates time that the DC current is flowing. Each of curves k3 to k9 indicates the element temperature in a case where DC currents of 5 A, 10 A, 15 A, 20 A, 25 A, 30 A, 35 A flow respectively.

Referring to FIG. 13, where DC currents of 5 A, 10 A, 15 A flow, temperature in the electric element 100 is lower than approximately 50 degrees C. (see curves k3 to k5). Where DC current of 20 A flows, temperature in the electric element 100 is approximately 60 degrees C. (see curve k6). Where DC current of 25 A flows, temperature in the electric element 100 is over 100 degrees C. (see curve k7). Where DC current of 30 A flows, temperature in the electric element 100 is approximately 150 degrees C. (see curve k8). Where DC current of 35 A flows, temperature in the electric element 100 rises to approximately 250 degrees C. (see curve k9) in about four minutes.

Figure 14:
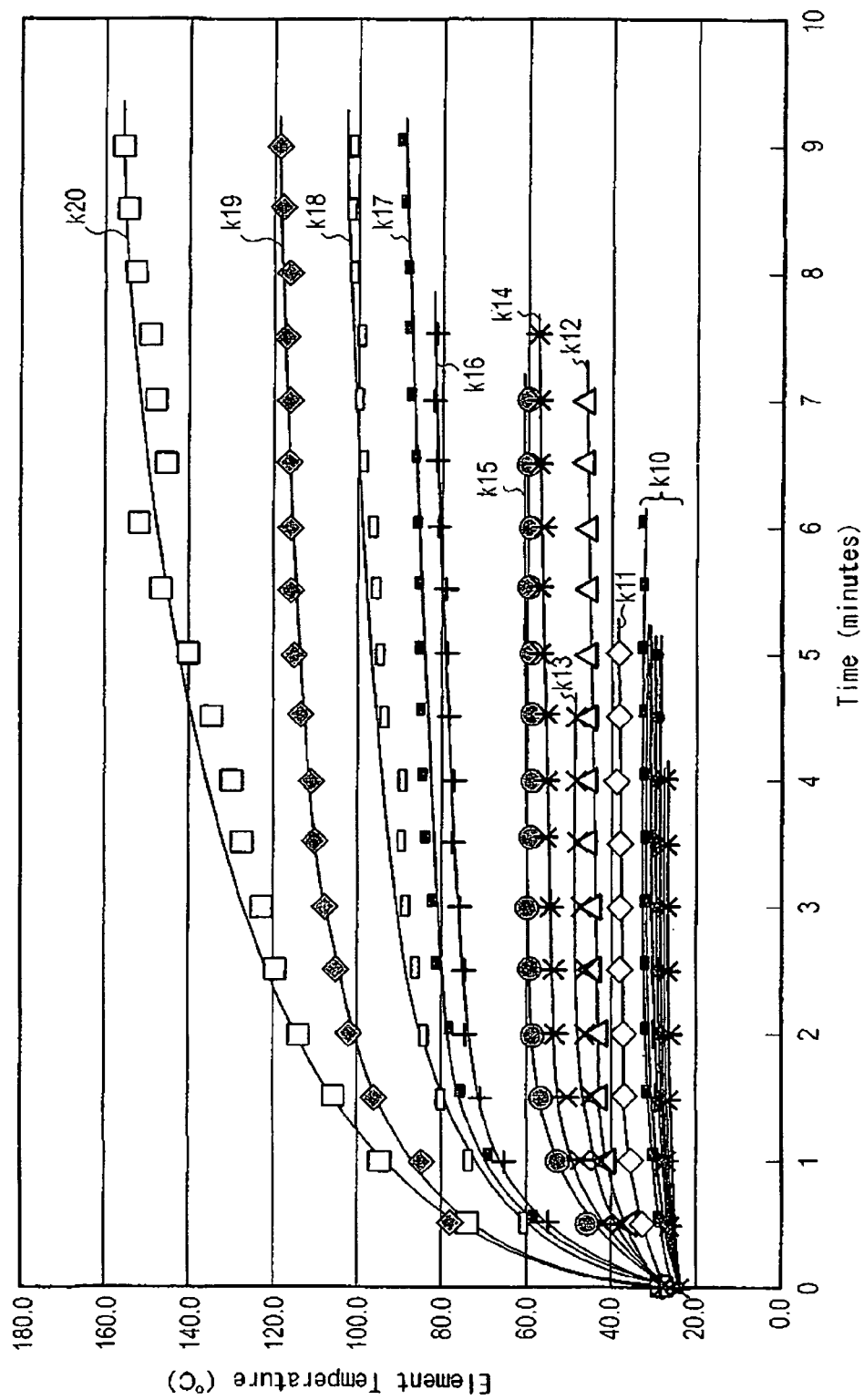
FIG. 14 is another view illustrating the relation of element temperature and time.

FIG. 14 is another view illustrating the relation of element temperature and time. FIG. 14 shows the relation of element temperature and time of the electric element 100 when the conductive plates 210, 220 are placed on the electric element 100. In FIG. 14, the vertical axis indicates element temperature in the electric element 100, while the horizontal axis indicates time that the DC current is flowing. Curve group k10 shows the element temperature in a case where DC currents of 5 A, 10 A, 15 A, 20 A, 25 A, 30 A, 35 A, 40 A, 45 A, 50 A flow respectively. Each of curves k11 to k20 indicates the element temperature in a case where DC currents of 55 A, 60 A, 65 A, 70 A, 75 A, 80 A, 85 A, 90 A, 95 A, 100 A flow respectively.

Referring to FIG. 14, with the placement of the conductive plates 210, 220 on the electric element 100, temperature in the electric element 100 is lower than 40 degree C. (see curve group k10) even where DC currents of 5 A, 10 A, 15 A, 20 A, 25 A, 30 A, 35 A, 40 A, 45 A, 50 A flow respectively, temperature in the electric element 100 rises only to approximately 40 degree C. (see curve k11) even where DC current of 55 A flows, temperature in the electric element 100 is not more than 60 degree C. (see curves k12 to k15) even where DC currents of 60 A, 65 A, 70 A, 75 A flow respectively, temperature in the electric element 100 is approximately 80 degree C. (see curve k16) even where DC current of 80 A flows, temperature in the electric element 100 is approximately 90 degree C. (see curve k17) even where DC current of 85 A flows, temperature in the electric element 100 is approximately 100 degree C. (see curve k18) even where DC current of 90 A flows, temperature in the electric element 100 is approximately 120 degree C. (see curve k19) even where DC current of 95 A flows, and temperature in the electric element 100 is lower than 160 degree C. (see curve k20) even where DC current of 100 A flows.

When the temperature in the electric element 100 is set lower than 160 degree C., the placement of the conductive plates 210, 220 can thus increase the DC current flowing in the electric element 100 from 30 A to 100 A.

When the temperature in the electric element 100 is set approximately 40 degree C., the placement of the conductive plates 210, 220 can thus increase the DC current flowing in the electric element 100 from 15 A to 55 A.

Figure 15:
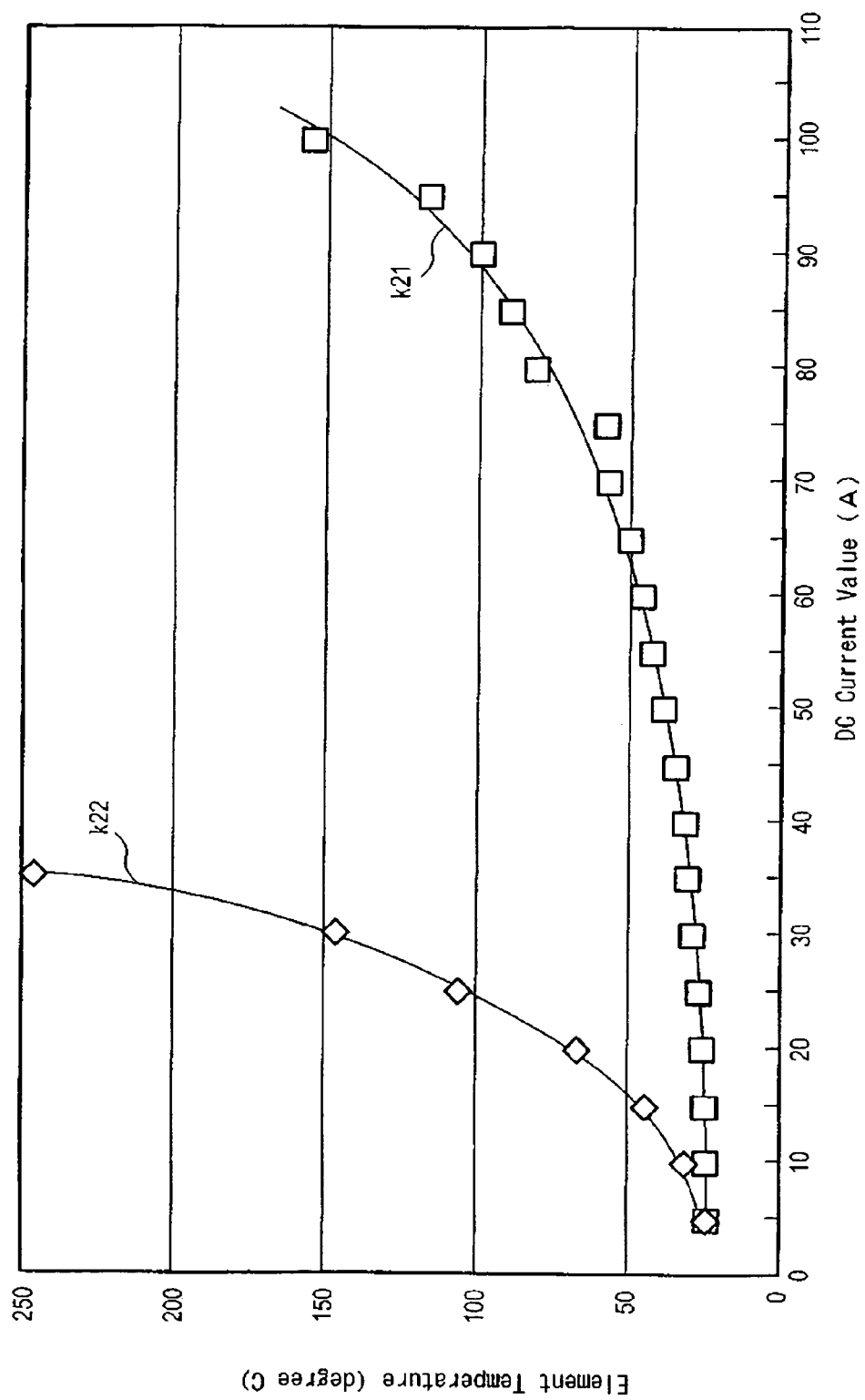
FIG. 15 is a view illustrating the relation of element temperature and DC current value.

FIG. 15 is a view illustrating the relation of element temperature and DC current value. In FIG. 15, the vertical axis indicates element temperature, while the horizontal axis indicates DC current value. Curve k21 indicates when the conductive plates 210, 220 are placed on the electric element 100. Curve k22 indicates when the conductive plates 210, 220 are not placed on the electric element 100. The temperature to each current value shown in curve k21 indicates when the each current value is flowing at maximum time shown in FIG. 14, while the temperature to each current value shown in curve k22 indicates when the each current value is flowing at maximum time shown in FIG. 13. The number of the conductive plates 11, 12 comprising the electric element 100 is four, while the number of the conductive plates 21 to 23 is five.

Referring to FIG. 15, with the placement of the conductive plates 210, 220 on the electric element 100, temperature in the electric element 100 is lower than 50 degree C. (see curve k21) even where DC current of 60 A flows in the electric element 100.

While, without the placement of the conductive plates 210, 220 on the electric element 100, DC current of not more than 15 A (see curve k22) is required to set the temperature of the electric element 100 at less than 50 degree C.

As shown in FIG. 13, FIG. 14, and FIG. 15, the placement of the conductive plates 210, 220 on the electric element 100 results in a low temperature in the electric element 100. This is due to the following reason.

As discussed above, the conductive plates 210, 220 have the thickness of 0.2 mm, while the conductive plates 11, 12, 21 to 23 have the thickness of 25 μm. The conductive plates 210, 220 have same width W1 as that of the conductive plates 21 to 23. The conductive plate 210 has almost same length L1 as that of the conductive plates 11, 12, while the conductive plate 220 has same length L2 as that of the conductive plates 21 to 23.

Therefore, a resistance of the conductive plates 210, 220 is lower than that of the conductive plates 11, 12, 21 to 23. The DC current mainly flowing in the conductive plates 210, 220 produces a heat in most of the conductive plates 210, 220 so as to prevent the temperature rise in the electric element 100 caused by the DC current.

Figure 16:
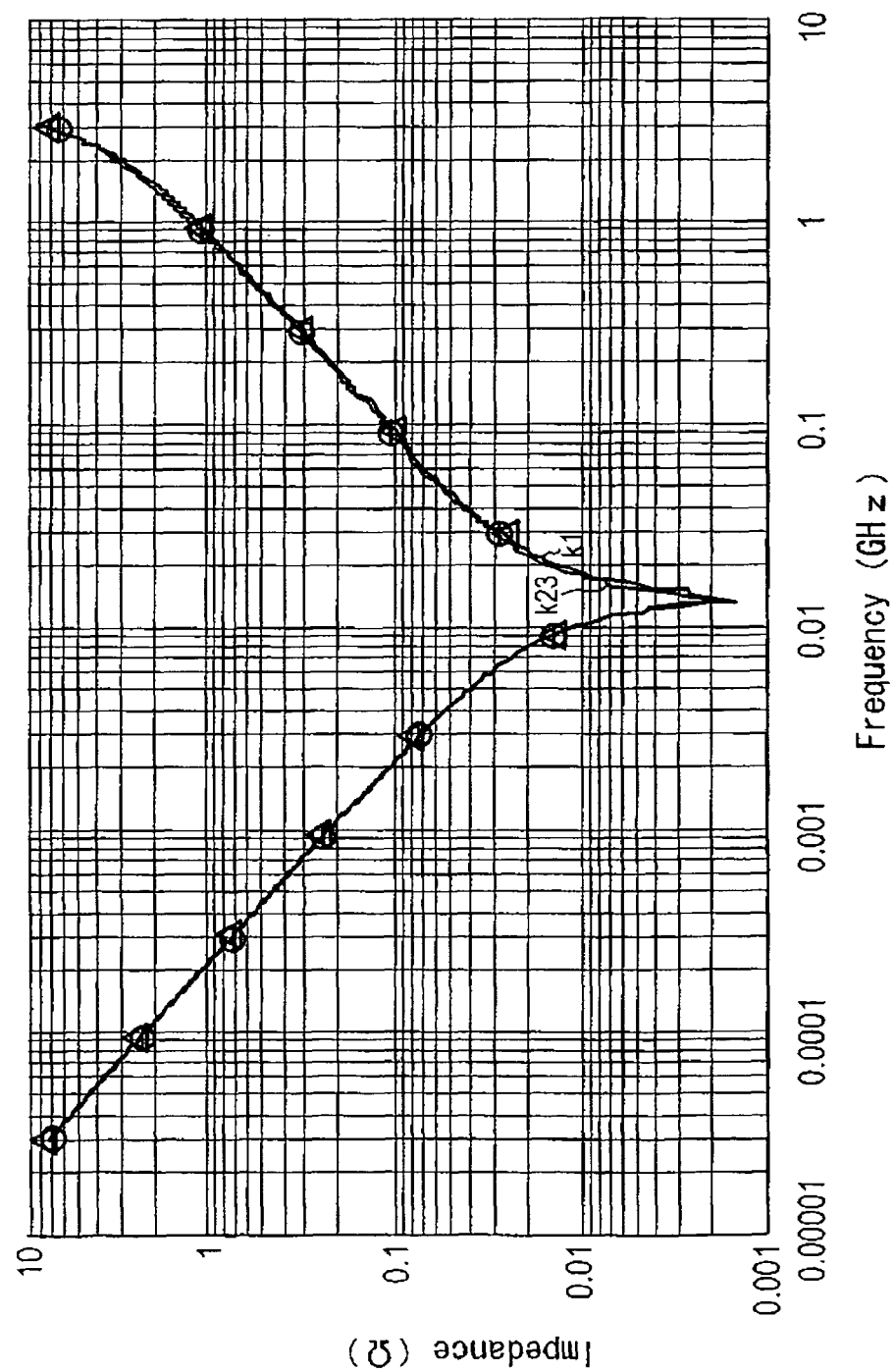
FIG. 16 is another view illustrating the frequency dependence of impedance in the electric element shown in FIG. 2.

FIG. 16 is another view illustrating the frequency dependence of impedance in the electric element shown in FIG. 2. In FIG. 16, the vertical axis indicates impedance, while the horizontal axis indicates frequency. Curve k1 indicates when the conductive plates 210, 220 are not placed on the electric element 100 as shown in FIG. 12. Curve k23 indicates when the conductive plates 210, 220 are placed on the electric element 100.

Referring to FIG. 16, in all low-frequency range dominated by capacitance and in all high-frequency range dominated by inductance, impedance of the electric element 100 with the placement of the conductive plates 210, 220 is approximately consistent to impedance of the electric element 100 without the placement of the conductive plates 210, 220. Thus, the impedance of the electric element 100 is not changed with the placement of the conductive plates 210, 220. In other words, the placement of the conductive plates 210, 220 holds the effect that an effective inductance of the conductive plates 11, 12 is significantly and relatively lower than its self-inductance of the conductive plates 11, 12.

The electric circuit device 200 upon the placement of the conductive plates 210, 220 can prevent the temperature rise in the electric element 100 with the frequency dependence of impedance of the electric element maintained, thereby relatively increasing the DC current flowing in the electric element 100.

Figure 17:
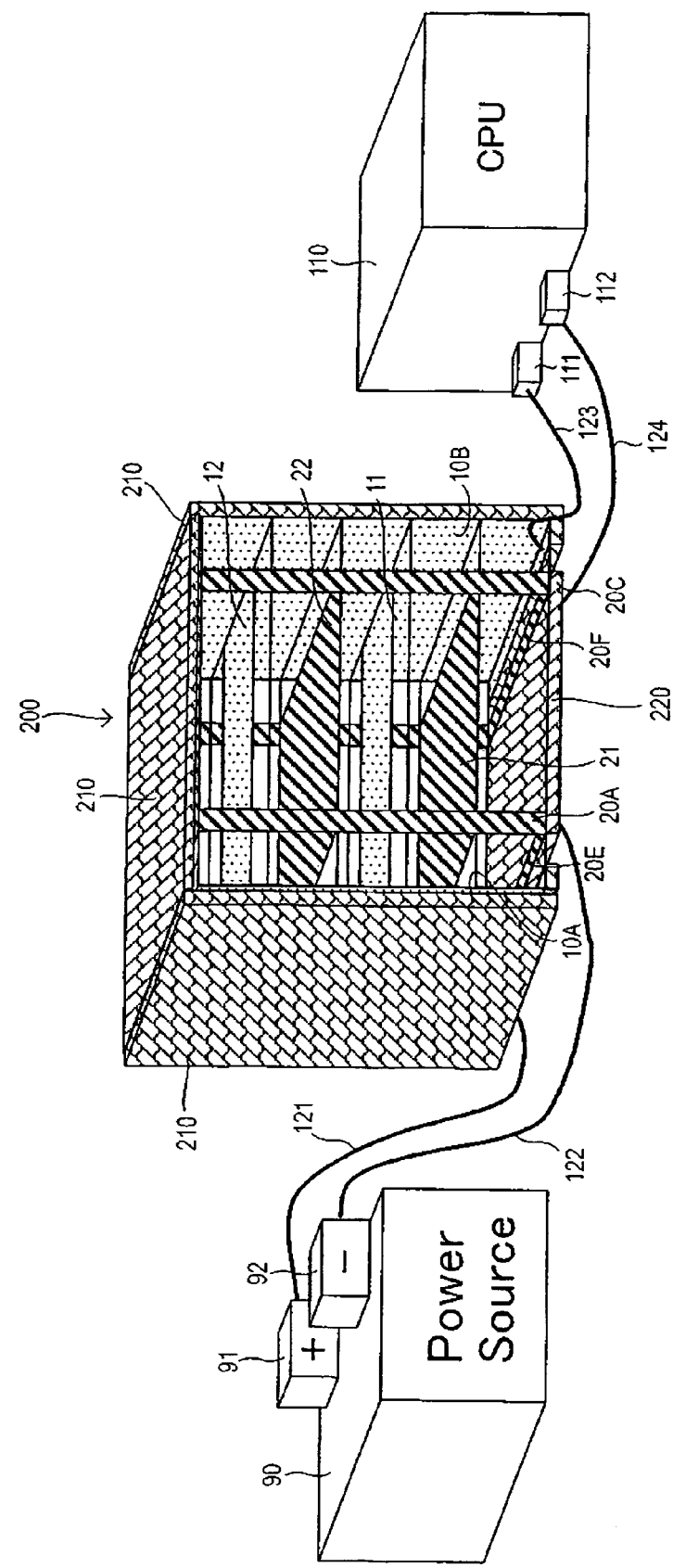
FIG. 17 is a conceptual illustration showing the electric element shown in FIG. 1 in an operating state.

FIG. 17 is a conceptual illustration showing the electric element 200 shown in FIG. 1 in an operating state. Referring to FIG. 17, the electric circuit device 200 is connected between the power source 90 and the CPU (Central Processing Unit) 110. The electric circuit device 200 has cathode electrodes 20E, 20F connected to ground potential. The power source 90 has a positive terminal 91 and a negative terminal 92. The CPU 110 has a positive terminal 111 and a negative terminal 112.

A lead wire 121 has one end connected with the positive terminal 91 of the power source 90 and the other end connected with the anode electrode 10A of the electric circuit device 200. A lead wire 122 has one end connected with the negative terminal 92 of the power source 90 and the other end connected with the cathode electrode 20E of the electric circuit device 200.

A lead wire 123 has one end connected with the anode electrode 10B of the electric circuit device 200 and the other end connected with the positive terminal 111 of the CPU 110. A lead wire 124 has one end connected with the cathode electrode 20F of the electric circuit device 200 and the other end connected with the negative terminal 112 of the CPU 110.

With this configuration, the DC current I output from the positive terminal 91 of the power source 90 passes through the lead wire 121 to the anode electrode 10A of the electric circuit device 200, and then passes mostly the conductive plate 210 and the anode electrode 10B in this order and partially the conductive plates 11, 12 and the anode electrode 10B in this order inside the electric circuit device 200. The DC current I then passes from the anode electrode 10B to the CPU 110 through the lead wire 123 and the positive terminal 111.

This passage allows the DC current I to be supplied as a power source current to the CPU 110. The CPU 110 is driven with the DC current I and outputs a return current Ir, which has the same magnitude as the DC current I, from the negative terminal 112.

The return current Ir passes through the lead wire 124 to the cathode electrode 20F of the electric circuit device 200, and then passes mostly the conductive plate 220 and the cathode electrode 20E in this order and partially the side cathode electrodes 20C, 20D, the conductive plates 21 to 23, the side cathode electrodes 20A, 20B and the cathode electrode 20E in this order inside the electric circuit device 200. The return current Ir then passes from the cathode electrode 20E, through the lead wire 122 and negative terminal 92, to the power source 90.

As a result, the electric circuit device 200 can prevent the temperature rise in the electric element 100 with the impedance Zs of the electric element 100 maintained in low impedance as discussed above.

The CPU 110 is driven with the DC current I supplied from the power source 90 through the electric circuit device 200, and produces an unwanted high-frequency current. This unwanted high-frequency current leaks through the lead wires 123, 124 out to the electric circuit device 200. However, the low impedance Zs of the electric circuit device 200 as discussed above causes the unwanted high-frequency current to flow within circuitry made up of the electric circuit device 200 and CPU 110, thereby preventing the leakage from the electric circuit device 200 toward the power source 90.

Under circumstances where the operating frequency of the CPU 110 tends to shift toward high frequencies, it could be assumed that the CPU 110 is operated at approximately 1 GHz. In such a high operating frequency range, the electric circuit device 200 functions as a noise filter for confining the unwanted high-frequency current, which is produced by the CPU 110 operating at the high operating frequency, within the vicinity of the CPU 110 under the condition that impedance Zs of the electric circuit device 200 is determined mainly by the effective inductance L and the effective inductance L is significantly and relatively reduced as discussed above.

As discussed above, the electric circuit device 200 is connected between the power source 90 and the CPU 110, and functions as a noise filter for confining the unwanted high-frequency current produced by the CPU 110 within the vicinity of the CPU 110. When the electric circuit device 200 is connected between the power source 90 and the CPU 110, the conductive plates 11, 12, 21 to 23 are connected as transmission lines. In other words, the capacitor made up of the conductive plates 11, 12 connected to the anode electrodes 10A, 10B and the conductive plates 21 to 23 connected to the cathode electrodes 20E, 20F does not require terminals to be connected to the transmission line but using the conductive plates 11, 12, 21 to 23 as a part of the transmission lines. The conductive plates 11, 12, therefore, are conductors used for allowing the DC current I output from the power source 90 to flow from the power source 90 side to the CPU 110 side, while the conductive plates 21 to 23 are conductors used for allowing the return current Ir to flow from the CPU 110 side to the power source 90 side. Consequently, the equivalent series inductance can be reduced to a minimum.

In addition, the electric circuit device 200 is so configured that a current flowing in the conductive plates 11, 12 connected to the anode electrodes 10A, 10B is directed opposite to a current flowing in the conductive plates 21 to 23 connected to the cathode electrodes 20E, 20F, thereby creating magnetic interference between the conductive plates 11, 12 and conductive plates 21 to 23. Because of the magnetic interference, the mutual inductance between the conductive plates 11, 12 and conductive plates 21 to 23 reduces the self-inductance of the conductive plates 11, 12. The reduction of the self-inductance of the conductive plates 11, 12 reduces the effective inductance of the electric element 100, thus lowering the impedance Zs of the electric circuit device 200.

The first characteristic feature of the electric circuit device 200 discussed above is that the conductive plates 11, 12, 21 to 23, which constitute electrodes of the capacitor, are connected as a part of the transmission lines. The second characteristic feature is that the current flowing through the conductive plates 11, connected to the anode electrodes 10A, 10B and the current flowing in the opposite direction through the conductive plates 21 to 23 connected to the cathode electrodes 20E, 20F create magnetic interference between the conductive plates 11, 12 and conductive plates 21 to 23, thereby making the effective inductance of the conductive plates 11, 12 smaller than the self-inductance of the conductive plates 11, 12, therefore lowering the impedance Zs of the electric circuit device 200. The third characteristic feature is that each of the conductive plates 11, 12 passing the DC current constituting a signal is sandwiched by two conductive plates (conductive plates 21, 22 or conductive plates 22, 23) connected to ground potential.

The second characteristic feature is realized by adopting the structure in which the return current Ir from the CPU 110 flows to the conductive plates 21 to 23 placed inside the electric circuit device 200.

The equivalent series inductance can be reduced to a minimum according to the first characteristic feature, and the unwanted high-frequency current can be confined in the vicinity of the CPU 110 according to the second characteristic feature. The third characteristic feature prevents noise generated by the electric circuit device 200 from leaking outside as well as preventing noise generated outside the electric circuit device 200 from affecting the electric circuit device 200.

Figure 18:
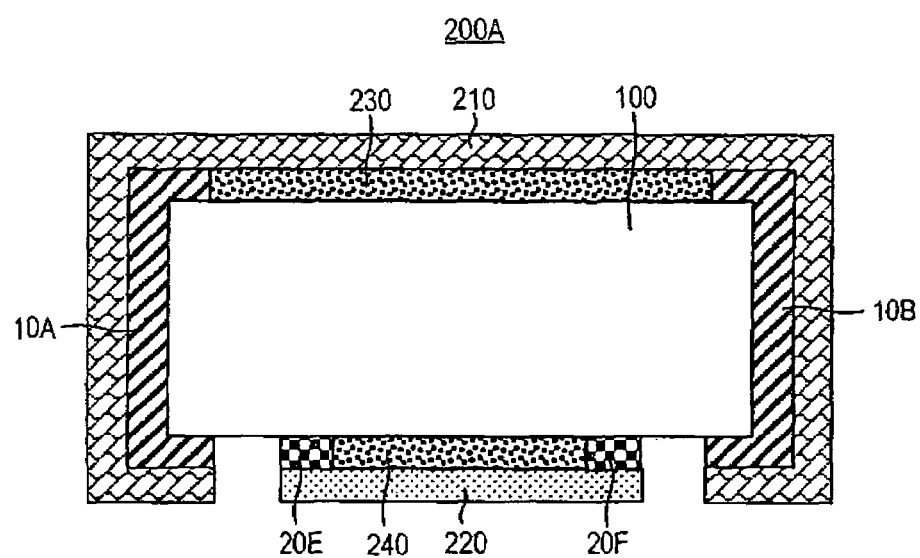
FIG. 18 is another schematic and cross-sectional view illustrating the structure of an electric circuit device according to the first embodiment of the present invention.

FIG. 18 is another schematic and cross-sectional view illustrating the structure of an electric circuit device according to the first embodiment of the present invention. The electric circuit device according to the embodiment can be replaced with an electric circuit device 200A shown in FIG. 18. Referring to FIG. 18, the electric circuit device 200A includes heat radiation members 230, 240 and the same components as those of the electric circuit device 200.

The heat radiation members 230, 240 are composed of, for example, silicon (Si) grease. The heat radiation member 230 is disposed between the electric element 100 and the conductive plate 210 so as to abut on the electric element 100 and the conductive plate 210, while the heat radiation member 240 is disposed between the electric element 100 and the conductive plate 220 so as to abut on the electric element 100 and the conductive plate 220. The distances between the electric element 100 and the conductive plate 210 and between the electric element 100 and the conductive plate 220 are both in a range between 10 μm to 20 μm, therefore each of the heat radiation members 230, 240 has a thickness in a range between 10 μm to 20 μm.

The heat radiation members 230, 240 allow a heat produced in the electric element 100 to transmit to the conductive plates 210, 220, thereby furthermore preventing the temperature rise in the electric element 100.

As the electric circuit device 200 according to the embodiment shown in FIG. 17, the electric circuit device 200A is arranged between the power source 90 and the CPU 110, and functions as a noise filter for confining the unwanted high-frequency current produced by the CPU 110 within the vicinity of the CPU 110. As to the other structure, the electric circuit device 200A is the same as the electric circuit device 200.

Although length L2 and width W2 in the overlap part 20 are set so as to hold L2≧W2 as discussed above, the present invention is not limited to this. Length L2 and width W2 in the overlap part 20 can be set so as to hold L2≦W2.

This is because that the electric circuit devices 200, 200A even with length L2 and width W2 in the overlap part 20 set at L2≦W2 can prevent the temperature rise in the electric element 100, thereby flowing a relatively large amount of DC current.

Although all the dielectric layers 1 to 5 are composed of the same dielectric material ($BaTiO_3$) in the above embodiment, the present invention is not limited to this. The dielectric layers 1 to 5 can be composed of different dielectric materials on an individual basis. Alternatively, the dielectric layers 1 to 5 can be put into two groups each composed of the same material, but the materials are different to each other. Typically the dielectric layers 1 to 5 may be composed of one or more kinds of dielectric materials. Any dielectric material for forming the dielectric layers 1 to preferably has the relative permittivities of 3000 or more.

In addition to $BaTiO_3$, the dielectric layers may be composed of $Ba(Ti, Sn)O_3$, $Bi_4Ti_3O_{12}$, $(Ba, Sr, Ca)TiO_3$, $(Ba, Ca)(Zr, Ti)O_3$, $(Ba, Sr, Ca)(Zr, Ti)O_3$, $SrTiO_3$, $CaTiO_3$, $PbTiO_3$, $Pb(Zn, Nb)O_3$, $Pb(Fe, W)O_3$, $Pb(Fe, Nb)O_3$, $Pb(Mg, Nb)O_3$, $Pb(Ni, W)O_3$, $Pb(Mg, W)O_3$, $Pb(Zr, Ti)O_3$, $Pb(Li, Fe, W)O_3$, $Pb_5Ge_3O_{11}$ and $CaZrO_3$, and so forth.

Although the anode electrodes 10A, 10B, conductive plates 11, 12, 21 to 23, side cathode electrodes 20A, 20B, 20C, 20D and cathode electrodes 20E, 20F are composed of nickel (Ni) in the above embodiment, the present invention is not limited to this. The anode electrodes 10A, 10B, conductive plates 11, 12, 21 to 23, side cathode electrodes 20A, 20B, 20C, 20D and cathode electrodes 20E, 20F can be composed of any of silver (Ag), palladium (Pd), silver-palladium alloy (Ag—Pd), platinum (Pt), gold (Au), copper (Cu), rubidium (Ru) and tungsten (W).

Although the electric circuit device 200 comprises the dielectric layers 1 to 5 in the above embodiment, the present invention is not limited to this. The electric circuit device 200 does not need to comprise the dielectric layers 1 to 5. Since magnetic interference could occur between the conductive plates 11, 12 and conductive plates 21 to 23 even without the dielectric layers 1 to 5, the aforementioned mechanism can reduce the impedance of the electric circuit device 200.

Although the number of the conductive plates to be connected to the anode electrodes 10A, 10B is two (i.e. conductive plates 11, 12), while the number of the conductive plates to be connected to the cathode electrodes 20E, 20F is three (i.e. conductive plates 21, 22, 23) in the above embodiment, the present invention is not limited to this. The electric circuit devices 200, 200A can comprise n-number (n is a positive integer) of the conductive plates connected to the anode electrodes 10A, 10B and m-number (m is a positive integer) of the conductive plates connected to the cathode electrodes 20E, 20F. In this case, the electric circuit devices 200, 200A comprises j-number (j=m+n) of the dielectric layers. The magnetic interference to make the effective inductance small can be generated as long as there are at least one conductive plate connected to the anode electrodes 10A, 10B and at least one conductive plate connected to the cathode electrodes 20E, 20F.

In the present invention, the number of the conductive plates connected to the anode electrodes 10A, 10B and the number of the conductive plates connected to the cathode electrodes 20E, 20F are increased with an increase of the electric current flowing in the electric circuit devices 200, 200A. Since the conductive plates connected to the anode electrodes 10A, 10B and the conductive plates connected to the cathode electrodes 20E, 20F are connected between two anode electrodes (i.e. 10A and 10B), or between two cathode electrodes (i.e. 20E and 20F) in parallel, the addition of the conductive plates connected to the anode electrodes 10A, 10B and the conductive plates connected to the cathode electrodes 20E, 20F can increase the amount of electric current flowing in the electric circuit device 200.

In order to relatively reduce impedance of the electric element devices 200, 200A, the number of the conductive plates connected to the anode electrodes 10A, 10B and the number of the conductive plates connected to the cathode electrodes 20E, 20F are increased in the present invention. Because the addition of the conductive plates connected to the anode electrodes 10A, 10B and the conductive plates connected to the cathode electrodes 20E, 20F provides additional capacitors to be connected in parallel, thereby increasing the effective capacitance of the electric circuit device 200, therefore lowering the impedance.

In order to set relatively low temperature in the electric circuit device 200, 200A, the number of the conductive plates connected to the anode electrodes 10A, 10B and the number of the conductive plates connected to the cathode electrodes 20E, 20F are increased in the present invention. Because the addition of the conductive plates connected to the anode electrodes 10A, 10B and the conductive plates connected to the cathode electrodes 20E, 20F, thereby relatively reducing each DC current flowing in the conductive plates connected to the anode electrodes 10A, 10B and the conductive plates connected to the cathode electrodes 20E, 20F, therefore reducing a heat generated in each of the conductive plates.

Although the conductive plates 11, 12 are placed parallel with the conductive plates 21 to 23 in the above embodiment, the present invention is not limited to this. The conductive plates 11, 12, 21 to 23 can be placed so that the distance between the conductive plates 11, 12 and the conductive plates 21 to 23 varies along the longitudinal direction DR1.

Although the conductive plates 210, 220 are composed of Cu, the present invention is not limited to this. The conductive plates 210, 220 can be composed of metallic bulk (thicker metallic plate than conductive plate 11, 12, 21 to 23) such as silver (Ag), gold (Au), aluminum (Al), and nickel (Ni).

Although the conductive plates 210, 220 have a thicker thickness than the conductive plates 11, 12, 21 to 23, the present invention is not limited to this. The conductive plates 210, 220 can have a lower resistance than the conductive plates 11, 12, 21 to 23. This is because the lower resistance than the conductive plates 11, 12, 21 to 23 allows the DC current to mainly flow in the conductive plates 210, 220, thereby preventing the temperature rise in the electric element 100.

Additionally, surfaces of the conductive plates 210, 220 can be in the form of concavity and convexity. In this case, the concavo-convex form consists of various cross-sectional forms such as wave type, triangular wave type, and rectangle.

This is because the concavo-convex form on surfaces of the conductive plates 210, 220 can increase surface area of the conductive plates 210, 220 and relatively increase an amount of heat radiating into air, thereby preventing the temperature rise of the electric circuit devices 200, 200A.

Although the electric circuit devices 200, 200A comprise the two conductive plates 210, 220, the present invention is not limited to this. The electric circuit devices 200, 200A can comprise at lease one of the two conductive plates 210, 220. In this case, at least one of the heat radiation members 230, 240 to the conductive plate placed on the electric element 100 is used for the electric circuit devices 200A.

Although the electric circuit devices 200, 200A are connected to the CPU 110 in the above embodiment, the present invention is not limited to this. The electric circuit devices 200, 200A can be connected to electrical load circuit in any way as long as the electrical load circuit operates at a predetermined frequency.

Although the electric circuit devices 200, 200A are used as a noise filter for confining the unwanted high-frequency current produced by the CPU 110 within the vicinity of the CPU 110 in the above embodiment, the present invention is not limited to this. Since the electric circuit devices 200, 200A include four capacitors connected in parallel as discussed above, the electric circuit devices 200, 200A also can be used as a capacitor.

More concretely, the electric circuit devices 200, 200A can be used in notebook computers, CD-RW/DVD recorders and players, game machines, information appliances, digital cameras, in-vehicle electric equipment, in-vehicle digital equipment, MPU peripheral circuitry and DC/DC converters and so forth.

Electric circuit device that are adopted in notebook computers and CD-RW/DVD recorders and players as a capacitor, but function as a noise filter, arranged between the power source 90 and the CPU 110, for confining the unwanted high-frequency current produced by the CPU 110 within the vicinity of the CPU 110 are grouped with the electric circuit devices 200, 200A of the present invention.

In the present invention, at least one of the conductive plates 210, 220 constitute "a first conductor", the conductive plates 11, 12 constitute "a second conductor", and the conductive plates 21 to 23 constitute "a third conductor".

A part connected to between the anode electrodes 10A and 10B of the conductive plate 210 constitutes "a flat plate part", while a part connected between the cathode electrodes 20E and 20F of the conductive plate 220 constitutes "a flat plate part".

The anode electrode 10A constitutes "a first external electrode", while the anode electrode 10B constitutes "a second external electrode".

The cathode electrode 20E constitutes "a first external electrode" or "a third external electrode", while the cathode electrode 20F constitutes "a second external electrode" or "a fourth external electrode".

The heat radiation member 230 constitutes "a first heat radiation member", while the heat radiation member 240 constitutes "a second heat radiation member".

The Second Embodiment

Figure 19:
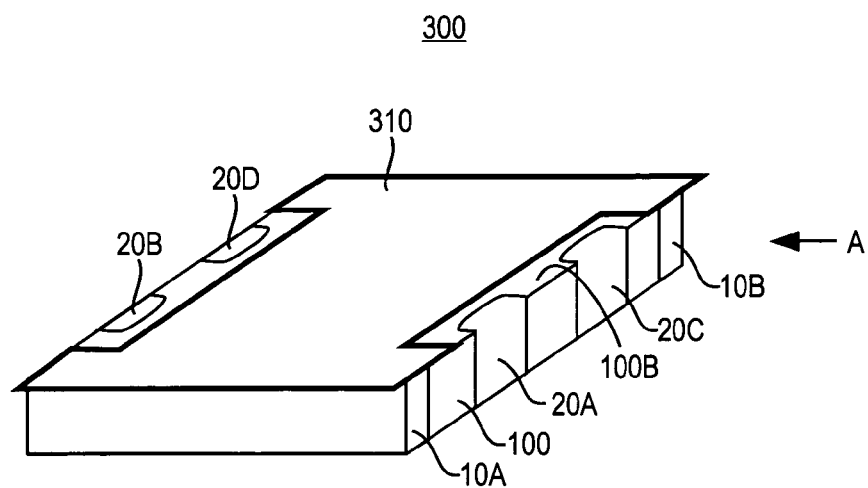
FIG. 19 is a perspective view of the electric circuit device according to the second embodiment.

FIG. 19 is a perspective view of the electric circuit device according to the second embodiment. Referring to FIG. 19, an electric circuit device 300 of the second embodiment includes a conductive plate 310 instead of the conductive plate 210 of the electric circuit device 200 shown in FIG. 1 and the same components as those of the electric circuit device 200. In the electric element 100 of the electric circuit device 300, the conductive plate 23 is omitted. The side cathode electrodes 20A, 20B, 20C, 20D are partially disposed on the top face 100B of the electric element 100. Each of the anode electrodes 10A, 10B has a thickness in a range between 30 μm to 50 μm.

The conductive plate 310 is composed of cooper foil and is in the form of a flat plate. The conductive plate 310 is placed on the top face 100B of the electric element 100, and has one end connected with the anode electrode 10A and the other end connected with the anode electrode 10B.

The conductive plate 310 is not placed so as to cover the anode electrodes 10A, 10B such as the conductive plate 210 shown in FIG. 1, but is thus placed on a principal surface of the electric element 100 (top face 100B) so as to partially connect to the anode electrodes 10A, 10B.

Figure 20:
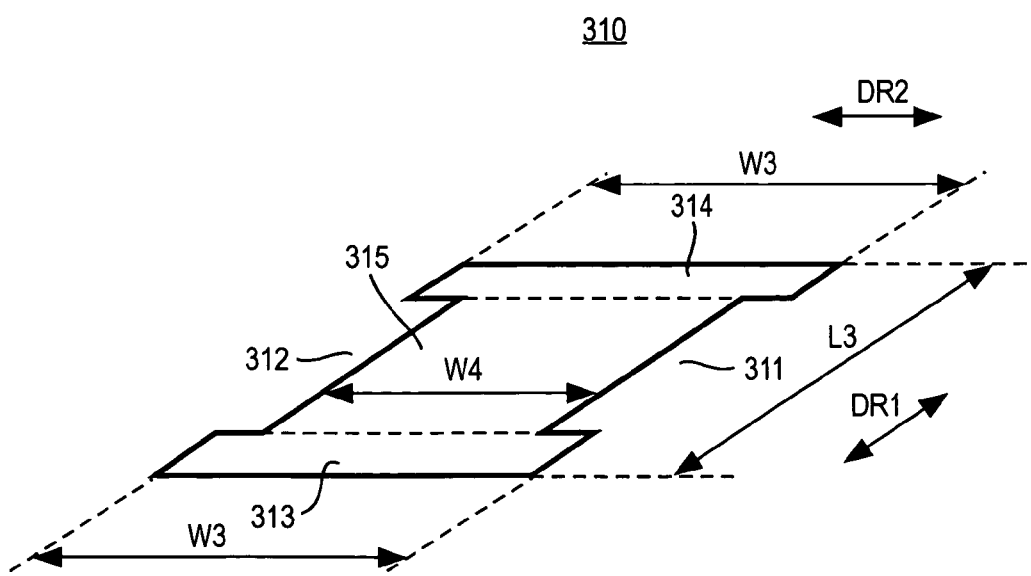
FIG. 20 is a perspective view showing the conductive plate shown in FIG. 19.

FIG. 20 is a perspective view showing the conductive plate 310 shown in FIG. 19. Referring to FIG. 20, the conductive plate 310 has cut-away sections 311, 312. The conductive plate 310 therefore comprises wide parts 313, 314 and narrow part 315. The narrow part 315 is disposed between the wide part 313 and the wide part 314.

The cut-away section 311 is so arranged that the side cathode electrodes 20A, 20C are partially disposed on the principal surface of the electric element 100 (top face 100B), while the cut-away section 312 is so arranged that the side cathode electrodes 20B, 20D are partially disposed on the principal surface of the electric element 100 (top face 100B).

The conductive plate 310 has length L3 along the direction DR1, which is the direction of a current flowing in the conductive plates 11, 12 of the electric element 100. The length L3 is longer than length of the electric element 100 along the direction DR1.

The wide parts 313, 314 of the conductive plate 310 have width W3 along the direction DR2 perpendicular to the direction DR1, while the narrow part 315 of the conductive plate 310 has width W4. Width W3 has same width as the electric element 100 along the direction DR2. Width W4 is shorter than width W3. In this case, the width W3 and width W4 are set, for example, at 5 mm and 3 mm, respectively.

Figure 21:
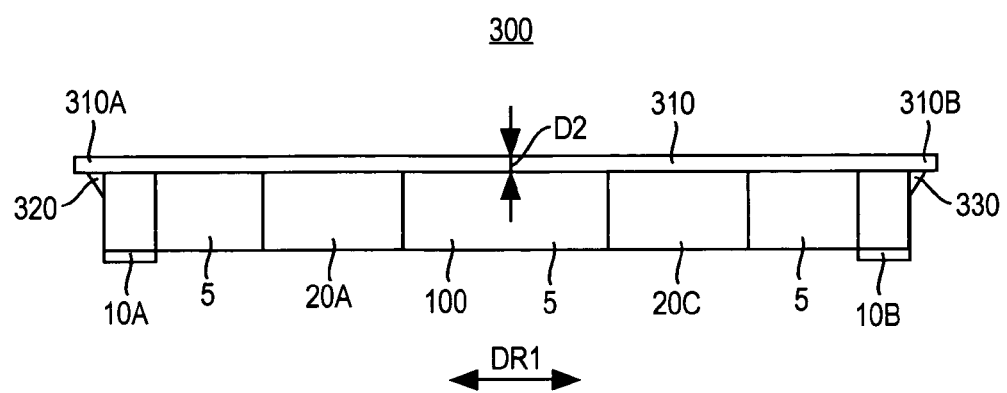
FIG. 21 is a side view of the electric circuit device viewed from direction A shown in FIG. 19.

FIG. 21 is a side view of the electric circuit device 300 viewed from direction A shown in FIG. 19. Referring to FIG. 21, the electric circuit device 300 further includes solders 320, 330. The conductive plate 310 is placed on the anode electrodes 10A, 10B and the dielectric layer 5 so as to abut on the anode electrodes 10A, 10B and the dielectric layer 5 of the electric element 100. The conductive plate 310 has a thickness of D2. The thickness D2 is set, for example, at 0.2 mm.

The solder 320 is disposed so as to abut on a stick-out part 310A of the conductive plate 310 stuck out from the electric element 100 along the direction DR1 and a part disposed in a thickness direction of the electric element 100 (in the direction approximately perpendicular to the conductive plates 11, 12) of the anode electrode 10A, thereby electrically connecting the conductive plate 310 to the anode electrode 10A.

The solder 330 is disposed so as to abut on a stick-out part 310B of the conductive plate 310 stuck out from the electric element 100 along the direction DR1 and a part disposed in a thickness direction of the electric element 100 (in the direction approximately perpendicular to the conductive plates 11, 12) of the anode electrode 10B, thereby electrically connecting the conductive plate 310 to the anode electrode 10B.

FIGS. 22A to 22C and FIGS. 23A, 23B are respectively the first and the second process drawings for describing a fabricating method of the electric circuit device 300 shown in FIG. 19. When the electric circuit device 300 is fabricated, the electric element 100 is fabricated according to the processes (a) to (e) shown in FIGS. 6A to 6C and FIGS. 7A, 7B, and then soldering pastes 340, 350 are respectively applied on the inside of the anode electrode 10A and the anode electrode 10B on the top face 100B of the electric element 100 (see FIG. 22A). In this case, the soldering pastes 340, 350 are applied, for example, by roller printing. The roller printing is to respectively apply the soldering pastes 340, 350 on the inside of the anode electrodes 10A, 10B by a method that applies soldering paste at both ends of roller, which length is equivalent to distance from the anode electrode 10A to the anode electrode 10B, and rotates the roller with soldering paste to the direction DR2 on the dielectric layer 5.

Figure 22A:
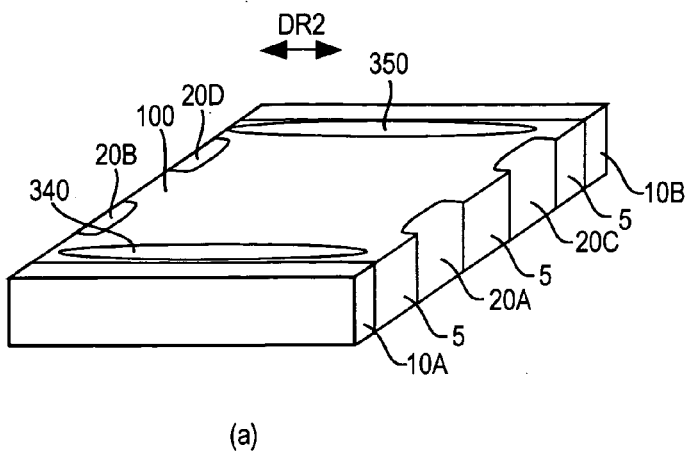
FIGS. 22A to 22C are the first process drawings for describing a fabricating method of the electric circuit device shown in FIG. 19.
Figure 22B:
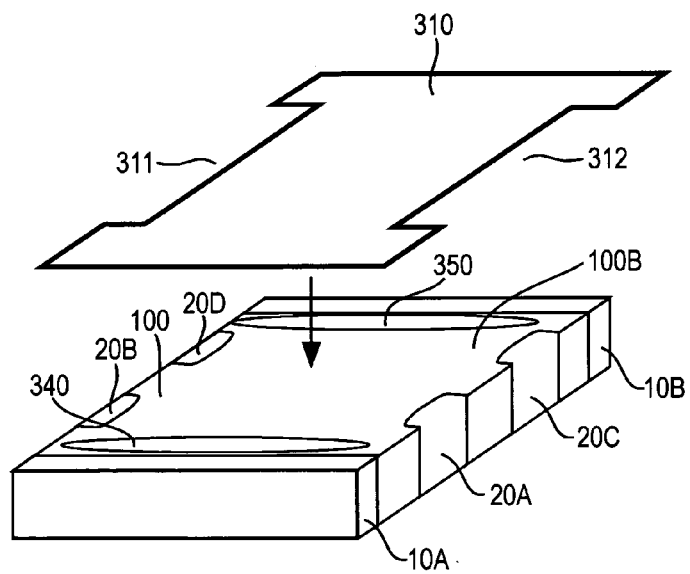

Subsequently, the conductive plate 310 with the cut-away sections 311, 312 is fabricated, then the fabricated conductive plate 310 is disposed on the anode electrodes 10A, 10B and the soldering pastes 340, 350 from the top face 100B of the electric element 100 (see FIG. 22B).

Figure 22C:
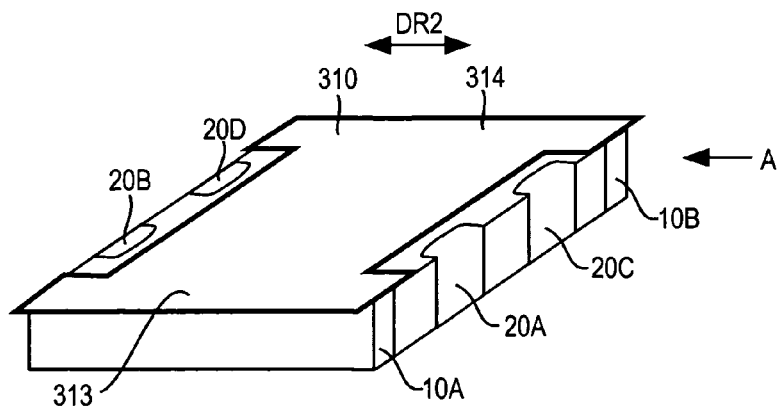

In this case, the conductive plate 310 is placed on the anode electrodes 10A, 10B and the soldering pastes 340, 350 so that the side cathode electrodes 20A, 20C are disposed on the cut-away section 311, the side cathode electrodes 20B, 20D are disposed on the cut-away section 312, and the both ends of the wide parts 313, 314 fit to the both ends of the width direction (direction DR2) of the electric element 100 (see FIG. 22C).

With the conductive plate 310 placed on the anode electrodes 10A, 10B and the soldering pastes 340, 350, a side view from direction A shown in FIG. 22C is shown in FIG.

Figure 23A:
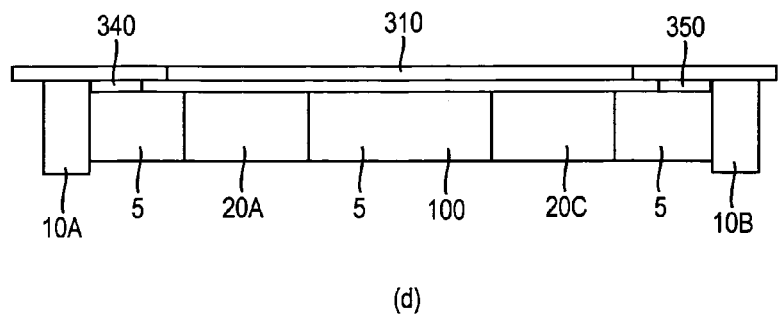
FIGS. 23A and 23B are the second process drawings for describing a fabricating method of the electric circuit device shown in FIG. 19.

23B. Referring to FIG. 23A, the soldering paste 340 is disposed on the inside of the anode electrode 10A (in FIG. 23A, more right side than the anode electrode 10A), while the soldering paste 350 is disposed on the inside of the anode electrode 10B (in FIG. 23A, more left side than the anode electrode 10B). The conductive plate 310 is then placed so as to abut on the anode electrodes 10A, 10B and the soldering pastes 340, 350.

Figure 23B:
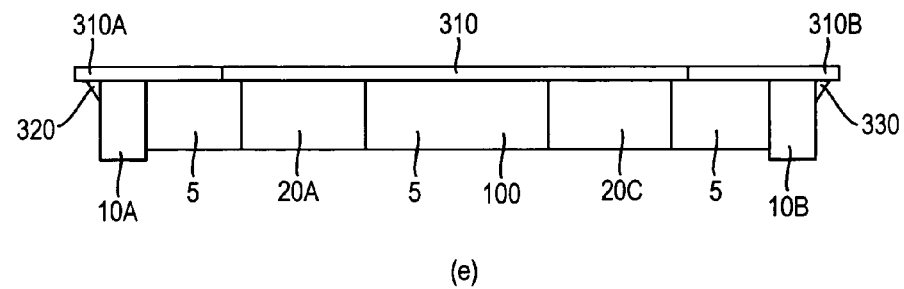

Subsequently, the reflow of the soldering pastes 340, 350 allows the soldering paste 340 to move to the outside of the anode electrode 10A (in FIG. 23B, left side of the anode electrode 10A) and the soldering paste 350 to move to the outside of the anode electrode 10B (in FIG. 23B, right side of the anode electrode 10A). The solder 320 is then formed at crossing point of the stick-out part 310A of the conductive plate 310 and the anode electrode 10B, while the solder 330 is formed at crossing point of the stick-out part 310B of the conductive plate 310 and the anode electrode 10B.

In this configuration, the conductive plate 310 abuts on the anode electrodes 10A, 10B and the dielectric layer 5, the solder 320 electrically connects the stick-out part 310A of the conductive plate 310 to the anode electrode 10A, and the solder 330 electrically connects the stick-out part 310B of the conductive plate 310 to the anode electrode 10B (see FIG. 23B) in order to complete the electric circuit device 300.

Although interstices of 30 μm to 501 μm is formed between the conductive plate 310 and the dielectric layer 5 of the electric element 100 (see FIG. 23A) upon the placement of the conductive plate 310 on the anode electrodes 10A, 10B and the soldering pastes 340, 350, the conductive plate 310 has a thickness D2 of 0.2 mm. Therefore, the reflow of the soldering pastes 340, 350 allows the conductive plate 310 to abut on the dielectric layer 5.

In other words, although the reflow of the soldering pastes 340, 350 does not allow the conductive plate 310 which has a thickness of 0.3 mm to abut on the dielectric layer 5, the conductive plate 310, which thickness is set at 0.2 mm, can be curved to the thickness direction of the electric element, and the reflow of the soldering pastes 340, 350 allows the conductive plate 310 to abut on the dielectric layer 5.

The reflow of the soldering pastes 340, 350 does not allow the conductive plate 310 which has a thickness of 0.2 mm to abut on the dielectric layer 5, while the reflow of the soldering pastes 340, 350 allows the conductive plate 310 which has a thickness of 0.1 mm to 0.2 mm to abut on the dielectric layer 5.

In the second embodiment, therefore, the conductive plate 310 typically has a thickness D2 of 0.1 mm to 0.2 mm.

The electric circuit device 300 is connected between the power source 90 and the CPU 110 as well as the above-discussed electric circuit devices 200, 200A. With this configuration, the DC current I output from the positive terminal 91 of the power source 90 passes through the lead wire 121 to the anode electrode 10A of the electric circuit device 300, and then passes mostly the conductive plate 310 and the anode electrode 10B in this order and partially the conductive plates 11, 12 and the anode electrode 10B in this order inside the electric circuit device 300. The DC current I then passes from the anode electrode 10B to the CPU 110 through the lead wire 123 and the positive terminal 111.

This passage allows the DC current I to be supplied as a power source current to the CPU 110. The CPU 110 is driven with the DC current I and outputs a return current Ir, which has the same magnitude as the DC current I, from the negative terminal 112.

The return current Ir flows through the lead wire 124 to the cathode electrode 20F of the electric circuit device 300, and passes mostly the conductive plate 220 and the cathode electrode 20E in this order and partially the side cathode electrodes 20C, 20D, the conductive plates 21, 22, the side cathode electrodes 20A, 20B and the cathode electrode 20E in this order inside the electric circuit device 300. The return current Ir then flows from the cathode electrode 20E, through the lead wire 122 and negative terminal 92, to the power source 90.

As a result, the electric circuit device 300 can prevent the temperature rise in the electric element 100 with the impedance Zs of the electric element 100 maintained in low impedance as discussed above.

The CPU 110 is driven with the DC current I supplied from the power source 90 through the electric circuit device 300, and produces an unwanted high-frequency current. This unwanted high-frequency current leaks through the lead wires 123, 124 out to the electric circuit device 300. However, the low impedance Zs of the electric circuit device 300 as discussed above causes the unwanted high-frequency current to flow within circuitry made up of the electric circuit device 300 and CPU 110, thereby preventing the leakage from the electric circuit device 300 toward the power source 90.

Under circumstances where the operating frequency of the CPU 110 tends to shift toward high frequencies, it could be assumed that the CPU 110 is operated at approximately 1 GHz. In such a high operating frequency range, the electric circuit device 300 functions as a noise filter for confining the unwanted high-frequency current, which is produced by the CPU 110 operating at the high operating frequency, within the vicinity of the CPU 110 under the condition that impedance Zs of the electric circuit device 300 is determined mainly by the effective inductance L and the effective inductance L is significantly and relatively reduced as discussed above.

The electric circuit device 300 comprises the conductive plate 310 with cut-away sections 311, 312 so as to partially dispose the side cathode electrodes 20A, 20B, 20C, 20D of the electric element 100. Therefore, the electric circuit device 300 can electrically isolates the conductive plate 310 and the side cathode electrodes 20A, 20B, 20C, 20D, thereby radiating a heat produced in the electric element 100 from the conductive plate 310.

Additionally, the conductive plate 310 has the wide parts 313, 314. Therefore, four corner parts (both ends of the wide parts 313, 314) allow the conductive plate 310 to be easily positioned on the electric element 100.

Additionally, the soldering pastes 340, 350 are respectively on the inside of the anode electrodes 10A, 10B, therefore the roller printing allows the soldering pastes 340, 350 to be easily applied. As a result, a fabricating process which is good for workability can be created.

In the second embodiment, the side cathode electrodes 20A, 20B constitutes "a third external electrode", while the side cathode electrodes 20C, 20D constitutes "a fourth external electrode". The conductive plate 310 constitutes "a flat plate member". The solder 320 constitutes "a first solder member", while the solder 330 constitutes "a second solder member". As to the other structure, the second embodiment is the same as the first embodiment.

The Third Embodiment

Figure 24:
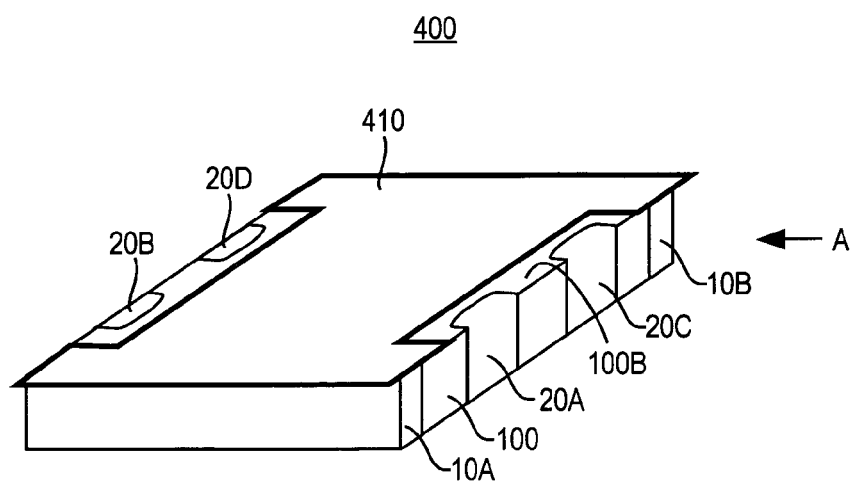
FIG. 24 is a perspective view of the electric circuit device according to the third embodiment.

FIG. 24 is a perspective view of the electric circuit device according to the third embodiment. Referring to FIG. 24, the electric circuit device 400 of the third embodiment includes conductive plate 410 instead of the conductive plate 310 of the electric circuit device 300 shown in FIG. 19. The other components are the same as those of the electric circuit device 300.

The conductive plate 410 is composed of cooper foil and is in the form of a flat plate. The conductive plate 410 is placed on the top face 100B of the electric element 100, and has one end connected with the anode electrode 10A and the other end connected with the anode electrode 10B.

The conductive plate 410 is thus not placed so as to cover the anode electrodes 10A, 10B such as the conductive plate 210 shown in FIG. 1, but is placed on a principal surface of the electric element 100 (top face 100B) so as to partially connect to the anode electrodes 10A, 10B.

Figure 25:
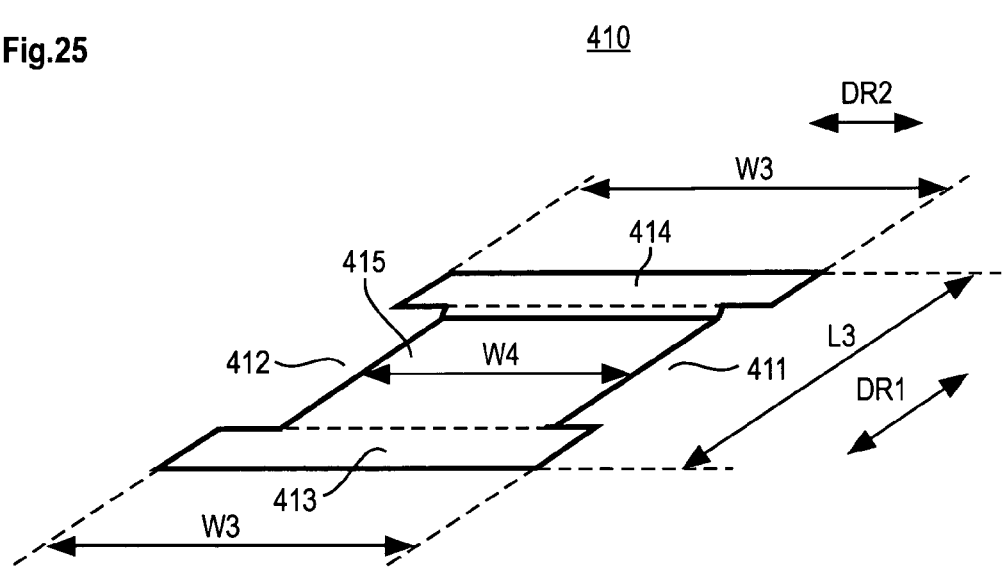
FIG. 25 is a perspective view of the conductive plate shown in FIG. 24.

FIG. 25 is a perspective view of the conductive plate 410 shown in FIG. 24. Referring to FIG. 25, the conductive plate 410 has cut-away sections 411, 412. The conductive plate 410 therefore comprises wide parts 413, 414 and narrow part 415. The wide parts 413, 414 are placed on a same plane. The narrow part 415 is disposed between the wide part 413 and the wide part 414 with a bump to the wide parts 413, 414. In this case, the bump between the wide parts 413, 414 and the narrow part 415 is 30 μm to 50 μm corresponding to the thickness of the anode electrodes 10A, 10B.

The cut-away section 411 is so arranged that the side cathode electrodes 20A, 20C are partially disposed on the principal surface of the electric element 100 (top face 100B), while the cut-away section 412 is so arranged that the side cathode electrodes 20B, 20D are partially disposed on the principal surface of the electric element 100 (top face 100B).

The conductive plate 410 has length L3 along the direction DR1, which is the direction of a current flowing in the conductive plates 11, 12 of the electric element 100. The length L3 is longer than length of the electric element 100 along the direction DR1.

The wide parts 413, 414 of the conductive plate 410 have width W3 along the direction DR2 perpendicular to the direction DR1, while the narrow part 415 of the conductive plate 410 has width W4.

Figure 26:
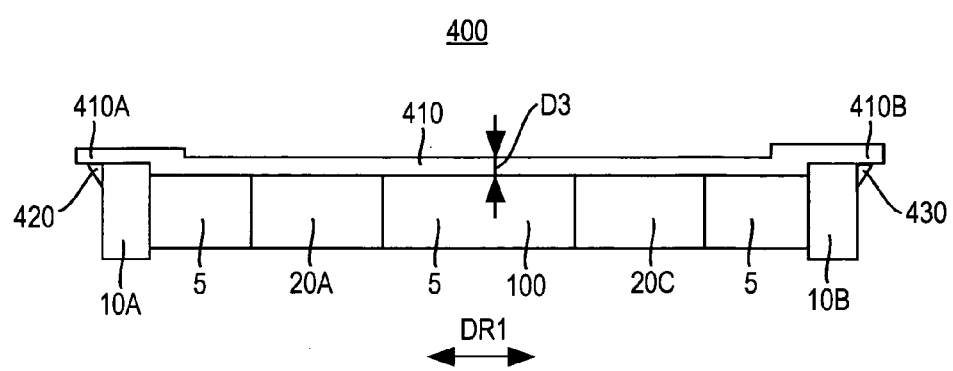
FIG. 26 is a side view of the electric circuit device viewed from direction A shown in FIG. 24.

FIG. 26 is a side view of the electric circuit device 400 viewed from direction A shown in FIG. 24. Referring to FIG. 26, the electric circuit device 400 further includes solders 420, 430. The conductive plate 410 is placed on the anode electrodes 10A, 10B and the dielectric layer 5 so as to abut on the anode electrodes 10A, 10B and the dielectric layer 5 of the electric element 100. The conductive plate 410 has a thickness of D3. The thickness D3 is set, for example, at 0.3 mm to 0.4 mm.

The solder 420 is disposed so as to abut on a stick-out part 410A of the conductive plate 410 stuck out from the electric element 100 along the direction DR1 and a part disposed in a thickness direction of the electric element 100 (in the direction approximately perpendicular to the conductive plates 11, 12) of the anode electrode 10A, thereby electrically connecting the conductive plate 410 to the anode electrode 10A.

The solder 430 is disposed so as to abut on a stick-out part 410B of the conductive plate 410 stuck out from the electric element 100 along the direction DR1 and a part disposed in a thickness direction of the electric element 100 (in the direction approximately perpendicular to the conductive plates 11, 12) of the anode electrode 10B, thereby electrically connecting the conductive plate 410 to the anode electrode 10B.

The electric circuit device 400 is fabricated according to the processes (a) to (e) shown in FIGS. 6A to 6C and FIGS. 7A, 7B and the process (a) to (e) shown in FIGS. 22A to 22C and FIGS. 23A, 23B. In this case, the conductive plate 410 with the bump is fabricated by press processing of copper foil which has a thickness D3 of 0.3 mm to 0.4 mm. The fabricated conductive plate 410 is then placed on the electric element 100 so as to abut on the anode electrodes 10A, 10B, soldering pastes 340, 350 and the dielectric layer 5.

Because the conductive plate 410 is formed by using cooper foil which has a thickness of 0.3 mm to 0.4 mm, the reflow of the soldering pastes 340, 350 does not allow the conductive plate 410 to abut on the dielectric layer 5, in case the bump is not arranged. Therefore, in the third embodiment, the cooper foil, which has a thickness of 0.3 mm to 0.4 mm, is pressed so as to have the bump, thereby fabricating the conductive plate 410 as shown in FIGS. 25, 26. As a result, even though thickness D3 is 0.3 mm to 0.4 mm, the conductive plate 410 can be abutted to the anode electrodes 10A, 10B and the dielectric layer 5.

The soldering pastes 340, 350, which are respectively disposed on the inside of the anode electrodes 10A, 10B, are respectively reflowed in the process (e) shown in FIG. 23 and moved to the outside of the anode electrodes 10A, 10B. Then, the solder 420 is formed at crossing point of stick-out part 410A of the conductive plate 410 and the anode electrode 10A, while the solder 430 is formed at crossing point of stick-out part 410B of the conductive plate 410 and the anode electrode 10B.

The electric circuit device 400 is connected between the power source 90 and the CPU 110 as well as the above-discussed electric circuit devices 200, 200A. In the electric circuit device 400 which has same mechanism as the electric circuit device 300, the impedance Zs is reduced to prevent the temperature rise in the electric element 100. The leakage of the unwanted high-frequency current generated in CPU 110 from the electric circuit device 400 toward the power source 90 is prevented. Additionally, the electric circuit device 400 functions as a noise filter for confining the unwanted high-frequency current, which is produced by the CPU 110 operating at the high operating frequency, within the vicinity of the CPU 110.

Because the electric circuit device 400 comprises the conductive plate 410 with the bump corresponding to the thickness of the anode electrodes 10A, 10B, even the conductive plate 410 has a thickness of 0.3 mm to 0.4 mm, the conductive plate 410 is placed to abut on the anode electrodes 10A, 10B of the electric element 100 and the dielectric layer 5, thereby radiating a heat produced in the electric element 100 from the conductive plate 410. As to the other structure, the electric circuit device 400 has the same effect as the electric circuit device 300.

In the third embodiment, the conductive plate 410 constitutes "a flat plate member", the wide part 413 constitutes "a first part", the wide part 414 constitutes "a second part", and the narrow part 415 constitutes "a third part". The solder 420 constitutes "a first soldering member", while the solder 430 constitutes "a second soldering member". As to the other structure, the third embodiment is the same as the second embodiment.

The Fourth Embodiment

Figure 27:
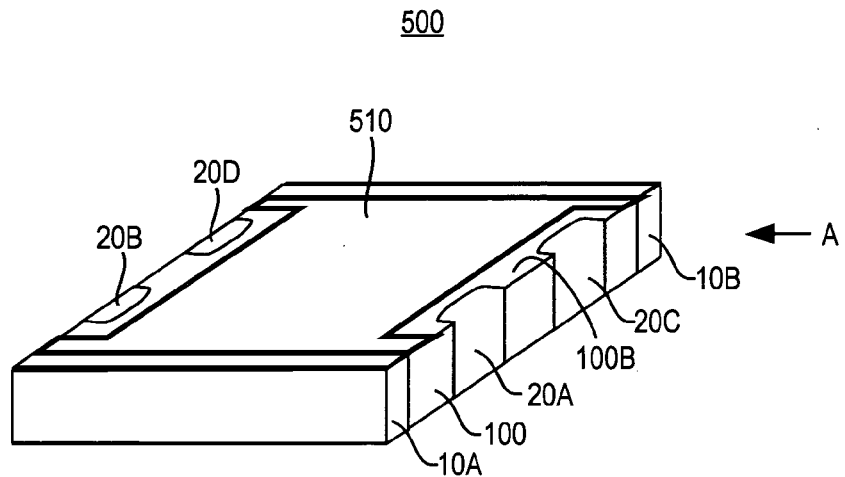
FIG. 27 is a perspective view of the electric circuit device according to the fourth embodiment.

FIG. 27 is a perspective view of the electric circuit device according to the fourth embodiment. Referring to FIG. 27, the electric circuit device 500 of the fourth embodiment includes conductive plate 510 instead of the conductive plate 310 of the electric circuit device 300 shown in FIG. 19. The other components are the same as those of the electric circuit device 300.

The conductive plate 510 is composed of cooper foil and is in the form of the flat plate. The conductive plate 510 is placed between the anode electrode 10A and the anode electrode 10B on the top face 100B of the electric element 100, and has one end connected with the anode electrode 10A and the other end connected with the anode electrode 10B.

The conductive plate 510 is not placed so as to cover the anode electrodes 10A, 10B such as the conductive plate 210 shown in FIG. 1, but is thus placed on a principal surface of the electric element 100 (top face 100B) so as to partially connect to the anode electrodes 10A, 10B.

Figure 28:
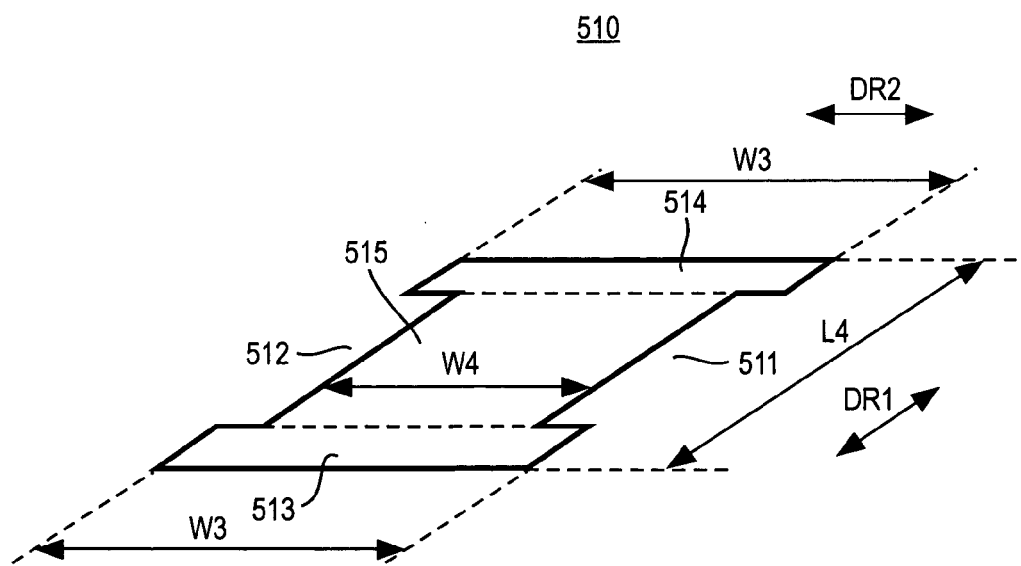
FIG. 28 is a perspective view of the conductive plate shown in FIG. 27.

FIG. 28 is a perspective view of the conductive plate 510 shown in FIG. 27. Referring to FIG. 28, the conductive plate 510 has cut-away sections 511, 512. As a result, the conductive plate 510 comprises wide parts 513, 514 and narrow part 515. The narrow part 515 is disposed between the wide part 513 and the wide part 514.

The cut-away section 511 is so arranged that the side cathode electrodes 20A, 20C are partially disposed on the principal surface of the electric element 100 (top face 100B), while the cut-away section 512 is so arranged that the side cathode electrodes 20B, 20D are partially disposed on the principal surface of the electric element 100 (top face 100B).

The conductive plate 510 has length L4 along the direction DR1, which is the direction of a current flowing in the conductive plates 11, 12 of the electric element 100. The length L4 is same as a distance between the anode electrode 10A and the anode electrode 10B along the direction DR1.

Additionally, the wide parts 513, 514 of the conductive plate 510 have width W3 along the direction DR2 perpendicular to the direction DR1, while the narrow part 515 of the conductive plate 510 has width W4.

Figure 29:
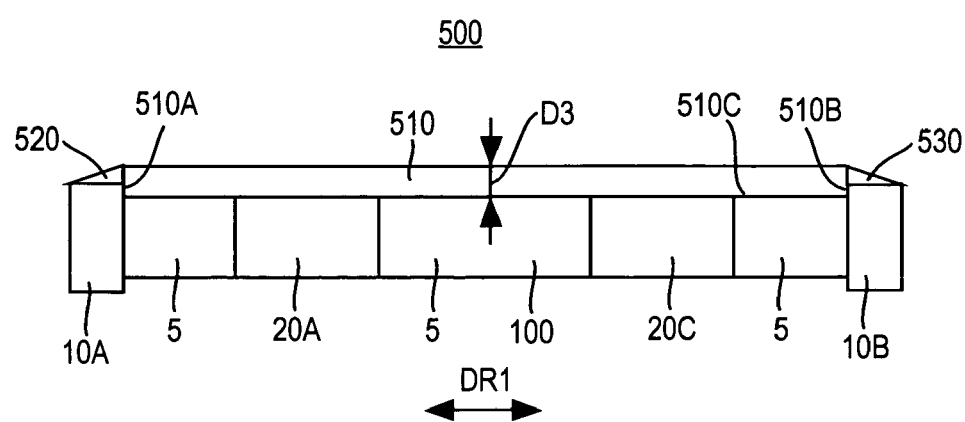
FIG. 29 is a side view of the electric circuit device viewed from direction A shown in FIG. 27.

FIG. 29 is a side view of the electric circuit device 500 viewed from direction A shown in FIG. 27. Referring to FIG. 29, the electric circuit device 500 further includes solders 520, 530. The conductive plate 510 is placed so that a cross-sectional surface 510A at one end is abutted on the anode electrode 10A of the electric element 100, a cross-sectional surface 510B at other end is abutted on the anode electrode 10B of the electric element 100, and a bottom face 510C is abutted on the dielectric layer 5. The conductive plate 510 has a thickness D3. Accordingly, the conductive plate 510 has a thickness which is thicker than the anode electrodes 10A, 10B.

The solder 520 is disposed so as to abut on the anode electrode 10A and the cross-sectional surface 510A at one end of the conductive plate 510, thereby electrically connecting the conductive plate 510 to the anode electrode 10A. The solder 530 is disposed so as to abut on the anode electrode 10B and the cross-sectional surface 510B at other end of the conductive plate 510, thereby electrically connecting the conductive plate 510 to the anode electrode 10B.

The electric circuit device 500 is fabricated according to the processes (a) to (e) shown in FIGS. 6A to 6C and FIGS. 7A, 7B and the process (a) to (e) shown in FIGS. 22A to 22C and FIGS. 23A, 23B. In this case, the soldering pastes 340, 350, which are respectively disposed on the inside of the anode electrodes 10A, 10B, are respectively reflowed in the process (e) shown in FIG. 23 and moved to the outside of the anode electrodes 10A, 10B. Then, the solder 520 is formed at concave portion of the anode electrode 10A and the conductive plate 510, while the solder 530 is formed at concave portion of the anode electrode 10B and the conductive plate 510.

The electric circuit device 500 is connected between the power source 90 and the CPU 110 as well as the above-discussed electric circuit devices 200, 200A. In the electric circuit device 500 which has same mechanism as the electric circuit device 300, the impedance Zs is reduced to prevent the temperature rise in the electric element 100. The leakage of the unwanted high-frequency current generated in CPU 110 from the electric circuit device 500 toward the power source 90 is prevented. Additionally, the electric circuit device 500 functions as a noise filter for confining the unwanted high-frequency current, which is produced by the CPU 110 operating at the high operating frequency, within the vicinity of the CPU 110.

Even the conductive plate 510 consisting of cooper foil which is thicker than 0.2 mm, the conductive plate 510 can be placed so as to abut on the dielectric layer 5, thereby radiating a heat produced in the electric element 100. As to the other structure, the electric circuit device 500 has the same effect as the electric circuit device 300.

In the fourth embodiment, the conductive plate 510 constitutes "a flat plate member". The solder 520 constitutes "a first solder member", while the solder 530 constitutes "a second solder member". As to the other structure, the fourth embodiment is the same as the second and third embodiments.

The Fifth Embodiment

Figure 30:
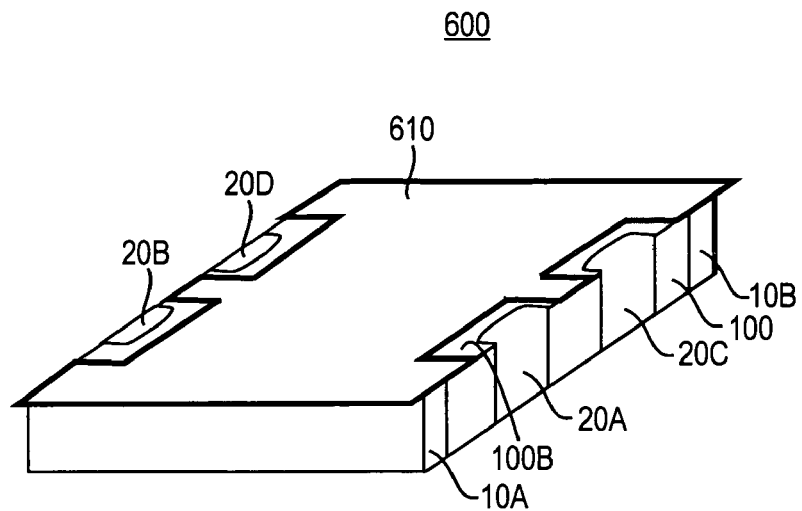
FIG. 30 is a perspective view of the electric circuit device according to the fifth embodiment.

FIG. 30 is a perspective view of the electric circuit device according to the fifth embodiment. Referring to FIG. 30, the electric circuit device 600 of the fifth embodiment includes a conductive plate 610 instead of the conductive plate 310 of the electric circuit device 300 shown in FIG. 19. The other components are the same as those of the electric circuit device 300.

The conductive plate 610 is composed of cooper foil and is in the form of flat plate. The conductive plate 610 is placed on the top face 100B of the electric element 100, and has one end connected with the anode electrode 10A and the other end connected with the anode electrode 10B.

The conductive plate 610 is not placed so as to cover the anode electrodes 10A, 10B such as the conductive plate 210 shown in FIG. 1, but is thus placed on a principal surface of the electric element 100 (top face 100B) so as to partially connect to the anode electrodes 10A, 10B.

Figure 31:
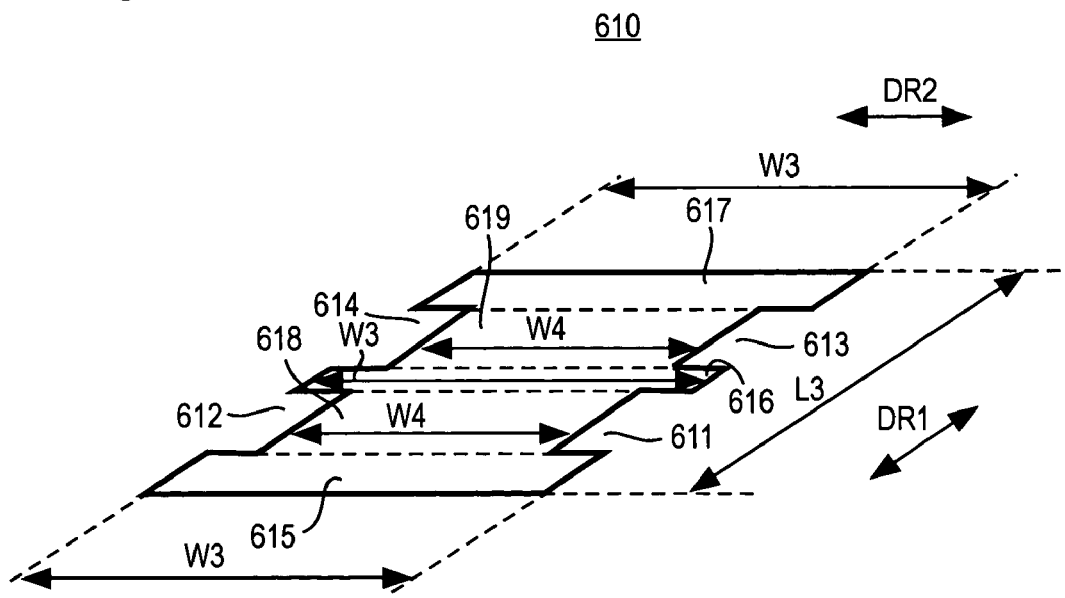
FIG. 31 is a perspective view of the conductive plate shown in FIG. 30.

FIG. 31 is a perspective view of the conductive plate 610 shown in FIG. 30. Referring to FIG. 31, the conductive plate 610 has cut-away sections 611 to 614. As a result, the conductive plate 610 comprises wide parts 615 to 617 and narrow parts 618, 619. The narrow part 618 is disposed between the wide part 615 and the wide part 616, while the narrow part 619 is disposed between the wide part 616 and the wide part 617.

The cut-away section 611 is so arranged that the side cathode electrode 20A is partially disposed on the principal surface of the electric element 100 (top face 100B), the cut-away section 612 is so arranged that the side cathode electrode 20B is partially disposed on the principal surface of the electric element 100 (top face 100B), the cut-away section 613 is so arranged that the side cathode electrode 20C is partially disposed on the principal surface of the electric element 100 (top face 100B), and the cut-away section 614 is so arranged that the side cathode electrode 20D is partially disposed on the principal surface of the electric element 100 (top face 100B).

The conductive plate 610 has length L3 along the direction DR1, which is the direction of a current flowing in the conductive plates 11, 12 of the electric element 100.

The wide parts 615 to 617 of the conductive plate 610 have width W3 along the direction DR2 perpendicular to the direction DR1, while the narrow parts 618, 619 of the conductive plate 610 have width W4.

The electric circuit device 600 is fabricated according to the processes (a) to (e) shown in FIGS. 6A to 6C and FIGS. 7A, 7B and the processes (a) to (e) shown in FIGS. 22A to 22C and FIGS. 23A, 23B.

The electric circuit device 600 is connected between the power source 90 and the CPU 110 as well as the above-discussed electric circuit devices 200, 200A. In the electric circuit device 600 which has same mechanism as the electric circuit device 300, the impedance Zs is reduced to prevent the temperature rise in the electric element 100. The leakage of the unwanted high-frequency current generated in CPU 110 from the electric circuit device 600 toward the power source 90 is prevented. Additionally, the electric circuit device 600 functions as a noise filter for confining the unwanted high-frequency current, which is produced by the CPU 110 operating at the high operating frequency, within the vicinity of the CPU 110.

The conductive plate 610 has four cut-away sections 611 to 614 corresponding to the four side cathode electrodes 20A, 20B, 20C, 20D which are partially disposed on the principal surface of the electric element 100 (top face 100B). The four cut-away sections 611 to 614 allow the electric circuit device 600 to increase an abut area between the conductive plate 610 and the electric element 100, as compared with that of the electric circuit devices 300, 400, 500. As a result, the temperature rise in the electric element 100 of the electric circuit device 600 can be more prevented than the temperature rise in the electric element 100 of the electric circuit devices 300, 400, 500. As to the other structure, the electric circuit device 600 has the same effect as the electric circuit device 300.

In the fifth embodiment, the electric circuit device 400 can include a conductive plate, which has four cut-away sections for the four side cathode electrodes 20A, 20B, 20C, 20D which are partially disposed, instead of the conductive plate 410, while the electric circuit device 500 can include a conductive plate, which has four cut-away sections for the four side cathode electrodes 20A, 20B, 20C, 20D which are partially disposed, instead of the conductive plate 510.

In the fifth embodiment, the conductive plate 610 constitutes "a flat plate member". The cut-away sections 611,612 constitute "a first cut-away section", while the cut-away sections 613,614 constitute "a second cut-away section". As to the other structure, the fifth embodiment is the same as the second to fourth embodiments.

The Sixth Embodiment

Figure 32:
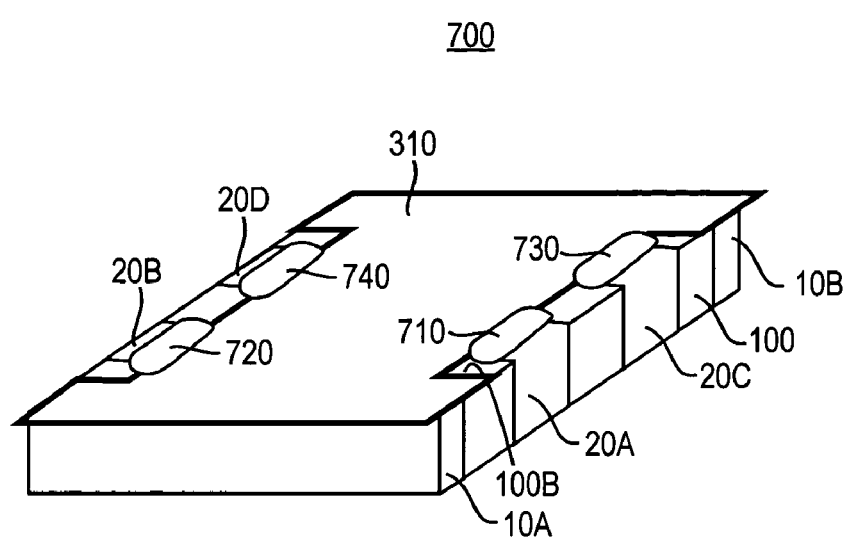
FIG. 32 is a perspective view of the electric circuit device according to the sixth embodiment.

FIG. 32 is a perspective view of the electric circuit device according to the sixth embodiment. Referring to FIG. 32, the electric circuit device 700 of the sixth embodiment includes adhesives 710, 720, 730, 740 and the same components as those of the electric circuit device 300 shown in FIG. 19.

The adhesives 710, 720, 730, 740 are composed of, for example, thermoset adhesive. The adhesive 710 is disposed between the conductive plate 310 and the side cathode electrode 20A so as to partially cover the conductive plate 310 and the side cathode electrode 20A, the adhesive 720 is disposed between the conductive plate 310 and the side cathode electrode 20B so as to partially cover the conductive plate 310 and the side cathode electrode 20B, the adhesive 730 is disposed between the conductive plate 310 and the side cathode electrode 20C so as to partially cover the conductive plate 310 and the side cathode electrode 20C, and the adhesive 740 is disposed between the conductive plate 310 and the side cathode electrode 20D so as to partially cover the conductive plate 310 and the side cathode electrode 20D.

The electric element 700 is fabricated in the following method. After the electric circuit device 300 is fabricated according to the processes (a) to (e) shown in FIGS. 6A to 6C and FIGS. 7A, 7B and the processes (a) to (e) shown in FIGS. 22A to 22C and FIGS. 23A, 23B, the adhesives 710, 720, 730, 740 are respectively applied between the conductive plate 310 and the side cathode electrode 20A, between the conductive plate 310 and the side cathode electrode 20B, between the conductive plate 310 and the side cathode electrode 20C, and between the conductive plate 310 and the side cathode electrode 20D. Then, the applied adhesives 710, 720, 730, 740 are heated to become hardened. Hereby, the electric circuit device 700 is completed.

In the sixth embodiment, the above-discussed electric circuit devices 400, 500, 600 can include the adhesives 710, 720, 730, 740 between the conductive plates 410, 510, and the side cathode electrodes 20A, 20B, 20C, 20D. In the electric circuit device 700, the conductive plate 310 is respectively connected to the anode electrodes 10A, 10B by solders 320, 330 (see FIG. 21), and the conductive plate 310 is connected to the electric element 100 by solders 710, 720, 730, 740. Therefore, the electric circuit device 700 can firmly fix the conductive plate 310, as compared with the electric circuit device 300.

The adhesives 710, 720, 730, 740 are respectively disposed between the conductive plate 310 and the side cathode electrodes 20A, 20B, 20C, 20D, thereby improving an electrical insulation properties of the conductive plate 310 and the side cathode electrodes 20A, 20B, 20C, 20D. As to the other structure, the electric circuit device 700 has the same effect as the electric circuit device 300.

In the sixth embodiment, the adhesives 710, 720 constitute "a first adhesive member", while the adhesives 730,740 constitute "a second adhesive member". As to the other structure, the sixth embodiment is the same as the second to fifth embodiments.

The Seventh Embodiment

Figure 33:
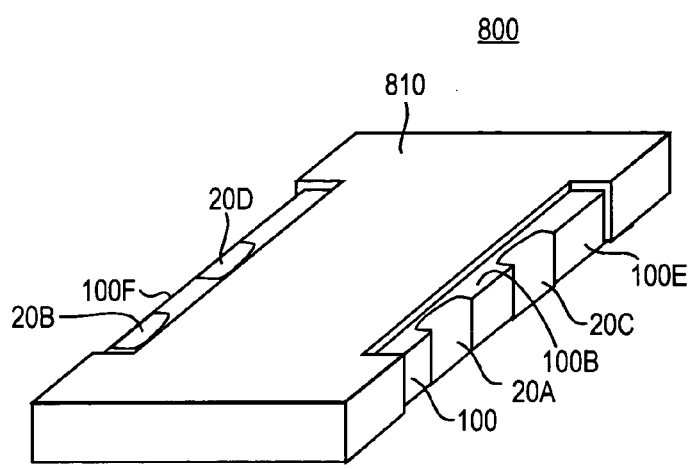
FIG. 33 is a perspective view of the electric circuit device according to the seventh embodiment.

FIG. 33 is a perspective view of the electric circuit device according to the seventh embodiment. Referring to FIG. 33, the electric circuit device 800 of the seventh embodiment includes a conductive plate 810 instead of the conductive plate 310 of the electric circuit device 300 shown in FIG. 19 and the same components as those of the electric circuit device 300.

The conductive plate 810 is composed of cooper foil and is placed so as to cover the anode electrodes 10A, 10B (not shown in FIG. 33) and the top face 100B of the electric element 100.

Figure 34:
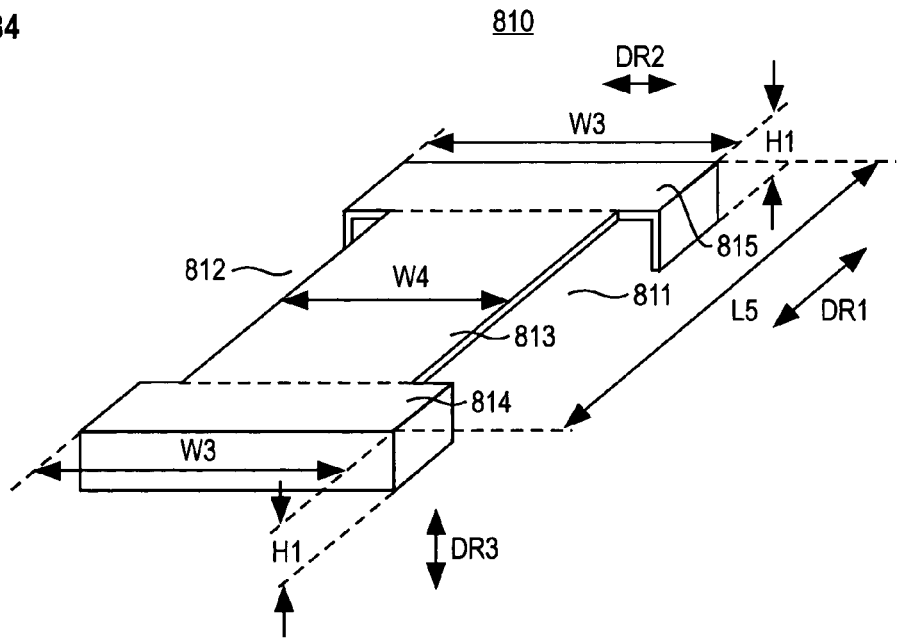
FIG. 34 is a perspective view of the conductive plate shown in FIG. 33.

FIG. 34 is a perspective view of the conductive plate 810 shown in FIG. 33. Referring to FIG. 34, the conductive plate 810 has cut-away sections 811, 812. As a result, the conductive plate 810 comprises a flat plate part 813 and box parts 814, 815. The flat plate part 813 is disposed between the box part 814 and the box part 815.

The cut-away section 811 is so arranged that the side cathode electrodes 20A, 20C are partially disposed on the principal surface of the electric element 100 (top face 100B), while the cut-away section 812 is so arranged that the side cathode electrodes 20B, 20D are partially disposed on the principal surface of the electric element 100 (top face 100B).

The conductive plate 810 has length L5 along the direction DR1, which is the direction of a current flowing in the conductive plates 11, 12 of the electric element 100. The length L5 is almost same as that of the electric element 100 along the direction DR1.

The flat plate part 813 of the conductive plate 810 has width W4 along the direction DR2 perpendicular to the direction DR1. The box parts 814, 815 of the conductive plate 810 have width W3 along the direction DR2 and height H1 along the direction DR3 perpendicular to the directions DR1, DR2. The height H1 is almost same as the thickness of the electric element 100.

The flat plate part 813 is disposed so as to abut on the top face 100B of the electric element 100. The box part 814 is disposed so as to abut on side face 10A, top face 100B, front face 100E and rear face 100F of the electric element 100, thereby being connected to the anode electrode 10A. The box part 815 is disposed so as to abut on top face 100B, side face 100D, front face 100E, and rear face 100F of the electric element 100, thereby being connected to the anode electrode 10B.

The electric circuit device 800 is fabricated according to the processes (a) to (e) shown in FIGS. 6A to 6C and FIGS. 7A, 7B and the processes (a) to (e) shown in FIGS. 22A to 22C and FIGS. 23A, 23B.

The electric circuit device 800 is connected between the power source 90 and the CPU 110 as well as the above-discussed electric circuit devices 200, 200A. In the electric circuit device 800 which has same mechanism as the electric circuit device 300, the impedance Zs is reduced to prevent the temperature rise in the electric element 100. The leakage of the unwanted high-frequency current generated in CPU 110 from the electric circuit device 800 toward the power source 90 is prevented. Additionally, the electric circuit device 800 functions as a noise filter for confining the unwanted high-frequency current, which is produced by the CPU 110 operating at the high operating frequency, within the vicinity of the CPU 110.

The electric circuit device 800 comprising the conductive plate 810, which is abutted on the side faces 100A, 100D, the top face 100B, a part of the front face 100E, and a part of the rear 100F of the electric element 100, can make the abut area between the electric element 100 and the conductive plate 810 larger than that between the electric element 100 and the conductive plate 310, thereby more increasing effect of heat radiation of the electric circuit device 800 than that of the electric circuit device 300. As to the other structure, the electric circuit device 800 has the same effect as the electric circuit device 300.

In the seventh embodiment, the adhesives 710, 720, 730, 740 can be arranged between the conductive plate 810 and the side cathode electrodes 20A to 20D.

In the seventh embodiment, the conductive plate 810 constitutes "a flat plate member". The cut-away section 811 constitutes "a first cut-away section", while the cut-away section 812 constitutes "a second cut-away section".

The Eighth Embodiment

Figure 35:
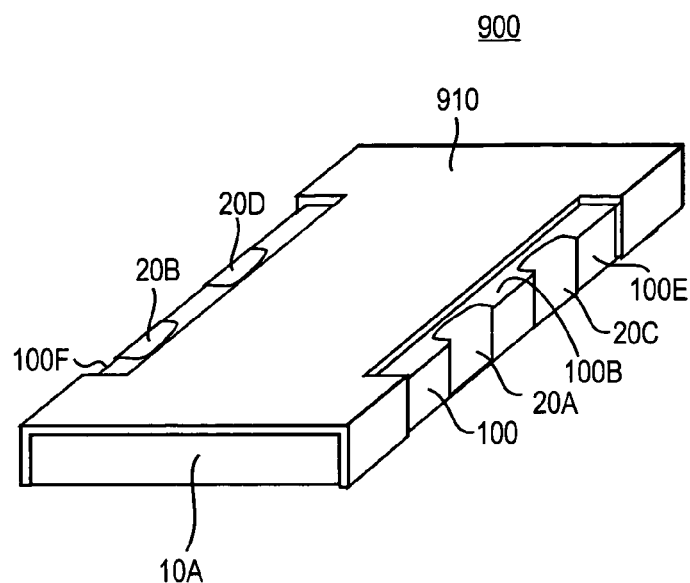
FIG. 35 is a perspective view of the electric circuit device according to the eighth embodiment.

FIG. 35 is a perspective view of the electric circuit device according to the eighth embodiment. Referring to FIG. 35, the electric circuit device 900 of the eighth embodiment includes a conductive plate 910 instead of the conductive plate 310 of the electric circuit device 300 shown in FIG. 19 and the same components as those of the electric circuit device 300.

The conductive plate 910 is composed of cooper foil and is placed so as to cover a part of the anode electrodes 10A, 10B and the top face 100B of the electric element 100.

Figure 36:
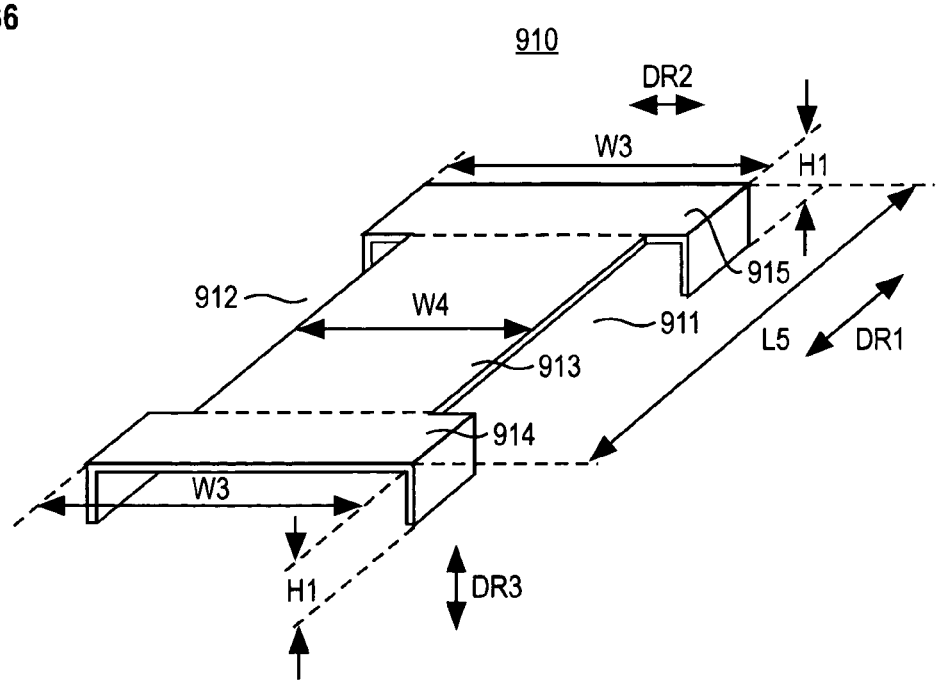
FIG. 36 is a perspective view of the conductive plate shown in FIG. 35.

FIG. 36 is a perspective view of the conductive plate 910 shown in FIG. 35. Referring to FIG. 36, the conductive plate 910 has cut-away sections 911, 912. As a result, the conductive plate 910 comprises a flat plate part 913 and surrounded parts 914, 915. The flat plate part 913 is disposed between the surrounded part 914 and the surrounded part 915.

The cut-away section 911 is so arranged that the side cathode electrodes 20A, 20C are partially disposed on the principal surface of the electric element 100 (top face 100B), while the cut-away section 912 is so arranged that the side cathode electrodes 20B, 20D are partially disposed on the principal surface of the electric element 100 (top face 100B).

The conductive plate 910 has length L5 along the direction DR1, which is the direction of a current flowing in the conductive plates 11, 12 of the electric element 100.

Additionally, the flat plate part 913 of the conductive plate 910 have width W4 along the direction DR2 perpendicular to the direction DR1. The surrounded parts 914, 915 of the conductive plate 910 have width W3 along the direction DR2 and height H1 along the direction DR3 perpendicular to the directions DR1, DR2. Height H1 is almost same as the thickness of the electric element 100.

The flat plate part 913 is disposed so as to abut on the top face 100B of the electric element 100. The surrounded part 914 is disposed so as to abut on the top face 100B, the front face 100E, and the rear face 100F of the electric element 100, thereby being connected to the anode electrode 10A. The surrounded part 915 is disposed so as to abut on the top face 100B, the front face 100E, and the rear face 100F of the electric element 100, thereby being connected to the anode electrode 10B.

The electric circuit device 900 is fabricated according to the processes (a) to (e) shown in FIGS. 6A to 6C and FIGS. 7A, 7B and the processes (a) to (e) shown in FIGS. 22A to 22C and FIGS. 23A, 23B.

The electric circuit device 900 is connected between the power source 90 and the CPU 110 as well as the above-discussed electric circuit devices 200, 200A. In the electric circuit device 900 which has same mechanism as the electric circuit device 300, the impedance Zs is reduced to prevent the temperature rise in the electric element 100. The leakage of the unwanted high-frequency current generated in CPU 110 from the electric circuit device 900 toward the power source 90 is prevented. Additionally, the electric circuit device 900 functions as a noise filter for confining the unwanted high-frequency current, which is produced by the CPU 110 operating at the high operating frequency, within the vicinity of the CPU 110.

The electric circuit device 900 comprising the conductive plate 910, which is abutted on the top face 100B, a part of the front face 100E, and a part of the rear 100F of the electric element 100, can make the abut area between the electric element 100 and the conductive plate 910 larger than that between the electric element 100 and the conductive plate 310, thereby more increasing effect of heat radiation of the electric circuit device 900 than that of the electric circuit device 300. As to the other structure, the electric circuit device 900 has the same effect as the electric circuit device 300.

In the eighth embodiment, the adhesives 710, 720, 730, 740 can be arranged between the conductive plate 910 and the side cathode electrodes 20A to 20D.

In the eighth embodiment, the conductive plate 910 constitutes "a flat plate member". The cut-away section 911 constitutes "a first cut-away section", while the cut-away section 912 constitutes "a second cut-away section".

The Ninth Embodiment

Figure 37:
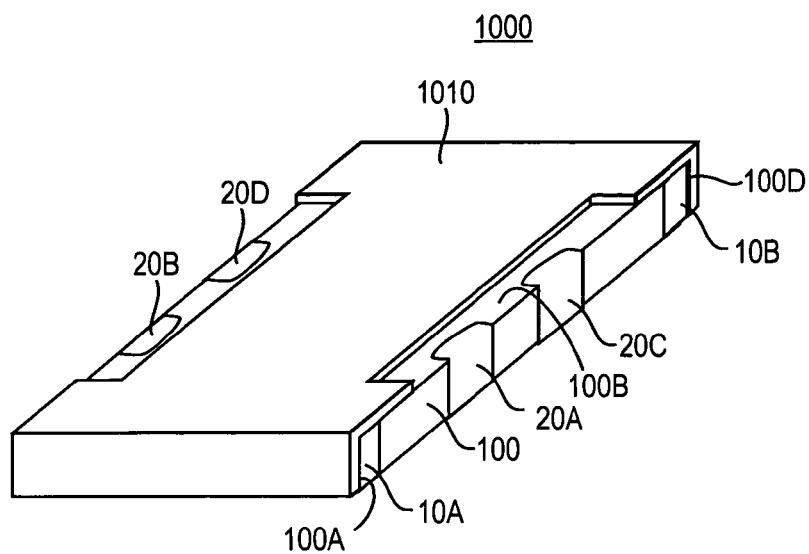
FIG. 37 is a perspective view of the electric circuit device according to the ninth embodiment.

FIG. 37 is a perspective view of the electric circuit device according to the ninth embodiment. Referring to FIG. 37, the electric circuit device 1000 of the ninth embodiment includes a conductive plate 1010 instead of the conductive plate 310 of the electric circuit device 300 shown in FIG. 19 and the same components as those of the electric circuit device 300.

The conductive plate 1010 is composed of cooper foil and is placed so as to cover a part of the anode electrodes 10A, 10B and the top face 100B of the electric element 100.

Figure 38:
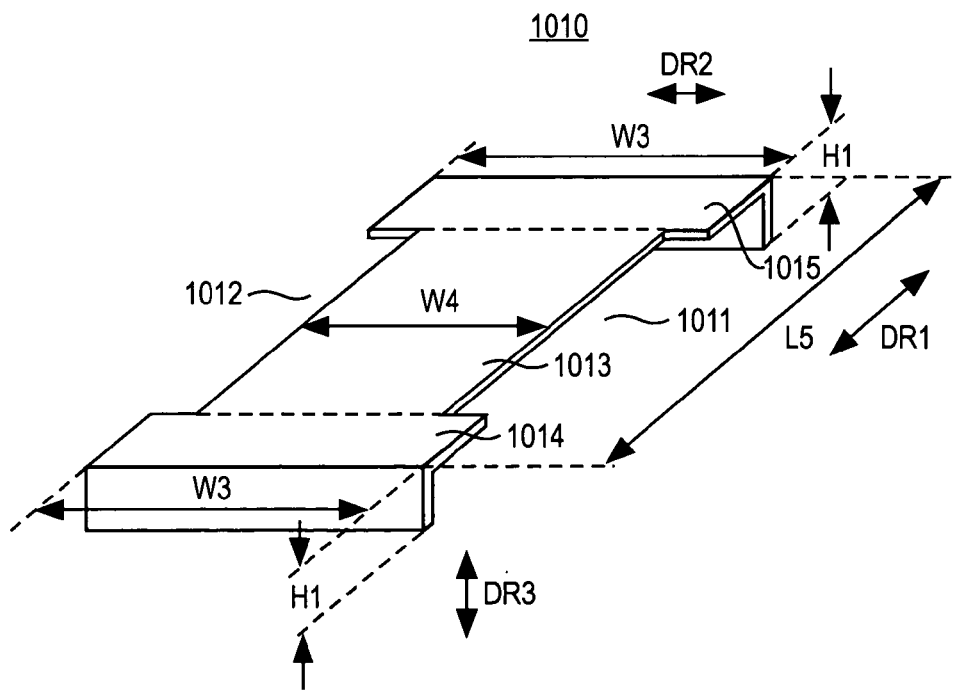
FIG. 38 is a perspective view of the conductive plate shown in FIG. 37.

FIG. 38 is a perspective view of the conductive plate 1010 shown in FIG. 37. Referring to FIG. 38, the conductive plate 1010 has cut-away sections 1011, 1012. As a result, the conductive plate 1010 comprises a flat plate part 1013 and corner parts 1014, 1015. The flat plate part 1013 is disposed between the corner part 1014 and the corner part 1015.

The cut-away section 1011 is so arranged that the side cathode electrodes 20A, 20C are partially disposed on the principal surface of the electric element 100 (top face 100B), while the cut-away section 1012 is so arranged that the side cathode electrodes 20B, 20D are partially disposed on the principal surface of the electric element 100 (top face 100B).

The conductive plate 1010 has length L5 along the direction DR1, which is the direction of a current flowing in the conductive plates 11, 12 of the electric element 100.

Additionally, the flat plate part 1013 of the conductive plate 1010 has width W4 along the direction DR2 perpendicular to the direction DR1. The corner parts 1014, 1015 of the conductive plate 1010 have width W3 along the direction DR2 and height H1 along the direction DR3 perpendicular to the directions DR1, DR2. Height H1 is almost same as the thickness of the electric element 100.

The flat plate part 1013 is disposed so as to abut on the top face 100B of the electric element 100. The corner part 1014 is disposed so as to abut on the top face 100B and the side face 100A of the electric element 100, thereby being connected to the anode electrode 10A. The corner part 1015 is disposed so as to abut on the top face 100B and the side face 100D of the electric element 100, thereby being connected to the anode electrode 10B.

The electric circuit device 1000 is fabricated according to the processes (a) to (e) shown in FIGS. 6A to 6C and FIGS. 7A, 7B and the processes (a) to (e) shown in FIGS. 22A to 22C and FIGS. 23A, 23B.

The electric circuit device 1000 is connected between the power source 90 and the CPU 110 as well as the above-discussed electric circuit devices 200, 200A. In the electric circuit device 1000 which has same mechanism as the electric circuit device 300, the impedance Zs is reduced to prevent the temperature rise in the electric element 100. The leakage of the unwanted high-frequency current generated in CPU 110 from the electric circuit device 1000 toward the power source 90 is prevented. Additionally, the electric circuit device 1000 functions as a noise filter for confining the unwanted high-frequency current, which is produced by the CPU 110 operating at the high operating frequency, within the vicinity of the CPU 110.

The electric circuit device 1000 comprising the conductive plate 1010, which is abutted on the top face 100B and the side faces 10A, 100D of the electric element 100 can make the abut area between the electric element 100 and the conductive plate 1010 larger than that between the electric element 100 and the conductive plate 310, thereby more increasing effect of heat radiation of the electric circuit device 1000 than that of the electric circuit device 300. As to the other structure, the electric circuit device 1000 has the same effect as the electric circuit device 300.

In the ninth embodiment, the adhesives 710, 720, 730, 740 can be arranged between the conductive plate 1010 and the side cathode electrodes 20A to 20D.

In the ninth embodiment, the conductive plate 1010 constitutes "a flat plate member". The cut-away section 1011 constitutes "a first cut-away section", while the cut-away section 1012 constitutes "a second cut-away section".

The Tenth Embodiment

Figure 39:
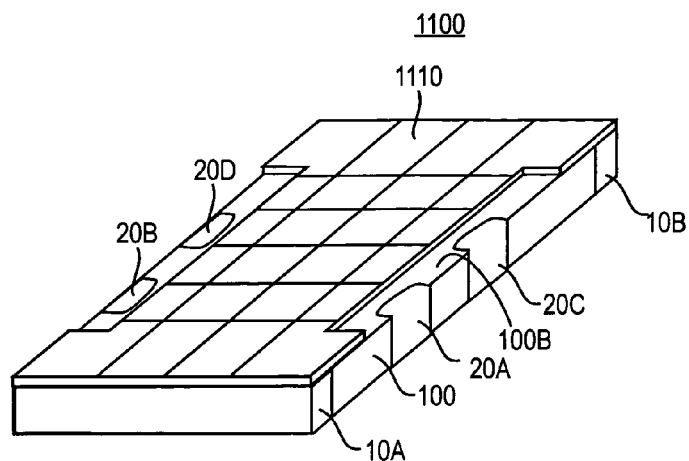
FIG. 39 is a perspective view of the electric circuit device according to the tenth embodiment.

FIG. 39 is a perspective view of the electric circuit device according to the tenth embodiment. Referring to FIG. 39, the electric circuit device 1100 of the tenth embodiment includes a conductive plate 1110 instead of the conductive plate 310 of the electric circuit device 300 shown in FIG. 19 and the same components as those of the electric circuit device 300. The conductive plate 1110 is composed of cooper foil and is placed so as to abut on the top face 100B of the electric element 100.

Figure 40:
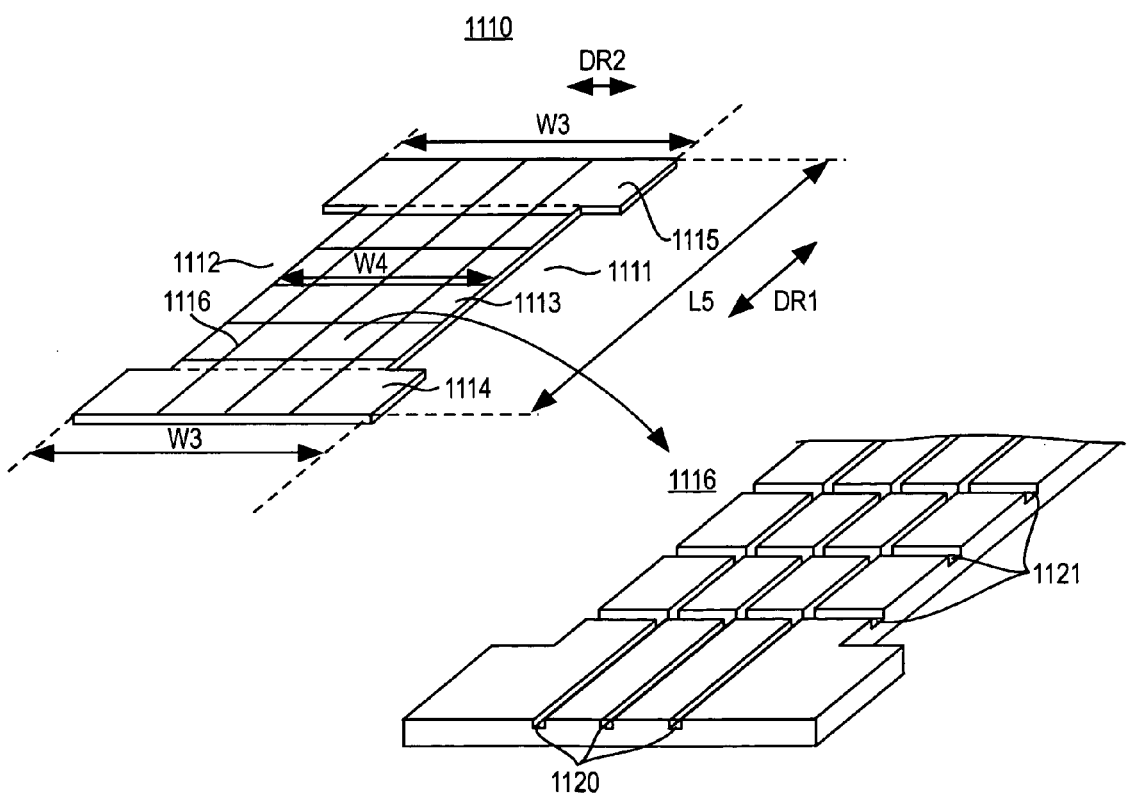
FIG. 40 is a perspective view of the conductive plate shown in FIG. 39.

FIG. 40 is a perspective view of the conductive plate 1110 shown in FIG. 39. Referring to FIG. 40, the conductive plate 1110 has cut-away sections 1111, 1112. As a result, the conductive plate 1110 comprises a narrow part 1113, wide parts 1114, 1115 and a groove portion 1116. The narrow part 1113 is disposed between the wide part 1114 and the wide part 1115. The groove portion is arranged on a grid on the narrow part 1113 and the wide parts 1114, 1115.

The cut-away section 1111 is so arranged that the side cathode electrodes 20A, 20C are partially disposed on the principal surface of the electric element 100 (top face 100B), while the cut-away section 1112 is so arranged that the side cathode electrodes 20B, 20D are partially disposed on the principal surface of the electric element 100 (top face 100B).

The conductive plate 1110 has length L5 along the direction DR1, which is the direction of a current flowing in the conductive plates 11, 12 of the electric element 100.

Additionally, the narrow part 1113 of the conductive plate 1110 has width W4 along the direction DR2 perpendicular to the direction DR1. The wide parts 1114, 1115 of the conductive plate 1110 have width W3 along the direction DR2.

The narrow part 1113 and wide parts 1114, 1115 are disposed so as to abut on the top face 100B of the electric element 100. The wide part 1114 is connected to the anode electrode 10A, while the wide part 1115 is connected to the anode electrode 10B.

The groove portion 1116 comprises a plurality of grooves 1120 and a plurality of grooves 1121. The plurality of grooves 1120 are formed along the direction DR1, while the plurality of grooves 1121 are formed along the direction DR2. Each of the plurality of grooves 1120, 1121 has several tens of μm in depth and width.

The electric circuit device 1100 is fabricated according to the processes (a) to (e) shown in FIGS. 6A to 6C and FIGS. 7A, 7B and the processes (a) to (e) shown in FIGS. 22A to 22C and FIGS. 23A, 23B.

The electric circuit device 1100 is connected between the power source 90 and the CPU 110 as well as the above-discussed electric circuit devices 200, 200A. In the electric circuit device 1100 which has same mechanism as the electric circuit device 300, the impedance Zs is reduced to prevent the temperature rise in the electric element 100. The leakage of the unwanted high-frequency current generated in CPU 110 from the electric circuit device 1100 toward the power source 90 is prevented. Additionally, the electric circuit device 1100 functions as a noise filter for confining the unwanted high-frequency current, which is produced by the CPU 110 operating at the high operating frequency, within the vicinity of the CPU 110.

The electric circuit device 1100 comprises the conductive plate 1110 which is abutted on the top face 100B of the electric element 100 and includes the grid of the groove portion 1116 on surface. Therefore, the electric circuit device 1100 makes heat radiation area larger than the conductive plate 310, thereby more increasing effect of heat radiation of the electric circuit device 1100 than that of the electric circuit device 300. As to the other structure, the electric circuit device 1100 has the same effect as the electric circuit device 300.

In the tenth embodiment, the adhesives 710, 720, 730, 740 can be arranged between the conductive plate 1110 and the side cathode electrodes 20A to 20D.

In the tenth embodiment, the conductive plate 1110 constitutes "a flat plate member". The cut-away section 1111 constitutes "a first cut-away section", while the cut-away section 1112 constitutes "a second cut-away section".

The Eleventh Embodiment

Figure 41:
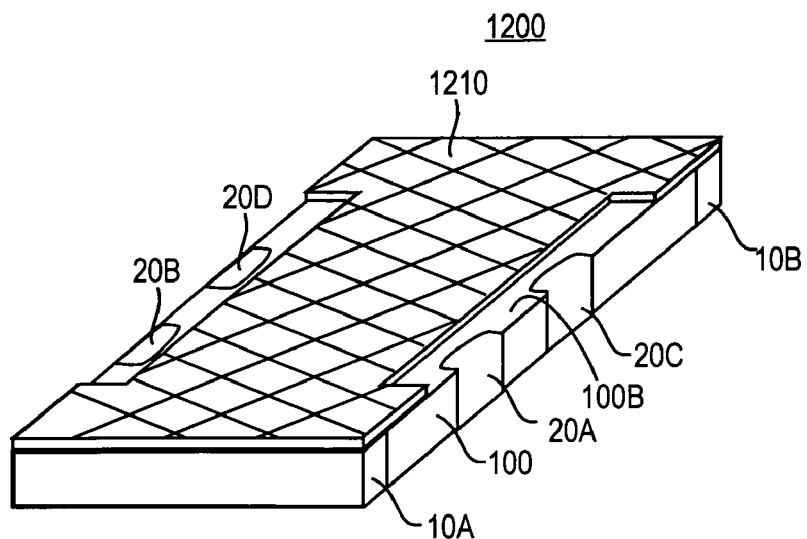
FIG. 41 is a perspective view of the electric circuit device according to the eleventh embodiment.

FIG. 41 is a perspective view of the electric circuit device according to the eleventh embodiment. Referring to FIG. 41, the electric circuit device 1200 of the eleventh embodiment includes a conductive plate 1210 instead of the conductive plate 310 of the electric circuit device 300 shown in FIG. 19 and the same components as those of the electric circuit device 300. The conductive plate 1210 is composed of cooper foil and is placed so as to abut on the top face 100B of the electric element 100.

Figure 42:
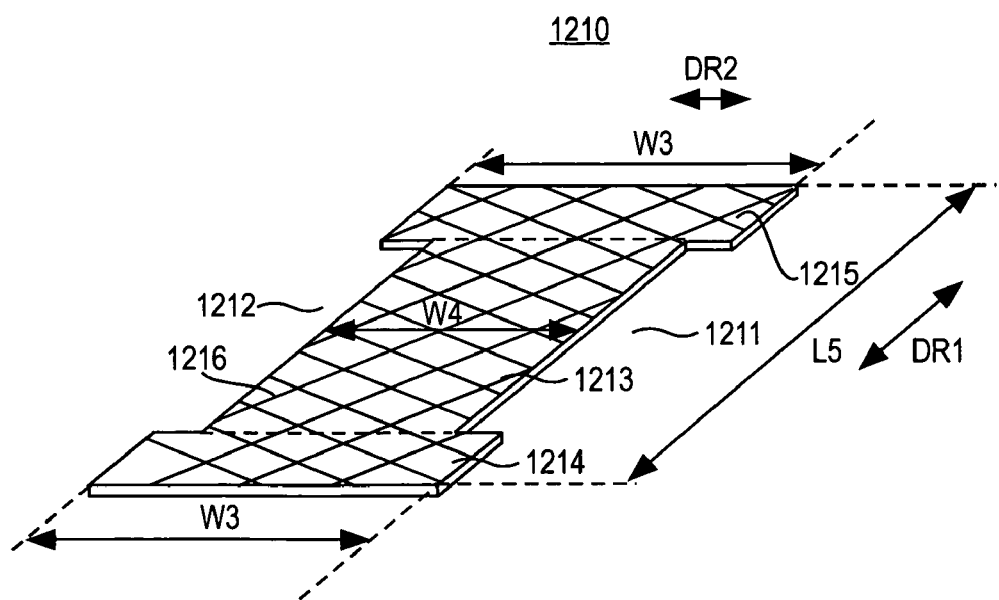
FIG. 42 is a perspective view of the conductive plate shown in FIG. 41.

FIG. 42 is a perspective view of the conductive plate 1210 shown in FIG. 41. Referring to FIG. 42, the conductive plate 1210 has cut-away sections 1211, 1212. As a result, the conductive plate 1210 comprises a narrow part 1213, wide parts 1214, 1215, and a groove portion 1216. The narrow part 1213 is disposed between the wide part 1214 and the wide part 1215. The groove portion 1216 is arranged on the narrow part 1213 and the wide parts 1214, 1215 so as to form a predetermined angle with directions DR1, SR2.

The cut-away section 1211 is so arranged that the side cathode electrodes 20A, 20C are partially disposed on the principal surface of the electric element 100 (top face 100B), while the cut-away section 1212 is so arranged that the side cathode electrodes 20B, 20D are partially disposed on the principal surface of the electric element 100 (top face 100B).

The conductive plate 1210 has length L5 along the direction DR1, which is the direction of a current flowing in the conductive plates 11, 12 of the electric element 100.

Additionally, the narrow part 1213 of the conductive plate 1210 has width W4 along the direction DR2 perpendicular to the direction DR1. The wide parts 1214, 1215 of the conductive plate 1210 have width W3 along the direction DR2.

The narrow part 1213 and the wide parts 1214, 1215 are disposed so as to abut on the top face 100B of the electric element 100. The wide part 1214 is connected to the anode electrode 10A, while the wide part 1215 is connected to the anode electrode 10B.

The groove portion 1216 comprises a plurality of grooves which possess same structure as the plurality of grooves 1120, 1121 shown in FIG. 40.

The electric circuit device 1200 is fabricated according to the processes (a) to (e) shown in FIGS. 6A to 6C and FIGS. 7A, 7B and the processes (a) to (e) shown in FIGS. 22A to 22C and FIGS. 23A, 23B.

The electric circuit device 1200 is connected between the power source 90 and the CPU 110 as well as the above-discussed electric circuit devices 200, 200A. In the electric circuit device 1200 which has same mechanism as the electric circuit device 300, the impedance Zs is reduced to prevent the temperature rise in the electric element 100. The leakage of the unwanted high-frequency current generated in CPU 110 from the electric circuit device 1200 toward the power source 90 is prevented. Additionally, the electric circuit device 1200 functions as a noise filter for confining the unwanted high-frequency current, which is produced by the CPU 110 operating at the high operating frequency, within the vicinity of the CPU 110.

The electric circuit device 1200 comprises the conductive plate 1210 which is abutted on the top face 100B of the electric element 100 and includes the groove 1216 on surface. Therefore, the electric circuit device 1200 makes heat radiation area larger than the conductive plate 310, thereby more increasing effect of heat radiation of the electric circuit device 1200 than that of the electric circuit device 300. As to the other structure, the electric circuit device 1200 has the same effect as the electric circuit device 300.

In the eleventh embodiment, the adhesives 710, 720, 730, 740 can be arranged between the conductive plate 1210 and the side cathode electrodes 20A to 20D.

In the eleventh embodiment, the conductive plate 1210 constitutes "a flat plate member". The cut-away section 1211 constitutes "a first cut-away section", while the cut-away section 1212 constitutes "a second cut-away section".

The Twelfth Embodiment

Figure 43:
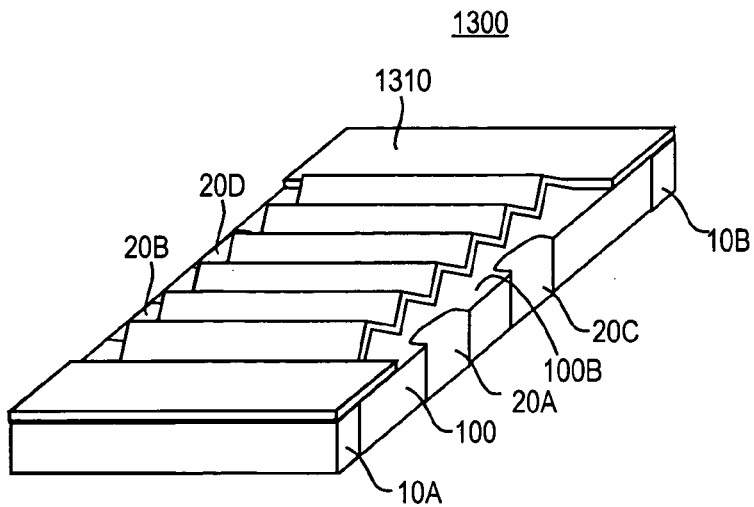
FIG. 43 is a perspective view of the electric circuit device according to the twelfth embodiment.

FIG. 43 is a perspective view of the electric circuit device according to the twelfth embodiment. Referring to FIG. 43, the electric circuit device 1300 of the twelfth embodiment includes a conductive plate 1310 instead of the conductive plate 310 of the electric circuit device 300 shown in FIG. 19 and the same components as those of the electric circuit device 300. The conductive plate 1310 is composed of cooper foil and is placed so as to abut on the top face 100B of the electric element 100.

Figure 44:
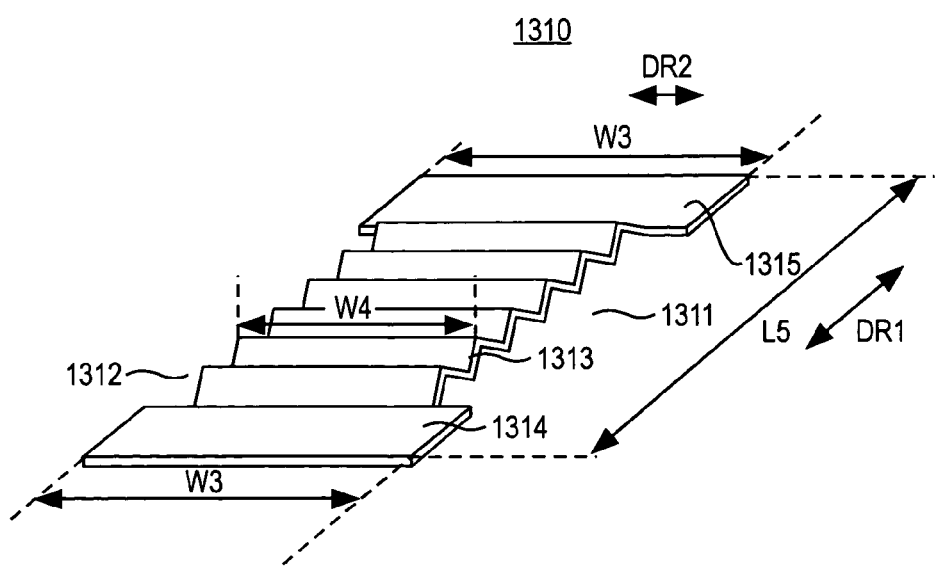
FIG. 44 is a perspective view of the conductive plate shown in FIG. 43.

FIG. 44 is a perspective view of the conductive plate 1310 shown in FIG. 43. Referring to FIG. 44, the conductive plate 1310 has cut-away sections 1311, 1312. As a result, the conductive plate 1310 comprises a concavo-convex portion 1313 and flat plate parts 1314, 1315. The concavo-convex portion 1313 is disposed between the flat plate part 1314 and the flat plate part 1315.

The cut-away section 1311 is so arranged that the side cathode electrodes 20A, 20C are partially disposed on the principal surface of the electric element 100 (top face 100B), while the cut-away section 1312 is so arranged that the side cathode electrodes 20B, 20D are partially disposed on the principal surface of the electric element 100 (top face 100B).

The conductive plate 1310 has length L5 along the direction DR1, which is the direction of a current flowing in the conductive plates 11, 12 of the electric element 100.

Additionally, the concavo-convex portion 1313 of the conductive plate 1310 has width W4 along the direction DR2 perpendicular to the direction DR1. The flat plate parts 1314, 1315 of the conductive plate 1310 have width W3 along the direction DR2.

The concavo-convex portion 1313 and the flat plate parts 1314, 1315 are disposed so as to abut on the top face 100B of the electric element 100. The flat plate part 1314 is connected to the anode electrode 10A, while the flat plate part 1315 is connected to the anode electrode 10B.

The electric circuit device 1300 is fabricated according to the processes (a) to (e) shown in FIGS. 6A to 6C and FIGS. 7A, 7B and the processes (a) to (e) shown in FIGS. 22A to 22C and FIGS. 23A, 23B.

The electric circuit device 1300 is connected between the power source 90 and the CPU 110 as well as the above-discussed electric circuit devices 200, 200A. In the electric circuit device 1300 which has same mechanism as the electric circuit device 300, the impedance Zs is reduced to prevent the temperature rise in the electric element 100. The leakage of the unwanted high-frequency current generated in CPU 110 from the electric circuit device 1300 toward the power source 90 is prevented. Additionally, the electric circuit device 1300 functions as a noise filter for confining the unwanted high-frequency current, which is produced by the CPU 110 operating at the high operating frequency, within the vicinity of the CPU 110.

The electric circuit device 1300 comprises the conductive plate 1310 which is abutted on the top face 100B of the electric element 100 and includes the concavo-convex portion 1313 on surface. Therefore, the electric circuit device 1300 makes the heat radiation area larger than the conductive plate 310, thereby more increasing effect of heat radiation of the electric circuit device 1300 than that of the electric circuit device 300. As to the other structure, the electric circuit device 1300 has the same effect as the electric circuit device 300.

In the twelfth embodiment, the adhesives 710, 720, 730, 740 can be arranged between the conductive plate 1310 and the side cathode electrodes 20A to 20D.

In the twelfth embodiment, the conductive plate 1310 constitutes "a flat plate member". The cut-away section 1311 constitutes "a first cut-away section", while the cut-away section 1312 constitutes "a second cut-away section".

Figure 45:
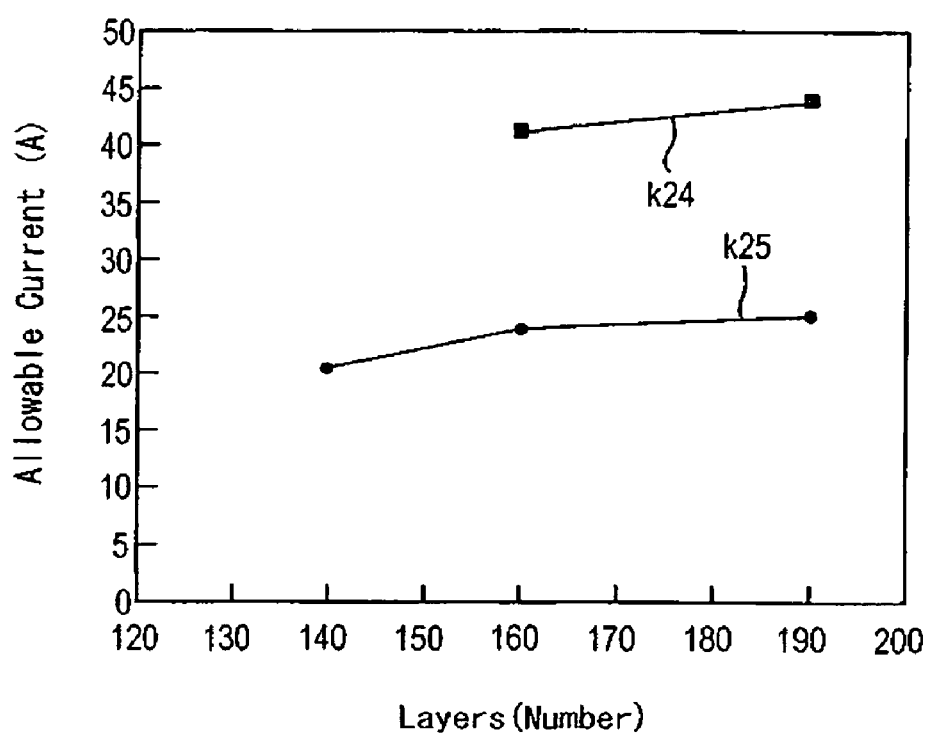
FIG. 45 is a view illustrating the relationship of the number of capacitor layers and allowable current included in the electric element with conductive plate connected to two anode electrodes.

FIG. 45 is a view illustrating the relationship of allowable current and the number of capacitor layers included in the electric element 100, in case the conductive plates 310, 410, 510, 610 are connected to the two anode electrodes 10A, 10B.

In FIG. 45, the vertical axis indicates allowable current, while the horizontal axis indicates the number of layers. The straight line k24 illustrates the relationship that the conductive plates 220, 310, 410, 510, 610 are arranged, while the curved line k25 illustrates the relationship that the conductive plates 220, 310, 410, 510, 610 are not arranged.

Referring to FIG. 45, the conductive plates 220, 310, 410, 510, 610 arranged at each number of capacitor layers can increase allowable current of the electric circuit devices 300, 400, 500, 600, 700 to approximately two times.

This is because the arrangement of the conductive plates 220, 310, 410, 510, 610 allows the DC current I to mainly flow in the conductive plates 310, 410, 510, 610 and the return current Ir to mainly flow in the conductive plate 220.

Thus, even though the conductive plates 310, 410, 510, 610 are arranged between the two anode electrodes 10A and 10B, the DC current flowing in the electric circuit devices 300, 400, 500, 600, 700 can be substantially increased.

The conductive plate 310 of the above-discussed electric circuit device 300 (see FIG. 19) has length L3 which is longer than length of the electric element 100 and thickness D2 of 0.1 mm to 0.2 mm. The conductive plate 510 of the electric circuit device 500 (see FIG. 27) has length L4 which is shorter than length of the electric element 100 along the direction DR1 and thickness D3 of 0.3 mm to 0.4 mm.

In the present invention, in case the conductive plate is planately placed on the top face 100B of the electric element 100, the length of the conductive plate along the direction DR1 may be determined by the thickness of the conductive plate. In case the thickness is in a range between 0.1 mm to 0.2 mm, the length of the conductive plate along the direction DR1 is longer than that of the electric element 100 along the direction DR1, while in case the thickness is thicker than 0.2 mm (preferably in case of 0.3 mm to 0.4 mm), the length of the conductive plate along the direction DR1 is shorter than that of the electric element 100 along the direction DR1.

Thus, the determination of length of conductive plate by thickness can place conductive plate so as to abut on the dielectric layer 5 of the electric element 100, even though thickness is changed.

It should be understood that the embodiments disclosed herein are to be taken as examples and are not limited. The scope of the present invention is defined not by the above described embodiments but by the following claims. All changes that fall within meets and bounds of the claims, or equivalence of such meets and bounds are intended to be embraced by the claims.

What is claimed is:

1. An electric circuit device comprising:
   an electric element; and
   a first conductive plate connected to the electric element, wherein the electric element includes:
      a second conductive plate including a plurality of flat plate members disposed in parallel to each other;
      a third conductive plate including a plurality of flat plate members respectively facing each of the flat plate members of the second conductive plate;
      a first dielectric disposed between each of the flat plate members of the second conductive plate and each of the flat plate members of the third conductive plate;
      a first electrode connected to one end side of the second conductive plate in a first direction which is in parallel to each of the flat plate members of the second conductive plate;
      a second electrode connected to the other end side of the second conductive plate in the first direction;
      a third electrode connected to the third conductive plate; and
      a fourth electrode connected to the third conductive plate;
   the first conductive plate is connected between the first and second electrodes in parallel to the second conductive plate; and
   a resistance of the first conductive plate between the portion connected to the first electrode and the portion connected to the second electrode is lower than that of each of the flat plate members of the second conductive plate between the portion connected to the first electrode and the portion connected to the second electrode.

2. The electric circuit device according to claim 1, wherein the electric element has a bottom surface, an upper surface facing the bottom surface, a first side surface perpendicular to the bottom surface, and a second side surface facing the first side surface;
   each of the flat plate members of the second conductive plate is disposed in parallel to the bottom surface;
   the first electrode has a part disposed along the first side surface;
   the second electrode has a part disposed along the second side surface; and
   the first conductive plate has a part disposed along the upper surface.

3. The electric circuit device according to claim 2, wherein the electric element further has a third side surface, which is perpendicular to the bottom surface and the first side surface, and a fourth side surface facing the third side surface;
   each of the flat plate members of the third conductive plate is disposed in parallel to the bottom surface; and
   the third electrode has a part disposed along the third side surface and the fourth side surface.

4. The electric circuit device according to claim 1, wherein
the third electrode is connected to one end side of the third conductive plate in the first direction; and
the fourth electrode is connected to the other end side of the third conductive plate in the first direction.

5. The electric circuit device according to claim 4, wherein
the electric element has a bottom surface, an upper surface facing the bottom surface, a first side surface perpendicular to the bottom surface, and
a second side surface facing the first side surface;
each of the flat plate members of the second conductive plate is disposed in parallel to the bottom surface;
the first electrode has a part disposed along the first side surface;
the second electrode has a part disposed along the second side surface; and
the first conductive plate has a part disposed along the upper surface.

6. The electric circuit device according to claim 5, wherein
the electric element further has a third side surface, which is perpendicular to the bottom surface and the first side surface, and a fourth side surface facing the third side surface;
each of the flat plate members of the third conductive plate is disposed in parallel to the bottom surface;
the third electrode has a part disposed along the third side surface, the bottom surface and the fourth side surface; and
the fourth electrode has a part disposed along the third side surface, the bottom surface and the fourth side surface.

7. The electric circuit device according to claim 2, wherein
the first conductive plate has a part, which is disposed along the first side surface, and another part, which is disposed along the second side surface;
the part, which is disposed along the first side surface, of the first conductive plate is connected to the part, which is disposed along the first side surface, of the first electrode; and
the another part, which is disposed along the second side surface, of the first conductive plate is connected to the part, which is disposed along the second side surface, of the second electrode.

8. The electric circuit device according to claim 2, wherein
the part, which is disposed along the first aide surface, of the first electrode has an upper end exposed on the upper surface;
the part, which is disposed along the second side surface, of the second electrode has an upper end exposed on the upper surface; and
the first conductive plate is connected to the upper end of the part, which is disposed along the first side surface, of the first electrode, and to the upper end of the part, which is disposed along the second side surface, of the second electrode.

9. The electric circuit device according to claim 2, further comprising:
a first solder member for connecting the first conductive plate to the first electrode; and
a second solder member for connecting the first conductive plate to the second electrode; wherein
the first conductive plate has first and second stick-out parts corresponding to parts which the part disposed along the upper surface sticks out outside from the upper surface of the electric element, in the first direction;
the first solder member is disposed in contact with the first stick-out part and the part, which is disposed along the first side surface, of the first electrode; and
the second solder member is disposed in contact with the second stick-out part and the part, which is disposed along the second side surface, of the second electrode.

10. The electric circuit device according to claim 2, further comprising:
a heat radiation member is disposed, in contact with the electric element and the first conductive plate, between the upper surface of the electric element and the first conductive plate.

11. The electric circuit device according to claim 3, wherein
the parts, which are respectively disposed along the third side surface and the fourth side surface, of the third and fourth electrodes have an upper end exposed on the upper surface; and
the part, which is disposed along the upper surface, of the first conductive plate has a cut-away section for preventing contact with the parts, which are exposed on the upper surface, of the third and fourth electrodes.

12. The electric circuit device according to claim 8, wherein
the electric element further includes a second dielectric exposed on the upper surface; and
the part, which is disposed along the upper surface, of the first conductive plate includes:
a first part making contact with the part, which is exposed on the upper surface, of the first electrode via a solder layer;
a second part making contact with the part, which is exposed on the upper surface, of the second electrode via a solder layer; and
a third part including steps between the third part and the first and second parts, respectively, and making contact with the second dielectric.

13. An electric circuit device comprising:
an electric element; and
a first conductive plate connected to the electric element;
wherein the electric element includes:
a second conductive plate flowing a first current from a power source side to an electrical load side; and
a third conductive plate flowing a second current, which is a return current of the first current, from the electrical load side to the power source side;
when the first and second currents respectively flow across the second conductive plate and the third conductive plate, the second conductive plate has a lower inductance than its self-inductance;
the first conductive plate is connected in parallel to the second conductive plate; and
the resistance of the first conductive plate at the part where it is connected in parallel to the second conductive plate is lower than the resistance of the second conductive plate at the part where it is connected in parallel to the first conductive plate.

14. The electric circuit device according to claim 13, wherein
the second conductive plate includes n (n is a positive integer) flat plate members each flowing the first current from the power source side to the electrical load side;
the n flat plate members of the second conductive plate are disposed in parallel to each other;
the third conductive plate includes m (m is a positive integer) flat plate members, which are alternately laminated with the n flat plate members of the second conductive plate and respectively flow the second current from the electrical load side to the power source side;

the electric element further includes:
- a first electrode connected to one end side of the n flat plate members of the second conductive plate in a direction in which the first current flows; and
- a second electrode connected to the other end side of the n flat plate members of the second conductive plate in the direction in which the first current flows;

the first conductive plate has a part disposed in parallel to the n flat plate members of the second conductive plate; and the first conductive plate is connected to the second conductive plate via the first and second electrodes.

15. The electric circuit device according to claim 14, wherein
the electric element further includes:
- a third electrode connected to one end side of the m flat plate members of the third conductive plate in a direction in which the second current flows; and
- a fourth electrode connected to the other end side of the m flat plate members of the third conductive plate in the direction in which the second current flows.

16. The electric circuit device according to claim 14, wherein
the electric element has a bottom surface, an upper surface facing the bottom surface, a first side surface perpendicular to the bottom surface, and a second side surface facing the first side surface;

the n flat plate members of the second conductive plate are disposed in parallel to the bottom surface;

the first electrode has a part disposed along the first side surface;

the second electrode has a part disposed along the second side surface; and the first conductive plate has a part disposed along the upper surface.

17. The electric circuit device according to claim 16, wherein
the electric element further has a third side surface, which is perpendicular to the bottom surface and the first side surface, and a fourth side surface facing the third side surface;

the m flat plate members of the third conductive plate are disposed in parallel to the bottom surface, the third electrode has a part disposed along the third side surface, the bottom surface and the fourth side surface; and the fourth electrode has a part disposed along the third side surface, the bottom surface and the fourth side surface.

18. The electric circuit device according to claim 16, wherein
the first conductive plate has a part, which is disposed along the first side surface, and another part, which is disposed along the second side surface;

the part, which is disposed along the first side surface, of the first conductive plate is connected to the part, which is disposed along the first side surface, of the first electrode; and the another part, which is disposed along the second side surface, of the first conductive plate is connected to the part, which is disposed along the second side surface, of the second electrode.

19. The electric circuit device according to claim 16, wherein
the part, which is disposed along the first side surface, of the first electrode has an upper end exposed on the upper surface;

the part, which is disposed along the second side surface, of the second electrode has an upper end exposed on the upper surface; and the first conductive plate is connected to the upper end of the part, which is disposed along the first side surface, of the first electrode and to the upper end of the part, which is disposed along the second side surface, of the second electrode.

20. The electric circuit device according to claim 17, wherein
the parts, which are respectively disposed along the third side surface and the fourth side surface, of the third and fourth electrodes have an upper end exposed on the upper surface; and the part, which is disposed along the upper surface, of the first conductive plate has a cut-away section for preventing contact with the parts, which are exposed on the upper surface, of the third and fourth electrodes.

* * * * *